United States Patent [19]

Satoh et al.

[11] Patent Number: 5,713,011
[45] Date of Patent: Jan. 27, 1998

[54] SYNCHRONIZED DATA PROCESSING SYSTEM AND IMAGE PROCESSING SYSTEM

[75] Inventors: Jun Satoh, Musashino; Kazushige Yamagishi, Higashimurayama; Keisuke Nakashima, Hitachi; Koyo Katsura, Hitachioota; Takashi Miyamoto, Tokyo; Mitsuru Watabe, Uridura-machi; Kenichiroh Ohmura, Kodaira, all of Japan

[73] Assignee: Hitachi, Ltd., Tokyo, Japan

[21] Appl. No.: 317,130

[22] Filed: Oct. 3, 1994

[30] Foreign Application Priority Data

Oct. 15, 1993 [JP] Japan ................. 5-258040
Oct. 15, 1993 [JP] Japan ................. 5-281865
Aug. 10, 1994 [JP] Japan ................. 6-209176

[51] Int. Cl.$^6$ .................................. G06F 1/06
[52] U.S. Cl. .................................. 395/556
[58] Field of Search .................. 395/550, 551, 395/556, 431, 432, 494, 845

[56] References Cited

U.S. PATENT DOCUMENTS

| | | | |
|---|---|---|---|
| 4,164,787 | 8/1979 | Aranguren | 364/DIG. 1 |
| 4,366,539 | 12/1982 | Johnson et al. | |
| 4,495,569 | 1/1985 | Kagawa | 364/DIG. 1 |
| 4,523,274 | 6/1985 | Fukunaga et al. | 364/DIG. 1 |
| 4,594,657 | 6/1986 | Byrns | 364/DIG. 1 |
| 4,847,809 | 7/1989 | Toshiba | 365/189.04 |
| 5,077,686 | 12/1991 | Rubinstein | 395/550 |
| 5,155,812 | 10/1992 | Ehlig et al. | 364/DIG. 1 |
| 5,157,775 | 10/1992 | Sanger | 364/DIG. 1 |
| 5,191,649 | 3/1993 | Cadambi et al. | 364/DIG. 1 |
| 5,388,249 | 2/1995 | Hotta et al. | 395/550 |

FOREIGN PATENT DOCUMENTS

| | | |
|---|---|---|
| 0 030 007 | 11/1980 | European Pat. Off. |
| 0 179 218 | 8/1985 | European Pat. Off. |
| 0 348 113 A3 | 6/1989 | European Pat. Off. |
| 0 440 452 A3 | 1/1991 | European Pat. Off. |
| 0 487 254 A3 | 11/1991 | European Pat. Off. |
| 0 561 370 A3 | 3/1993 | European Pat. Off. |
| 61-261969 | 11/1986 | Japan. |
| 3081881 | 4/1991 | Japan. |
| WO 93/01552 | 1/1993 | WIPO. |
| WO 94/24628 | 10/1994 | WIPO. |

OTHER PUBLICATIONS

Sato, Toshihiko, et al. "Main Memory and Graphic Examples of High–Speed DRAM Applications,"(Applications to Main Memory or Graphics of High–Speed DRAM), 1993, pp. 24–28 (English translation provided).

"Asynchronous Multi–clock Bidirectional Buffer Controller", IBM Technical Disclosure Bulletin, vol. 24, No. 8, Jan. 1982, Brent, et al.

Primary Examiner—Thomas M. Heckler
Attorney, Agent, or Firm—Fay Sharpe Beall Fagan Minnich & McKee

[57] ABSTRACT

A data processor comprising: a bus control circuit adapted to be interfaced with a synchronous DRAM which can be accessed in synchronism with a clock signal; a plurality of data processing modules coupled to said bus control circuit for producing data and addresses for accessing a memory; and a clock driver for feeding intrinsic operation clocks to said data processing modules and for feeding the clock signal for accessing said memory in synchronism with the operations of said data processing modules to be operated by the operation clock signals, to the outside.

10 Claims, 46 Drawing Sheets

FIG. 28(a)
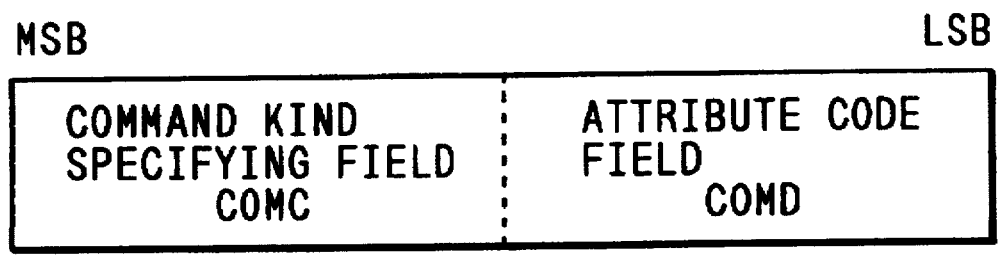
FIG. 28(b)
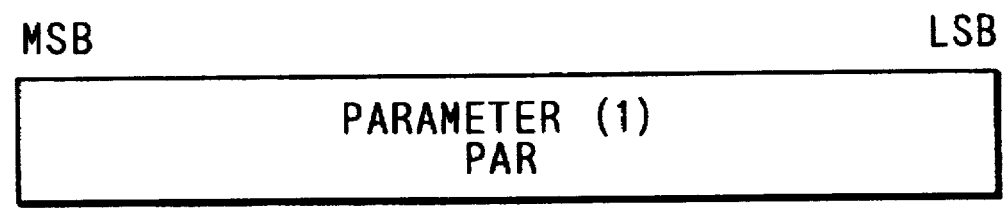

FIG. 44(a)

| L1R | L2R | LER | (PRE) | (ACT) | LOW | LEW | LKW |

FIG. 44(b)

| L0 : PRESENT LINE |
| L1 : PRECEDING LINE |
| L2 : TWO-LINE PRECEDING LINE |
| LE : ERROR DIFFUSION LINE |
| LK : BINARY RESULT LINE |
| PAGE BUFFER AREA |

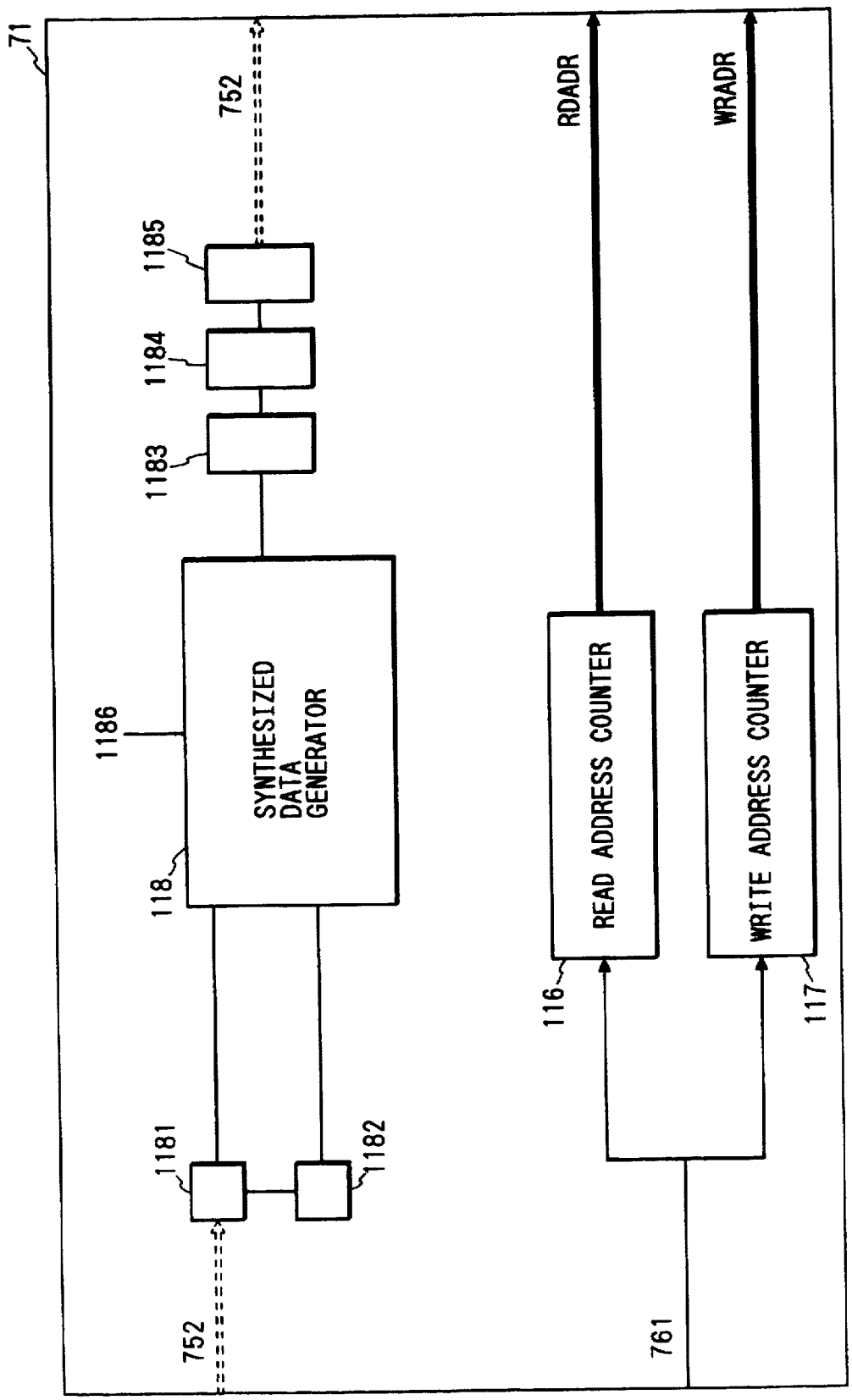

1

SYNCHRONIZED DATA PROCESSING SYSTEM AND IMAGE PROCESSING SYSTEM

BACKGROUND OF THE INVENTION

The present invention relates to a data processing system and an image processing system in the field of an information terminal such as a personal computer or a workstation for processing the image data allocated on a memory and, more particularly, to a technique which is effective when applied to a high-speed image processing system for accessing a memory at a high speed in synchronism with a clock.

In the image processing system, a drawing display processor executes a drawing processing upon a frame buffer in accordance with drawing commands or parameters transferred from a CPU. This drawing display processor may execute the drawing processing in accordance with the drawing commands or parameters which are arranged in advance in the frame buffer or a special purpose local memory. Moreover, the drawing display processor reads out the necessary display data from the frame buffer in accordance with the horizontal and vertical synchronizing timings and the dot rate of the monitor and displays them on the monitor through a dot shifter. The clock generator produces a fundamental clock and a dot clock on the basis of the reference frequency of a quartz oscillator and feeds them to the drawing display processor and the dot shifter. As the frame buffer of such image processing system, there can be adopted a DRAM (i.e., Dynamic Random Access Memory) or a multi-port DRAM which is given such a large storage capacity as is required for the bit map arrangement of the display data.

In the image processing system used in a facsimile, a printer or a graphic device of the prior art, on the other hand, there are used a high-speed SRAM (i.e., Static Random Access Memory) as a local processing referring to peripheral pixels, as disclosed in Japanese Patent Laid-Open No. 261969/1986, and a DRAM as a large-capacity memory for storing code data and font data.

SUMMARY OF THE INVENTION

In the trends of the field of the information terminal device of recent years such as a personal computer or workstation for business uses, the high quality, operation speed and capacity are advanced to increase the data bus width in case the frame buffer is constructed of a standard DRAM. In other constructions adopted, the drawing processing efficiency is improved by constructing the frame buffer of the multi-port DRAM. In accordance with this, there arises a problem that the cost for the system rises.

On the other hand, the synchronous DRAM has been noted as a large-capacity memory. This synchronous DRAM can input/output data, addresses and control signals in synchronism with clocks, as different from the DRAM of the prior art, so that it can realize a large-capacity memory equivalent to the DRAM at a speed as high as that of the SRAM. Thus, the synchronous DRAM can achieve a higher speed access and a larger capacity more than those of the DRAM of the prior art at a reasonable cost. This synchronous DRAM can designate how many data are to be accessed for one selected word line, in terms of a bust length, for example. In case the burst length is N, an N number of data can be sequentially read or written by switching the selected states of a column line by an internal column address counter. Incidentally, the application of the synchronous DRAM to a main memory or for graphics is disclosed, for example, in the electronic technology on pp. 24 to 28 (1993) of "Applications to Main Memory or Graphics of High-Speed DRAM".

We have examined an image processing system which is enabled to access a large-capacity a high-speed memory at a low cost by integrating a high-speed processing memory and a large-capacity memory. Specifically, we have examined the case in which a system is to be constructed by using the synchronous DRAM as a memory having a function to latch addresses, data and control signals in synchronism with clocks, and have come to the conclusions discussed below.

Firstly, in order to realize a high-speed access while holding the reliability of an accessing operation, the skews between the data, addresses and control signals outputted by the circuit modules and the clock signals are required to have a small value by the characteristics of the synchronous DRAM for inputting/outputting the data, addresses and control signals in synchronism with the clocks.

Secondly, when drawing a straight line in an arbitrary direction, the memory addresses are not continuous in the same row address so that the burst length is desired to have a value 1. In a rectangular smearing drawing for clearing the memory, on the other hand, the memory addresses are continuous in the same row address so that the burst length is desired to have a value N (N>1). Thus, the processing of changing the burst length in accordance with the drawing processing content is desired to be executed in the display control system.

Thirdly, there is further examined the case in which the synchronous DRAM is used to construct the system. Thanks to the use of the synchronous DRAM, a clock timing for outputting the read data, for example, can be designated after an address to be accessed has been issued, so that a next address can be issued before the read processing has been completed. In case the addresses are to be subsequently issued, they are limited to belong to the same row address. In order to access the different row addresses in the same bank, therefore, there is required a mishit processing such as a precharge processing.

An object of the present invention is to provide a technique for solving the several problems, which are caused when a clock-synchronized type memory having a high-speed operation and a large capacity such as the synchronous DRAM is to be applied to an image processing system, and for realizing an inexpensive, high-performance image processing system and a data processing system, and a data processor for the systems. More specifically, an object of the present invention is achieve such processing for changing the burst length according to a processing content which occurs when a system having an integrated memory is to be constructed by using the synchronous DRAM. Another object is to improve the bus throughput of the memory at a low cost in accordance with the burst length. A further object is to realize the mishit processing at a low cost and at a high speed. A further object is to provide a data processor optimized for controlling the access of a clock-synchronized type memory such as the synchronous DRAM having a high-speed operation and a large capacity.

The foregoing and other objects and novel features of the present invention will become apparent from the following description to be made with reference to the accompanying drawings.

Representatives of the invention to be disclosed herein will be briefly described in the following. Specifically, the present invention is coarsely divided into the feed of clock signals to a memory such as the synchronous DRAM, the setting of a mode register for designating the operation modes, and the processing of a mishit.

<Feed of Clocks>

A data processor comprises: bus control means (14) interfaced with a memory (22) such as a synchronous DRAM for inputting addresses, inputting/outputting data and inputting control signals in synchronism with a clock signal (CLK) fed from the outside; a plurality of data processing modules (12, 13) coupled to said bus control means for individually producing data and addresses to access said memory; and clock feed means for feeding said data processing modules with individually intrinsic operation clock signals and for feeding the clock signals for accessing said memory to the outside in synchronism with the operations of said data processing modules actuated by an intrinsic operation clock fed.

In order that the data processor may be easily applied to the case in which the plurality of data processing modules have different operation speeds, said clock feed means includes: a plurality of clock drivers (16c, 16s) disposed for the individual operation speeds of said plurality of data processing modules; and a clock selector (25) for selecting that of the outputs of said clock drivers, which corresponds to the data processing module acting as an access subject, to feed the selected output to the outside.

In order to avoid the competition of the clock signal in case said plurality of data processors share said memory, said data processor further comprises a clock buffer (160) adapted to output the clock signal from said clock feed means to the outside and made selectively controllable to a high output impedance stage.

In order to commonly connect a ROM (i.e., a Read Only Memory) stored with parameters for the data processing and to use it, said bus control means includes means for deciding it from an address outputted, when a second memory having a lower access speed than that of said memory coupled thereto is to be accessed, that the access is to said second memory, thereby to make the memory cycle of the access to said second memory longer than that to said memory.

Said bus control means includes means (143, 144 and 1495c) for outputting, as control signals, commands to determine the operation modes of said memory in response to an instruction of an access to said memory from said data processing modules.

Said bus control means, said data processing module and said clock feed means are formed over one semiconductor substrate. Moreover, said data processor further comprises: a memory adapted to receive an address input, data input/output and a control signal in synchronism with said clock signal and coupled to said bus control means; and clock generating means coupled to said clock feed means.

<Mode Register Setting>

A data processing system comprises : a rewritable memory adapted to receive an address input, data input/output and a control signal in synchronism with a clock signal and to update the address, which is preset in an internal address counter (207), at times in number corresponding to the set number of a mode register (30), to read/write the data sequentially; and a data processor (11) for generating data and addresses to access said memory and for utilizing said memory in at least a frame buffer to process image data, wherein said data processor includes means for issuing a command and a register set value to set said mode register in accordance with the condition at the data processing time.

Said data processing system further comprises an input terminal for receiving an external signal (135) to regulate the timing for issuing a command to set said mode register. Moreover, said data processor further includes instruction control means (51 to 57) for executing the instruction which is allocated to the issue of the command for setting said mode register. Still moreover, said data processor further includes: an address decoder (1481) for detecting an internal access to the address which is allocated to the issue of the command for setting said mode register; and a sequencer (143) for issuing said mode register setting command in accordance with the result of detection by said address decoder and for outputting the data to be subjected to said internal access, as the set value for a command register to the outside.

A data processing system for improving the throughput of a data processing accompanied by a memory access comprises : a memory (22); and a data processor (11) for accessing said memory to processing image data, wherein said memory includes a plurality of memory banks (200A, 200B) and is enabled to receive an address input, data input/output and a control signal in synchronism with a clock signal (CLK), wherein said memory has a burst mode, in which it is accessed while updating an address preset in an internal address counter (207), so that it can receive an address active command for setting the access address in another memory bank in parallel with the operation of a memory bank being operated in the burst mode, and wherein said data processor includes: data processing modules (12, 13) for producing data and addresses to access said memory and for processing the image data by using said memory in at least a frame buffer; and bus control means (14) for issuing said active address command in response to the instruction of an access from said data processing module for a memory bank different from the memory bank being accessed in the burst mode, to enable the access address to be set in advance.

<Mishit Processing>

A data processing system for preventing the disturbance of the pipeline which is realized by reading/writing a plurality of memories in parallel comprises: first and second memories (82a, 82b) for latching row addresses to enable the same row address as one once latched to be sequentially accessed by updating a column address, and for receiving an address input, data input/output and a control signal in synchronism with a clock signal; first and second memory buses (821a, 822a, 821b, 822b) allocated to said first and second memories, respectively; first and second bus control means (74a, 74b) allocated to said first and second memory buses, respectively; a data processing module (71) coupled to said first and second bus control means for producing data and addresses to access said first and second memories thereby to process the data read out from said first memory and for producing and outputting the access addresses to said first and second memories in parallel to store the result of the data processing in said second memory; delay means (731, 732) for transmitting the access address for said second memory, which is outputted from said data processing module, to said second memory with a delay time period corresponding to the time period for said data processing; first mishit detecting means (72b) for detecting whether or not the row address outputted from said data processing module toward said first memory is coincident to the preceding row address fed; second mishit detecting means (72a) for detecting whether or not the row address outputted from said data processing module toward said second memory is coincident to the preceding row address fed, such that its detection timing is made substantially concurrent with that by said first mishit detecting means; and means

(76) for interrupting the operation of said data processing module while the row address relating to said mishit is being updated, when either said first or second mishit detecting means detects the incoincidence.

A data processing system for improving the reliability of a processing at the time of a mishit accompanying a change in a memory access subject comprises: a memory (182a) for latching a row address to enable the same address as the once latched one to be sequentially accessed by updating a column address and for receiving an address input, data input/output and a control signal in synchronism with a clock signal; a plurality of data processing modules (71, 75) for producing data and addresses to access said memory; mishit detecting means (72a) for detecting whether or not the row address outputted from said data processing modules toward said memory is coincident to the preceding row address fed; detect means (725) for detecting a change in the data processing modules to access said memory; and bus control means (74a) for instructing said memory to update the row address for said access in response to either the detection of the incoincidence by said mishit detecting means or the detection of the change in the access subject by said detect means.

<Mishit Processing>

A data processing system for processing data in a pipeline manner while reading/writing a plurality of memories in parallel comprises: first and second memories (82a, 82b) for latching a row address to enable the same row address as the once latched one to be sequentially accessed by updating a column address, and for receiving an address input, data input/output and a control signal in synchronism with a clock signal; memory buses (821a, 822a, 821b, 822b) allocated to said first and second memories, respectively; bus control means (74a, 74b) allocated to said memory buses, respectively; a data processing module (71) coupled to said individual bus control means for producing data and addresses to access said first first and second memories thereby to process the data read out from said first memory, and for producing the access addresses in parallel for said first and second memories to store the results of the data processing in said second memory; and delay means (731, 732) for transmitting the address address for said second memory, which is outputted from said data processing module, to said second memory with a delay time period corresponding to that for said data processing. In short, the first and second memories are caused to transfer the information in parallel through the individual memory buses, so that the access addresses for the two memories are outputted in parallel by the data processing module, and the timing for the two access addresses outputted in parallel to be inputted to the corresponding memories is uniquely determined by the delay means.

In order to prevent the disturbance of the pipeline data processing, the data processing system further comprises: mishit means for detecting at substantially the same timing whether or not the row addresses of the individual access addresses outputted in parallel from said data processing module to said first and second memories are coincident to the preceding row address fed; and means for interrupting the operation of said data processing module, while the row address of said mishit is being updated, when the incoincidence of said row address is detected by said mishit detecting means. More specifically, a data processing system for preventing the disturbance of the pipeline realized by reading/writing a plurality of memories in parallel comprises : first and second memories (82a, 82b) for latching row addresses to enable the same row address as one once latched to be sequentially accessed by updating a column address, and for receiving an address input, data input/output and a control signal in synchronism with a clock signal; first and second memory buses (821a, 822a, 821b, 822b) allocated to said first and second memories, respectively; first and second bus control means (74a, 74b) allocated to said first and second memory buses, respectively; a data processing module (71) coupled to said first and second bus control means for producing data and addresses to access said first and second memories thereby to process the data read out from said first memory and for producing and outputting the access addresses to said first and second memories in parallel to store the result of the data processing in said second memory; delay means (731, 732) for transmitting the access address for said second memory, which is outputted from said data processing module, to said second memory with a delay time period corresponding to the time period for said data processing first mishit detecting means (72b) for detecting whether or not the row address outputted from said data processing module toward said first memory is coincident to the preceding row address fed; second mishit detecting means (72a) for detecting whether or not the row address outputted from said data processing module toward said second memory is coincident to the preceding row address fed, such that its detection timing is made substantially concurrent with that by said first mishit detecting means; and means (76) for interrupting the operation of said data processing module while the row address relating to said mishit is being updated, when either said first or second mishit detecting means detects the incoincidence.

According to the above-specified means, the aforementioned memory such as a synchronous DRAM has to input/output data, addresses and control signals in synchronism with a clock and accordingly has to be fed with the same clock, multiplied clock or divided clock as that of a data processor to access the synchronous DRAM. In case, however, the output of a clock generator is fed in parallel to the data processor and the synchronous DRAM, the margin of the data and addresses for the clock and the setup and hold time of the control signals cannot be afforded due to the skew of the clock and the internal delay of the processor. In order to solve this problem, a synchronizing clock signal is fed from the data processor to the synchronous DRAM. As a result, the clock to be fed to the synchronous DRAM can match the delay of the data, addresses and control signals to allow a design with a margin.

In case the data processing module operating at different frequencies is present in the aforementioned data processor, there is adopted a construction in which the clock of the data processing module acting as a bus master is selected in the data processor and fed to the synchronous DRAM. As a result, the clock to be fed to the synchronous DRAM and the delay in the data, addresses and control signals can be adjusted to each other at the unit of the data processing module acting as the bus master thereby to allow a design with a margin.

In a method for opening the synchronous DRAM to the external system, the data, addresses and control signals to the synchronous DRAM of the data processor and the clock terminals are controlled to a high impedance. As a result, the design can be made with a margin in case the external system makes a direct access to the synchronous DRAM.

The mode register included in the synchronous DRAM is a register for designating the operation mode of the synchronous DRAM. An optimum setting of the mode register can be made by adopting the method of setting the mode register according to the internal architecture and the processing content of the processor. In the straight light drawing of an arbitrary direction, for example, the memory addresses are not continuous in the same row address so that the burst length to be set in the mode register is desired to have a value 1. In a rectangular smearing drawing for clearing the memory, on the other hand, the memory addresses are continuous in the same row address so that the burst length is desired to have a value N (N>1). Thus, the processing of changing the burst length in accordance with the drawing processing content is required. In the present invention, therefore, the mode register is dynamically changed according to the various processing contents. The bus throughput of the memory can be improved at a low cost in conformity to the burst length.

The condition for a high-speed transfer is restricted within the common row address, and it is necessary to issue a precharge command and a row address activation command in case the transfer extends to a different row address. In the present invention, therefore, the physical memory addresses and the logical coordinates are mapped such that the adjoining addresses in the same row address in the X direction, for example, never fail to be arranged at different bank addresses. In case the burst length is set to N (N>1), the precharge command and the active command can be generated, while the data are being accessed to the synchronous DRAM at present, for a bank different from that being accessed, so that the bus throughput can be improved. The drawing processing module, the display processing module or the bus control unit is equipped therein with means for arithmetically operating the address and means for deciding the switching of the row address. When the change in the row address is detected, the sequencer in the bus control unit issues the precharge command and the row address activation command and then a column address. Thus, the read/write operations are speeded up.

When the result of image processing with quick reference to the address range of the synchronous DRAM used as the line memory is to be written in the address range of the synchronous DRAM used as the page buffer, the pipeline in the image processing unit collapses to interrupt the processing if a mishit occurs independently in the read/write operations. If the mishit occurs in both the reading operation and the writing operation, the memory read/write in the pipeline are synchronized by handling the concurrent occurrence of mishits. Thus, there is adopted write address mishit detecting means for detecting the mishit at the write side at substantially the same timing as that of the mishit at the read side.

Since the mishit is thus forcibly caused at the time of changing the access subjects for the memory, the indefiniteness of the mishit decision at the time of reopening the operation of the data processing module which has its operation interrupted as the memory access subjects are changed can be eliminated to improve the reliability of the processing at the time of a mishit.

BRIEF DESCRIPTION OF THE DRAWINGS

FIGS. 28(A) and 28(B) are explanatory diagrams illustrating the formats of the special purpose instruction for issuing the mode register setting command;

FIG. 44 (a) and FIG. 44 (b) are diagram for explaining an operation of the case in which the synchronous DRAM is utilized in a time slot manner.;

FIG. 45 is a block diagram showing one example of the case in which the image processor is applied to a graphic processing.

DESCRIPTION OF THE PREFERRED EMBODIMENTS

<Synchronous DRAM>

Figure 2:
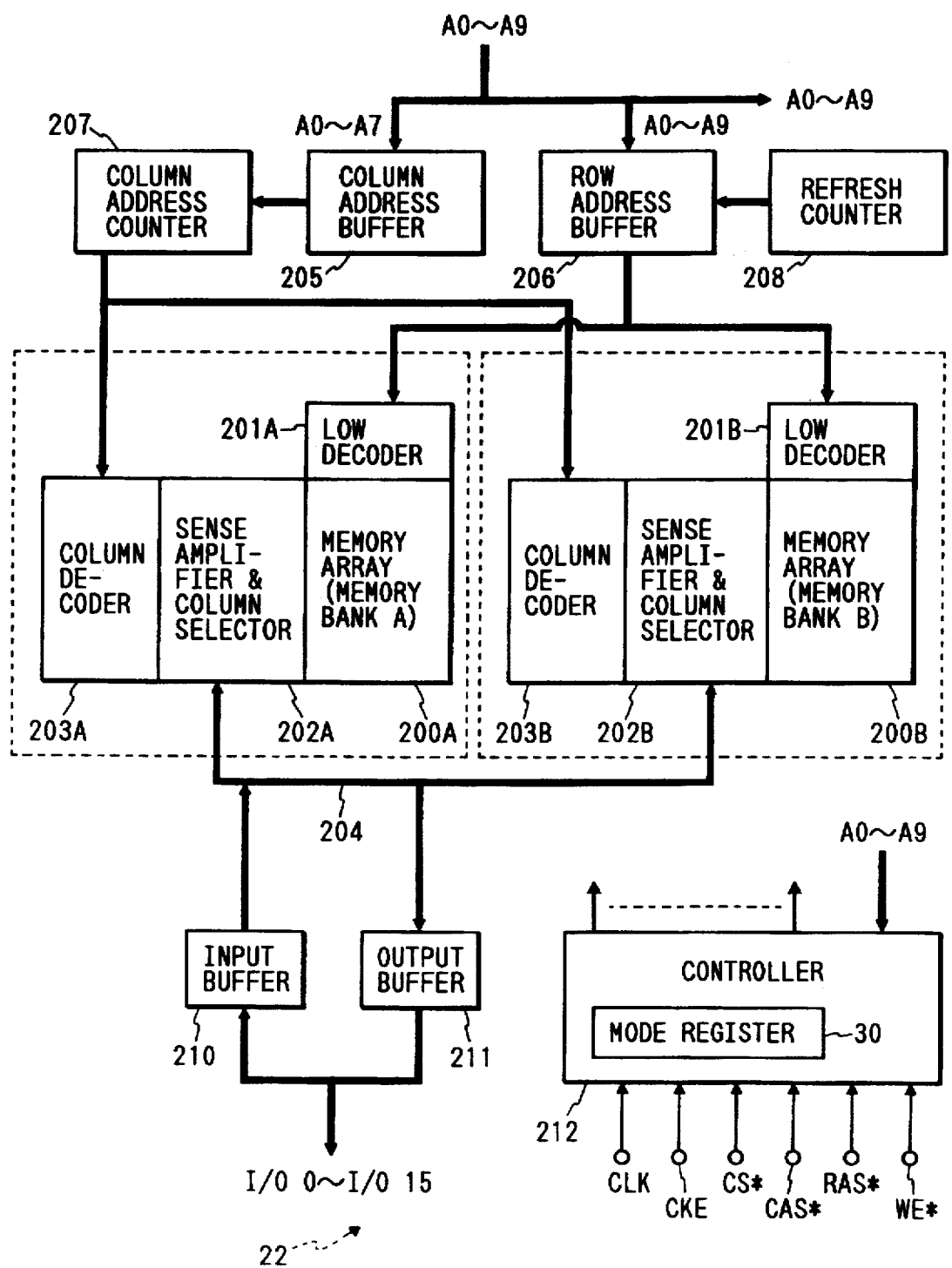
FIG. 2 is a block diagram showing one example of a synchronous DRAM.

FIG. 2 is a block diagram showing one example of the synchronous DRAM. The synchronous DRAM, as designated at 22 in FIG. 2, is formed over one semiconductor substrate of single crystalline silicon by the well-known semiconductor integrated circuit manufacturing technology, although not especially limitative thereto. This synchronous DRAM 22 is constructed to include: a memory array 200A constituting a memory bank A (BANK A); and a memory array 200B constituting a memory bank B (BANK B). Each of the memory arrays 200A and 200B is composed of dynamic memory cells arranged in a matrix shape. According to FIG. 2, the memory cells arranged in the same column have their select terminals coupled to the (not-shown) word line corresponding for each column, and the memory cells arranged in the same row line have their data input output terminals coupled to the (not-shown) complementary data line corresponding for each row.

One of the not-shown word lines of the aforementioned memory array 200A is driven to a select level by a row decoder 201A in accordance with the decoded result of a row address signal. The not-shown complementary data lines of the memory array 200A are coupled to a sense amplifier & column selector 202A. This sense amplifier & column selector 202A has its sense amplifier is an amplifying circuit for detecting and amplifying a micro potential difference which is caused to appear in each complementary data line by reading out the data from the memory cells. The remaining column switch circuit is a switch circuit for selecting and connecting the complementary data lines individually with a complementary common data line 204. The column switch circuit is selected according to the decoded result of a column address signal by a column decoder 203A. At the side of the memory array 200B, there are likewise provided a row decoder 201B, a sense amplifier & column selector 202B and a column decoder 208B. The aforementioned complementary common data line 204 is connected with the output terminal of an input buffer 210 and the input terminal of an output buffer 211. The input terminal of the input buffer 210 and the output terminal of the output buffer 211 are connected with data input/output terminals I/00 to I/015 of 16 bits. Incidentally, a predetermined bit of the row address signal is a signal for selecting either the memory bank 200A or 200B.

The row address signals and the column address signals to be fed from address input terminals A0 to A9 are fetched in an address multiplex format by a column address buffer 205 and a row address buffer 206. The address signals thus fed are held by the individual buffers. In the refreshing mode, the row address buffer 206 fetches the refresh address signal to be outputted from a refresh counter 208, as the row address signal. The output of the column address buffer 205 is fed as the preset data of a column address counter 207, which outputs either the column address signal as the aforementioned preset data or the value sequentially incremented from the column address signal, to the column decoders 203A and 203B in accordance with the operation mode which is designated by a later-described command.

A controller 212 is fed with both the external control signals including a clock signal CLK, a clock enable signal CKE, a chip select signal CS* (symbol "*" indicates that a signal bearing it is a low enable signal), a column address strobe signal CAS*, a row address strobe signal RAS* and a write enable signal WE*, although not especially limitative thereto, and the control data coming from the address input terminals A0 to A9, and generates internal timing signals for controlling the operation mode of the synchronous DRAM and the operations of the aforementioned circuit blocks on the basis of the levels and the changing timings of those signals. For these operations, the controller 212 is equipped with the (not-shown) control logic and a mode register 30.

The clock signal CLK is used as the master clock of the synchronous DRAM, whereas the remaining external input signals are made significant in response to the rise of the clock signal CLK. The chip select signal CS* instructs the initiation of the command input cycle with its low level. When the chip select signal CS* is at the high level (i.e., in the chip unselected state), the remaining inputs have no meaning. However, the internal operations such as the selected state of a later-described memory bank or the burst operation are not influenced by the change to the chip unselected state. The individual signals RAS*, CAS* and WE* are given functions different from those of the corresponding signals in the ordinary DRAM and are made significant when the later-described command cycle is to be defined.

The clock enable signal CKE is one for designating the validity of the next clock signal, and the next clock signal has its rising edge validated, if the signal CKE is at the high level, and invalidated if at the low level. Although not shown, moreover, the external control signal for controlling the output enable of the output buffer 211 in the read mode is also fed to the controller 80, and the output buffer 211 is brought into a high output impedance state when that signal is at the high level, for example.

The aforementioned row address signal is defined by the levels of the address input terminals A0 to A8 in the later-described row address strobe-bank active command cycle synchronized with the rising edge of the clock signal CLK.

The input from the address input terminal A9 is deemed as the memory bank select signal in the aforementioned row address strobe and bank active command cycle. Specifically, the memory bank 200A is selected, when the input of the terminal A9 is at the low level, and the memory bank 200B is selected when at the high level. The select control of the memory bank can be executed, although not especially limitative, by the processings such as the activation of only the row decoder at the select memory bank side, no selection of the column switch circuits at the unselect memory bank side, or the connection of only the select memory bank side with the input buffer 210 and the output buffer 211.

The input of the terminal A8 in the later-described precharge command cycle designates the mode of the precharge operation for the complementary data lines, and its high level instructs that what is precharged is both the memory banks 200A and 200B whereas its low level instructs what is precharged is one memory bank designated by the terminal A9.

The aforementioned column address signals are defined by the levels of the terminals A0 to A7 in the read or write command (i.e., the later-described column address - read command or column address-write command) cycle synchronized with the rising edge of the clock signal CLK. And the column address thus defined is used as the start address of the burst access.

Here will be described the major operation modes of the synchronous DRAM to be instructed by the commands.
(1) Mode Register Set Command (Mo)

This is a command for setting the aforementioned mode register 30. This command is designated by CS*, RAS*, CAS* and WE*=the low level, and the data (i.e., the register set data) to be set are fed through the terminals A0 to A9. The register set data is in the burst length, CAS latency and write mode, although not especially limitative thereto. The burst length to be set is 1, 2, 4, 8 and full (256) pages; the CAS latency to be set is 1, 2 and 3; and the write mode to be set is the burst write or the single write.

The aforementioned CAS latency is used to designate what cycles of the clock signal CLK are to be consumed from the fall of the signal CAS* to the outputting operation of the output buffer 211 in the read operation instructed by the later-described column address and read command. The CAS latency sets the internal operation time, which is necessary for reading the data till the read data is fixed, in accordance with the used frequency of the clock signal CLK. In other words, the CAS latency is set to a higher level, in case the clock signal CLK used has a high frequency, and to a lower level in case the clock signal CLK used has a low frequency.

(2) Row Address Strobe-Bank Active Command (Ac)

This is a command for validating the instruction of the row address strobe and the selection of the memory bank by the terminal A9. This command is designated by CS* and RAS*=the low level, and CAS* and WE*=the high level, and the addresses to be fed to the terminals A0 to A8 are fetched as the row address signal whereas the signal to be fed to the terminal A9 is fetched as the select signal of the memory bank. These fetching operations are executed in synchronism with the rising edge of the clock signal CLK, as described above. When said command is designated, for example, the word line in the memory bank designated is selected so that the memory cells connected with the selected word lines are conducted to the individually correspondingly complementary data lines.

(3) Column Address-Read Command (Re)

This is a command necessary for initiating the burst read operation and a command for instructing the column address strobe. This command is designated by CS* and CAS*=the low level, and RAS* and WE*=the high level, and the addresses to be fed to the terminals A0 to A7 are fetched as the column address signal. The column address signal thus fetched is fed as the burst start address to the column address counter 207. In the burst read operation thus instructed, the memory bank and its word lines are selected before-hand in the row address strobe-bank active command cycle, so that the memory cells of the selected word line are sequentially selected and continuously read out in accordance with the address signal which is outputted from the column address counter 207 in synchronism with the clock signal CLK. The number of data to be continuously read is designated by the aforementioned burst length. On the other hand, the data reading from the output buffer 211 is initiated by awaiting the cycle number of the clock signal CLK specified by the aforementioned CAS latency.

(4) Column Address-Write Command (Wr)

This is a command necessary for initiating the burst write operation, when this operation is set in the mode register 30 as a mode of the write operation, and a command necessary for initiating the single write operation when this operation is set in the mode register 30 as a mode of the write operation. Moreover, the command instructs the column address strobe in the single write and the burst write. The command is designated by CS*, CAS* and WE*=the low level, and RAS*=the high level, and the address to be fed to the terminals A0 to A7 is fetched as the column address signal. The column address signal thus fetched is fed as the burst start address in the burst write to the column address counter 207. The procedure of the burst writing operation thus instructed is executed like the burst read operation. However, the write operation has no CAS latency so that the fetch of the write data is initiated from the column address-write command cycle.

(5) Precharge Command (Pr)

This is a command for initiating the precharge operation for the memory bank selected by the terminals A8 and A9 and is designated by CS*, RAS* and WE*=the low level, and CAS*=the high level.

(6) Auto Refresh Command

This is a command necessary for initiating the auto refresh and is designated by CS*, RAS* and CAS*=the low level, and WE* and CKE=the high level.

(7) Burst Stop-In-Full Page Command

This is a command necessary for stopping the burst operations of full pages for all the memory banks and is ignored for the burst operation other than the full pages. This command is designated by CAS* and WE*=the low level, and RAS* and CAS*=the high level.

(8) No Operation Command (Nop)

This is a command for instructing no substantial operation and is designated by CS*=the low level, and RAS*, CAS* and WE*=the high level.

In the synchronous DRAM, when, while the burst operation is being executed in one memory bank, the other memory bank is designated to feed the row address strobe-bank active command, the operation in the row address line in said other memory bank is enabled while exerting no influence upon the operation in the one memory bank being executed. For example, the synchronous DRAM is equipped with means for latching therein the data, addresses and controls signals fed from the outside. This means latches the addresses and control signals for the individual memory banks, although not especially limitative thereto. Alternatively, the data of one word line in the memory block selected by the row address strobe-bank active command cycle are latched by the not-shown latch circuit so that they may be read out before the column operation. As a result, so lone as the data do not conflict in the data input/output terminals I/00 to I/015, the internal operation can be initiated in advance by issuing the precharge command and the row address strobe-bank active command to the memory bank difference from that to be processed by the command being executed, while the command unprocessed being executed.

As could be understood from the description thus far made, the synchronous DRAM can operate a memory as high as that of the DRAM at a speed as high as that of the SRAM because it can input/output the data, the addresses and the control signals in synchronism with the clock signal CLK. Moreover, the synchronous DRAM is enabled to continuously read or write a plurality of data by designating how many data are to be accessed for one selected word line, with the burst length to switch the select states of the column line sequentially by the internal column address counter 207.

<Drawing Display Processor>

Figure 1:
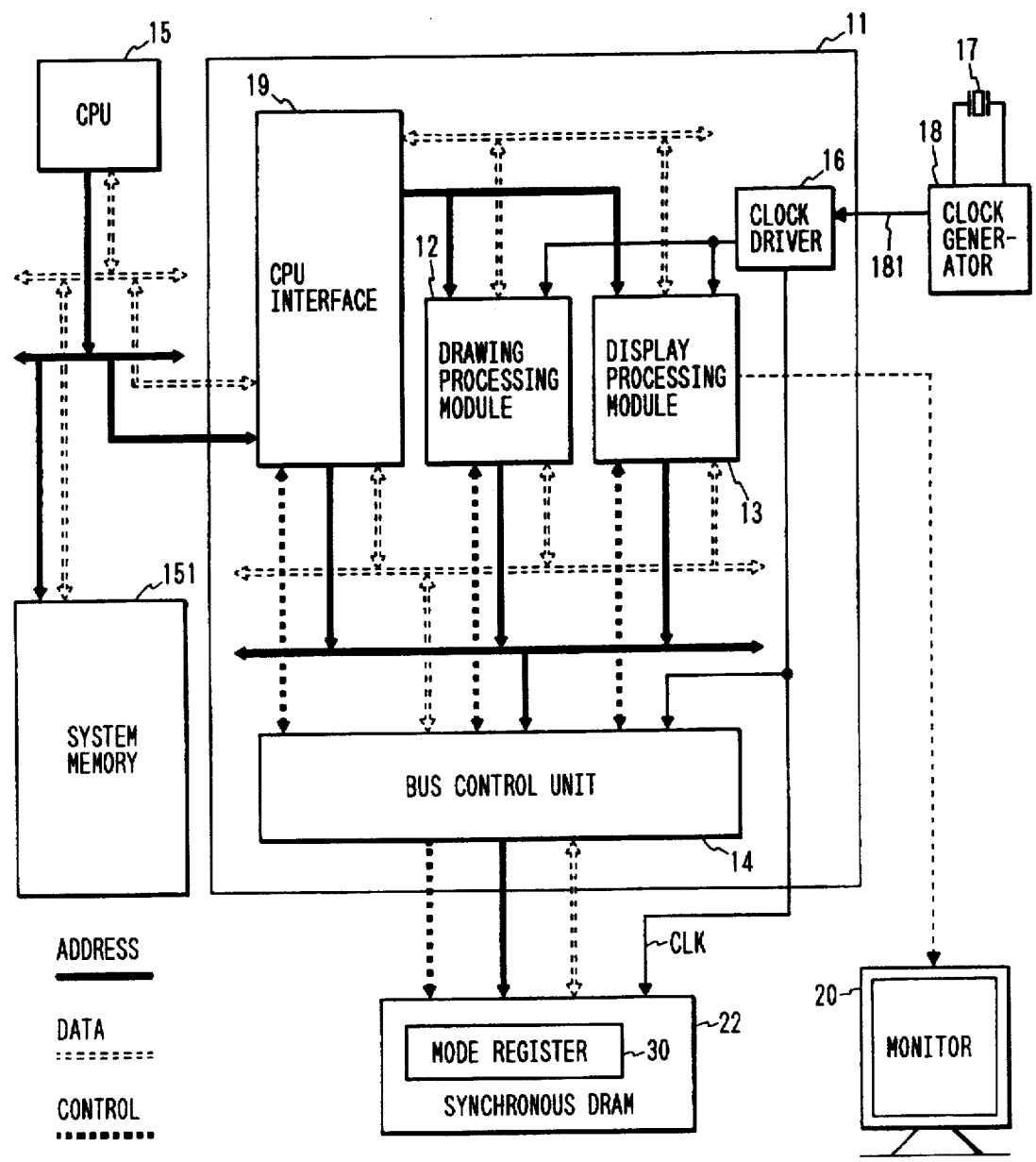
FIG. 1 is a block diagram showing an image processing system according to one embodiment of the present invention.

FIG. 1 is a block diagram showing a drawing display processor 11 according to one embodiment of the present invention and an image processing system to which is applied the drawing display processor 11. The image processing system, as shown, is constructed to include: a CPU (i.e., Central Processing Unit) 15 for governing the entire control; a system memory 151 to be utilized for a work region of the CPU 15 and for a temporary storage region of data; a drawing display processor (or data processor) 11; a clock generator 18; the aforementioned synchronous DRAM having its access controlled by the drawing display processor 11; and a monitor 20 having its display controlled by the drawing display processor 11.

In the system of FIG. 1, the synchronous DRAM (as will be shortly referred to as the "SDRAM") 22 is utilized as a region for storing commands and parameters for a drawing processing module 12 and a display processing module 13, although not especially limitative thereto. These commands and parameters are transferred in advance from the CPU 15. The synchronous DRAM 22 is also utilized as a temporary storage region or work region for the frame buffer or the drawing processing data.

The drawing processing module 12 in the aforementioned drawing display processor 11 reads the aforementioned commands and parameters from the synchronous DRAM 22 through a bus control unit 14 and executes the drawing processing in the synchronous DRAM 22 in accordance with the instructions of the commands. The display processing module 13 in the drawing display processor 11 updates its internal horizontal and vertical address counters in accordance with the horizontal and vertical synchronizing timings of the monitor 20, and reads the necessary display data from the synchronous DRAM 22 through the bus control unit 14 and outputs them in accordance with the display rate, i.e., the dot rate of the monitor 20. This monitor 20 displays the aforementioned display data outputted from the display processing module 13, in synchronism with the individual vertical and horizontal synchronizing signals.

A clock driver 16 receives a fundamental clock 181 from the clock generator 18 and feeds it to the drawing processing module 12, the display processing module 13 and the bus control unit 14 and the clock signal to the external synchronous DRAM 22. The clock signal to be fed from the clock driver 16 to the synchronous DRAM 22 is the clock signal CLK which has been described with reference to FIG. 2.

The drawing display processor 11 of the present embodiment is constructed in the point of the access control of the synchronous DRAM 22 while considering (1) the feed of clocks, (2) the setting of the mode register, (3) the pipeline of the data access, and (4) the counter-measure of the bus competition from a plurality of modules.

<Clock Feed to Synchronous DRAM>

The drawing display processor 11 has to input output the data, the addresses and the control signals at timings synchronous with the clock signal CLK to the synchronous DRAM 22 which is synchronized with the clock signal CLK, when this synchronous DRAM 22 is to be accessed. Thus, the same clock, multiplied clock or frequency-divided clock of that of the drawing display processor 11 for access-controlling the synchronous DRAM 22 has to be fed to the same synchronous DRAM. At this case, in case the clock signal 181 generated by the clock generator 18 using an oscillator such as a quartz oscillator 17 is fed in parallel to the drawing display processor 11 and the synchronous DRAM 22 on the packaging board, the necessary operation margin such as the setup or hold time of the data, addresses and control signals may not be warranted for the cycle of the clock signal if a clock skew is caused of the load upon the clock line or the deviation of the delay component or if the operational delay occurs in the processor 11. In order to solve this point, the construction is made such that the drawing display processor 11 or the access subject for the synchronous DRAM 22 feeds the synchronous DRAM 22 with the clock signal. As a result, the delays in the clock signal CLK to be fed to the synchronous DRAM 22 and the data, addresses and control signals can be adjusted at the stage of designing the drawing display processor to make the cost lower and the margin more sufficient than those of the case in which the PLL circuit is used for the counter-measures.

Figure 21:
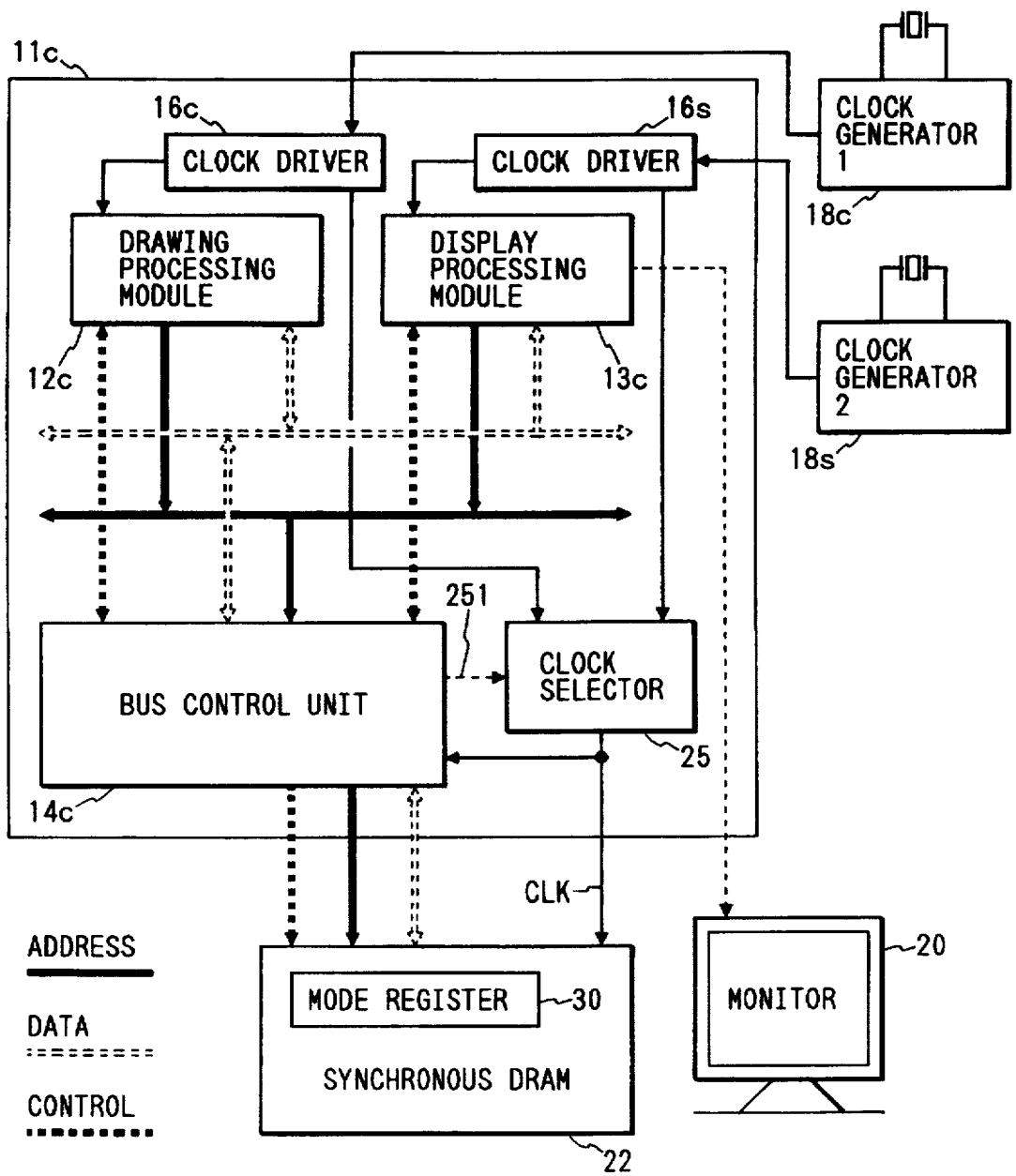
FIG. 21 is a block diagram showing an image processing system in which a plurality of frequency clocks are directly fed to the synchronous DRAM from drawing and display processors.

As represented in FIG. 21, moreover, in case there are present in a drawing display processor 11c modules of different frequencies such as a drawing processing module 12c and a display processing module 13c, the bus masters, i.e., the modules 12c and 13c have their clock signals made so specific that the clock signal to the synchronous DRAM 22 may be selected with a clock selector 25 by a bus control unit 14c of the drawing display processor 11c in accordance with the access subject to make the operation of the access subject and the operation of the synchronous DRAM 22 completely synchronous, as described above. As a result, the delay between the clock signal to be fed to the synchronous DRAM 22 and the data, addresses and control signals can be adjusted at the unit of the module of the bus master to retain a sufficient operation margin easily in that case.

Here will be further described the construction of FIG. 21, which includes: clock generators 18c and 18s of a plurality of frequencies; clock drivers 16c and 16s, a plurality of modules 12c and 13c adapted to operate in response to the aforementioned frequencies; a bus control unit 14c for adjusting the access to the aforementioned memory from the plurality of modules; and a clock selector 25 for selecting the clock to the memory in accordance with an adjust signal 251. The image processing system thus constructed feeds the clock CLK of a plurality of frequencies directly from the drawing display processor 11 to the synchronous DRAM 22. Incidentally, the CPU interface is omitted from FIG. 21. In case a predetermined display is repeated, for example, the drawing display processor 11c is operated while standing alone and needs no CPU interface. The construction can naturally be modified to include the CPU interface, as in FIG. 1.

Figure 22:
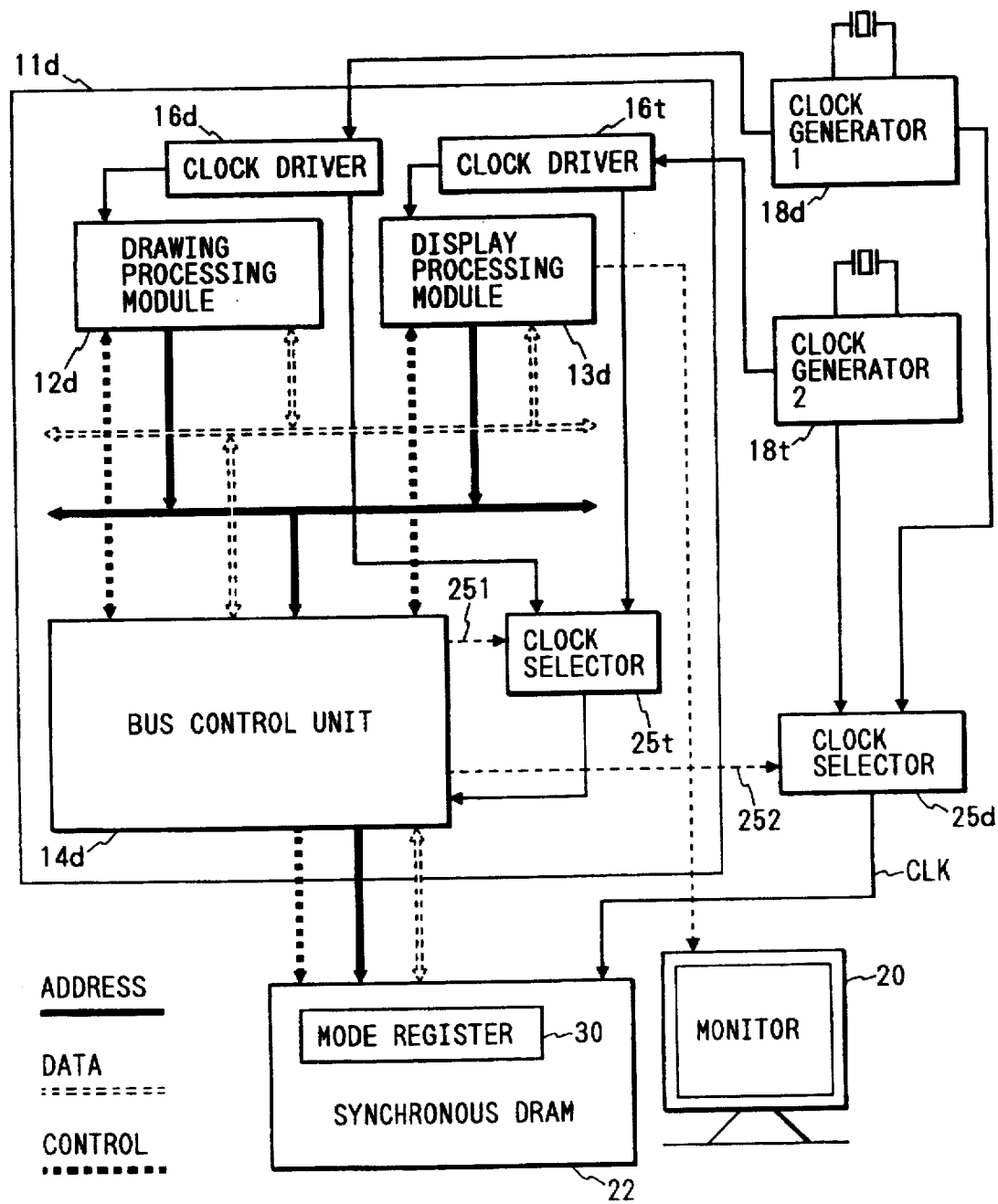
FIG. 22 is a block diagram showing an image processing system in which a plurality of frequency clocks are fed from the outside to the synchronous DRAM.

The construction shown in FIG. 22 is different from that of FIG. 21 in that a clock selector 25d for the synchronous DRAM 22 is arranged outside of a drawing display processor 11d. Specifically, the clock signals are fed to the clock selector 25d from clock generators 18d and 18t separately of the clock signal fed to the drawing display processor 11d, and a bus control unit 14d causes the clock selector 25d to select the output clock signal frequencies in dependence upon whether the access subject of the synchronous DRAM 22 is a drawing processing module 12d or a display processing module 13d. The control signal for that operation is designated at 252. Reference numerals 16d and 16t designate clock drivers, and numeral 25t designates a clock selector.

Figure 23:
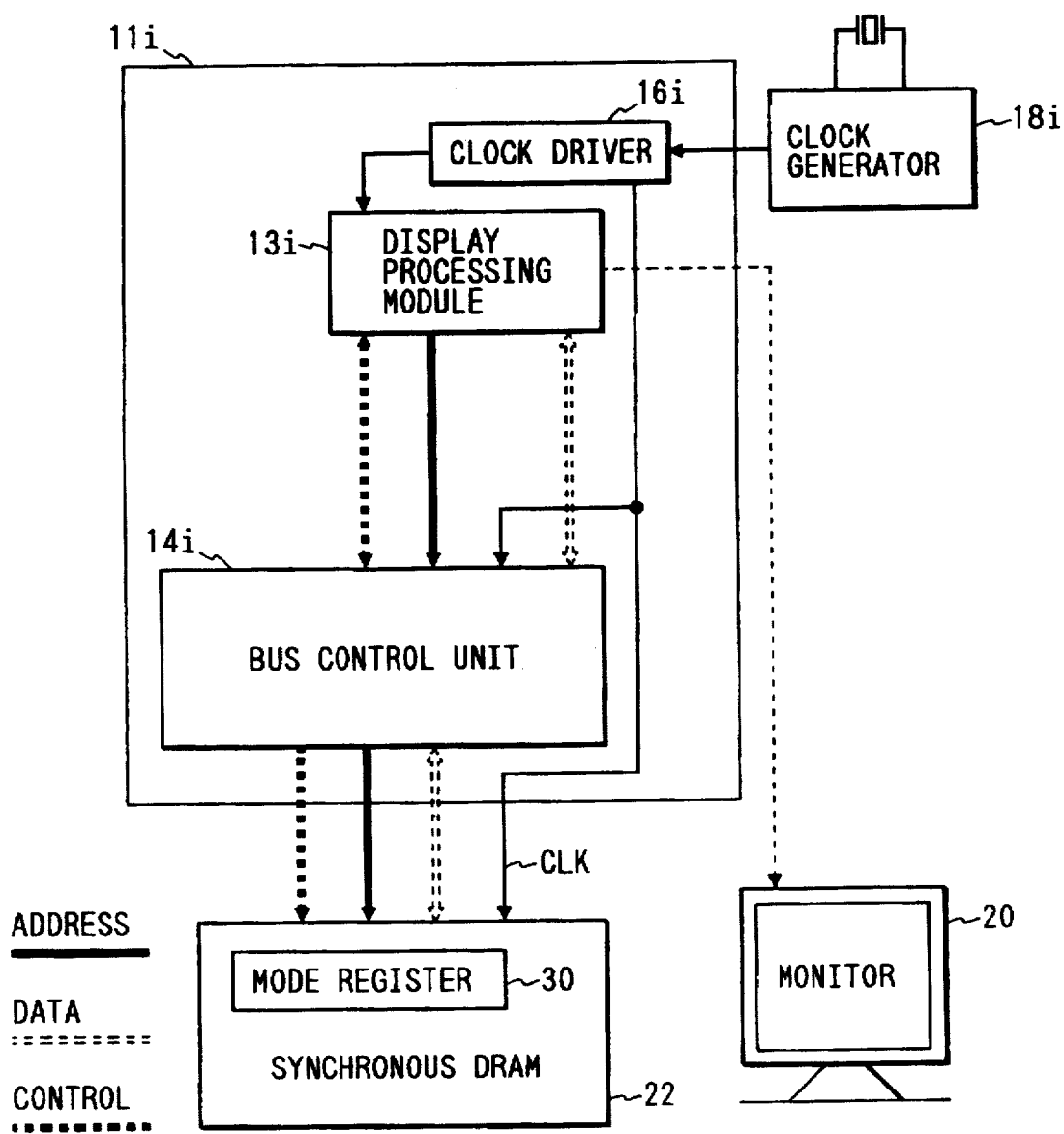
FIG. 23 is a block diagram showing an embodiment of an image processing system which is constructed to include a single module as in case the drawing and display processors include no drawing processing module.
Figure 24:
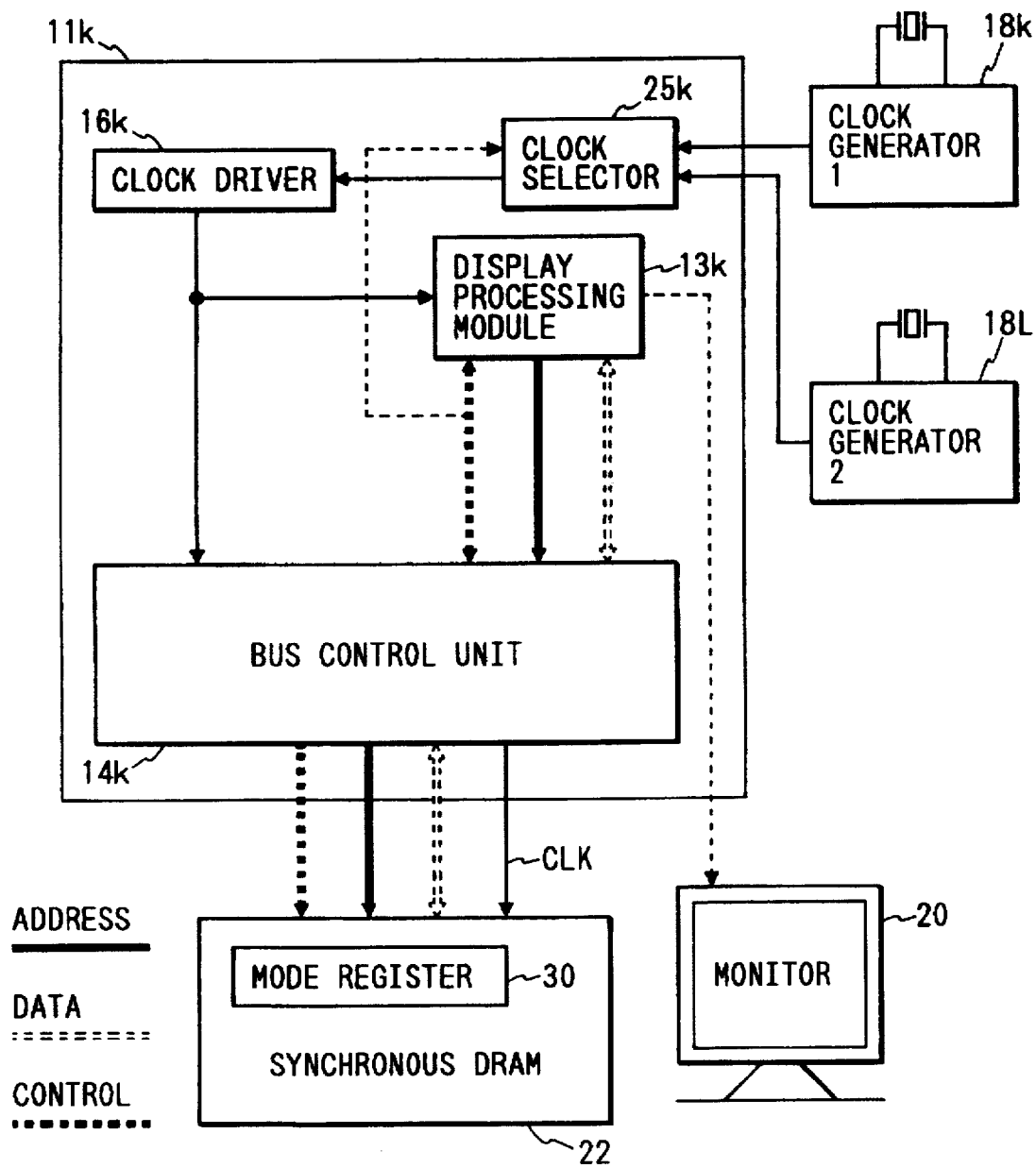
FIG. 24 is a block diagram showing an embodiment of an image processing system having a clock selector for selecting a plurality of frequency clocks by a single module.

Incidentally, even if the module in a processor 11i is a single module 13i (i.e., display processing module), as shown in FIG. 23, there can be made a construction for feeding the clock signal CLK from the processor 11i to the synchronous DRAM 22. In FIG. 28: reference numeral 14i designates a bus control unit; numeral 16i a clock driver; and numeral 18i a clock generator. As shown in FIG. 24, moreover, even a processor 11k of the type, in which is packaged a clock selector 25k for selecting the clock signals of a plurality of frequencies by a single module (i.e., display processing module) 13k, can feed the clock signals directly to the synchronous DRAM 22. Reference numerals 18k and 18L designate clock generators; numeral 16k a clock driver; and numeral 14k a bus control unit.

<Bus Competition Counter-Measures from Modules>

Figure 32:
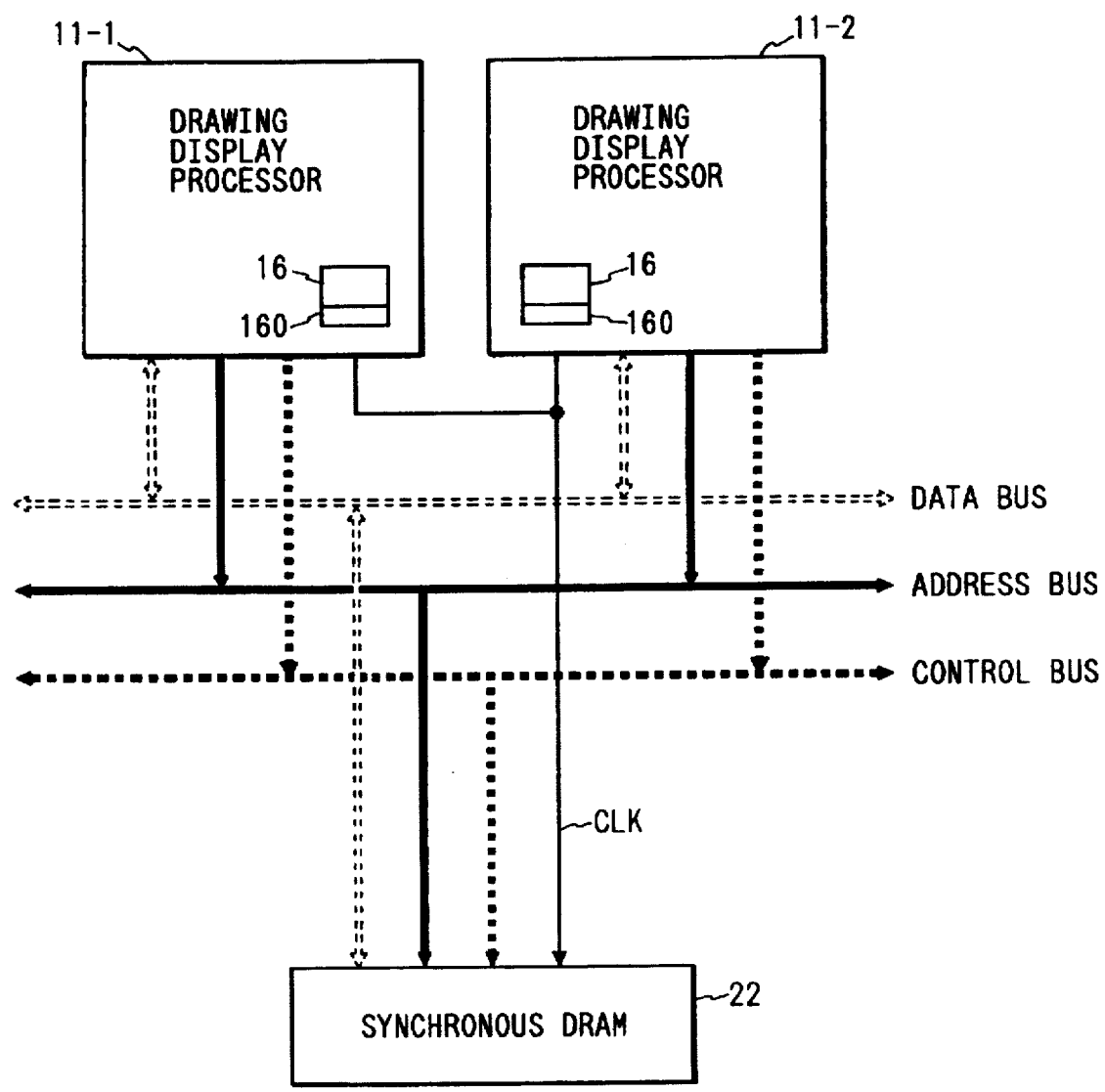
FIG. 32 is a block diagram showing one example of the system in which a plurality of drawing display processors share a single synchronous DRAM.

FIG. 32 shows a system exemplifying the case in which a plurality of, e.g., two drawing display processors 11-1 and 11-2 share the synchronous DRAM 22. In this system, in order to feed the clock signal CLK to the synchronous DRAM 22, the clock driver 16 packaged in each drawing display processor has a wired OR coupling output through a clock buffer 160 to the clock input terminal of the synchronous DRAM 22. At this time, in order that one of the drawing display processors may release the synchronous DRAM 22 for the other processor, the terminals for feeding not only the data, addresses and control signals but also the clock signal CLK to the synchronous DRAM 22 are controlled to the high impedance. According to the present embodiment, the output of the clock driver 16, i.e. the clock buffer 160 is controlled to the high impedance state. As a result, even in case the other drawing display processor makes a direct access to the synchronous DRAM 22, the other drawing display processor can control the access to the synchronous DRAM 22 while retaining a sufficient operation margin, that is, in accordance with the operation speed of the other drawing display processor.

Figure 18:
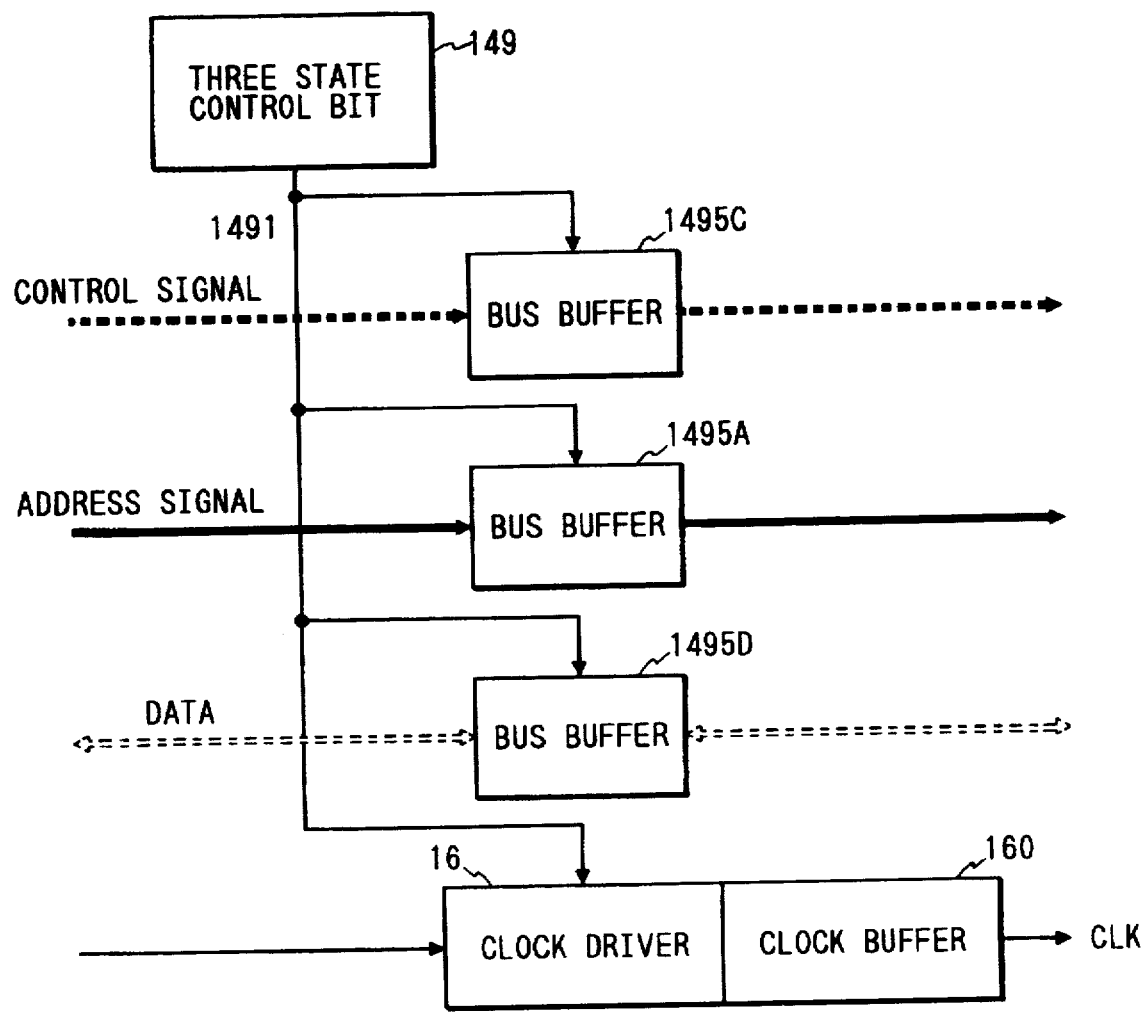
FIG. 18 is a block diagram showing one embodiment for raising the address, data, control signal and clock terminals to a synchronous DRAM.
Figure 19:
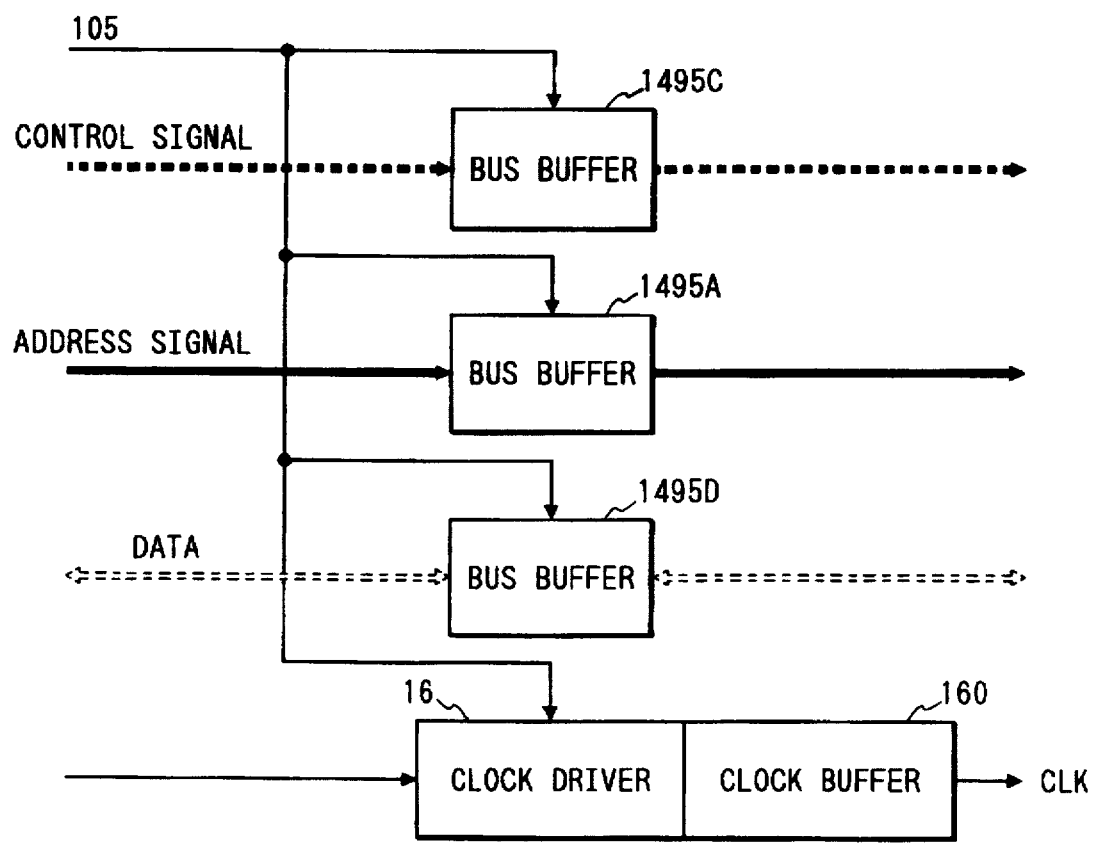
FIG. 19 is a block diagram showing another embodiment for raising the address, data, control signal and clock terminals to a synchronous DRAM.

FIGS. 18 and 19 show a circuit exemplifying the counter-measures for the bus competition from the plurality of the aforementioned modules. The example shown in FIG. 18 is equipped in the internal register of the drawing display processor 11 with a three-stage control bit 149, which value is set from the CPU 15, for example. The output 1491 of this three-state control bit 149 set the bus buffers 1495A, 1495D and 1495C for the addresses, data and control signals in the bus control unit 14 and the clock terminal to the high impedance. This high impedance of the clock terminal is realized in the clock driver 160. In the example shown in FIG. 19, the clock terminals of the bus buffers 1495A, 1495D and 1495C for the addresses, data and control signals and the clock driver 16 (i.e., the output terminal of the clock buffer 160) are set to the high impedance in response to either the level or changing timing of a control signal 105 to be fed from the external terminal of the drawing display processor 11.

<Setting of Mode Register>

The mode register 30 included in the synchronous DRAM 22 is a register for designating the operation mode of the synchronous DRAM 22. The existing standard memory has no register for designating the static operation mode unlike the mode register 30, and the corresponding access subject need not issue any special command other than the access cycles of reading, writing and refreshing the memory. In the present invention, the drawing display processor 11 sets the mode register 30 in accordance with its internal architecture and processing content. A variety of types to be described in the following can be suitably adopted for the system of setting the mode register.

Figure 3:
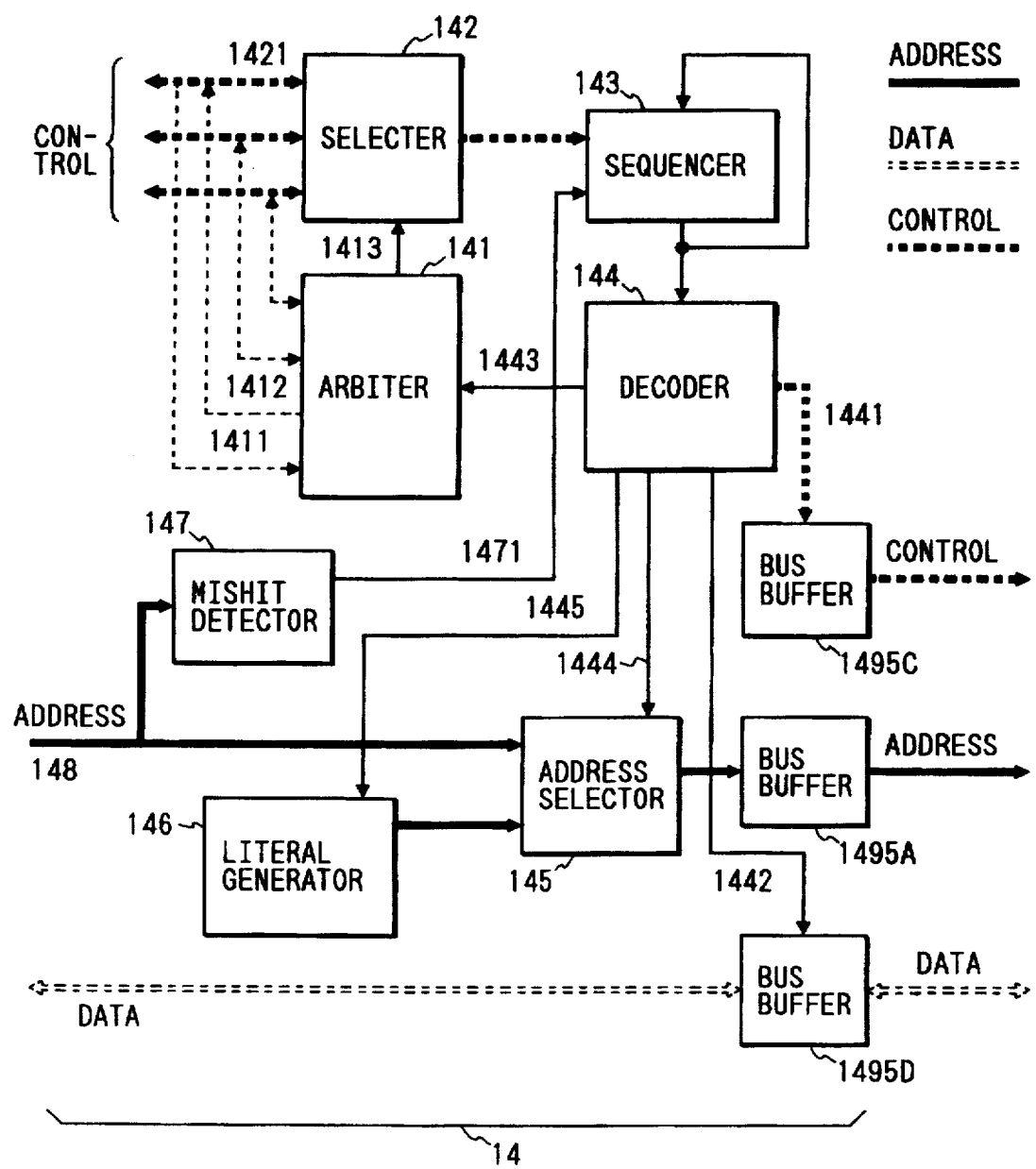
FIG. 3 is a block diagram showing one example of a bus control unit.

FIG. 3 is a block diagram showing one example of the aforementioned bus control unit 14. An arbiter 141 accepts a bus request signal 1411, which is outputted from the individual modules 12 and 13 to the synchronous DRAM 22 as a result of the command execution in the modules, to arbitrate the bus right and to allow the operation of one module with a bus acknowledge signal 1412. Simultaneously with this, the arbiter 141 feeds a selector 142 with a module select signal 1413. The selector 142 selects the control information coming from each module in response to the aforementioned select signal 1413 and feeds the information to a sequencer 143. The control information 1421 for the synchronous DRAM 22 is exemplified by a control code for instructing the reading, writing, refreshing of the data and the setting of the mode register 30. This control code is outputted as a result that that module executes the command fetched from the outside. A mishit detector 147 compares whether or not the row address of an address bus 148 is identical to that being active at present, and feeds the sequencer 143 with mishit information 1471. The sequencer 143 feeds a decoder 144 with a series of information for executing the bus control processing designated with the control information 1421, in accordance with the control information 1421 and the mishit information 1471 on the basis of the state transition diagram of FIG. 4. The decoder 144 decodes a variety of information fed from the sequencer 143 and outputs a command 1441 to the synchronous DRAM 22, a control signal 1442 of the bus buffer 1495D, a control signal 1443 to the arbiter 141, and so on. In case the command 1441 to be issued to the synchronous DRAM 22 is a command (e.g., the mode register set command Mo) for setting the aforementioned mode register 30, the value to be set in the mode register 30 is selected and outputted by a literal generator 146 according to the output 1445 of the decoder 144, although not especially limitative thereto. Since the command register value of the synchronous DRAM 22 is fed through the address bus, the address selector 145 selects the output of the literal generator 146 in response to a control signal 144 outputted by the decoder 144, so that the set value to the command register 80 is fed from the bus buffer 1495A through the address bus to the synchronous DRAM 22. Incidentally, the literal generator 146 can be constructed of a logic circuit or storage circuit for outputting a predetermined value in accordance with the output 1445 of the decoder 144.

Figure 26:
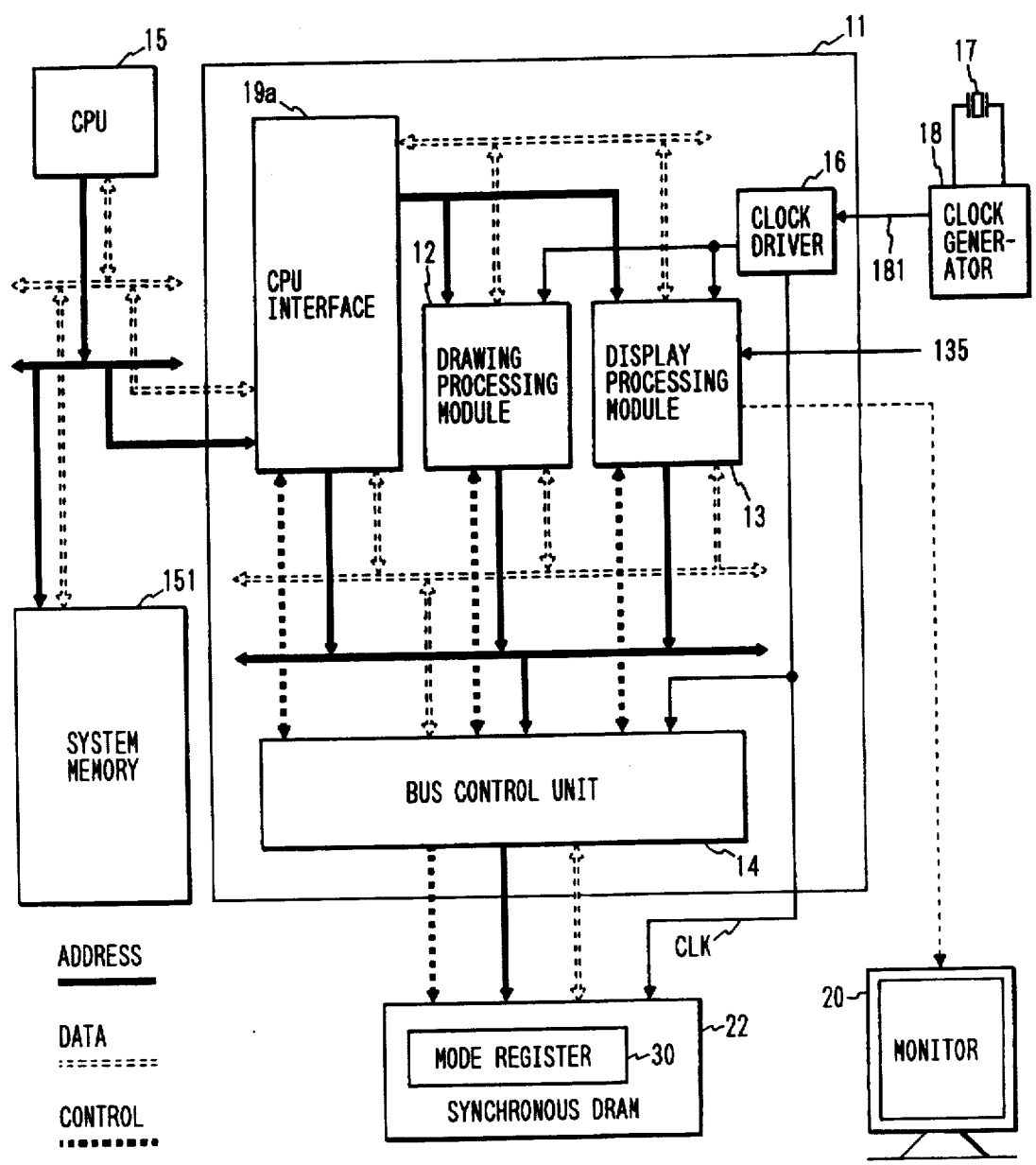
FIG. 26 shows an embodiment for issuing a mode register setting command to a memory at a timing inputted from an external terminal.

The issuing timing of the mode register set command Mo can be synchronized with an external signal. As shown in FIG. 26, for example, the display blanking information 185 is inputted from the external terminal. This display blanking information is a vertical feedback period in the vertical synchronizing signal, for example, and the display processing module 18 is timed to issue the mode register set command from the bus control unit 14 to change the burst length, for example, so as to fetch the next display data from the synchronous DRAM 22.

Figure 27:
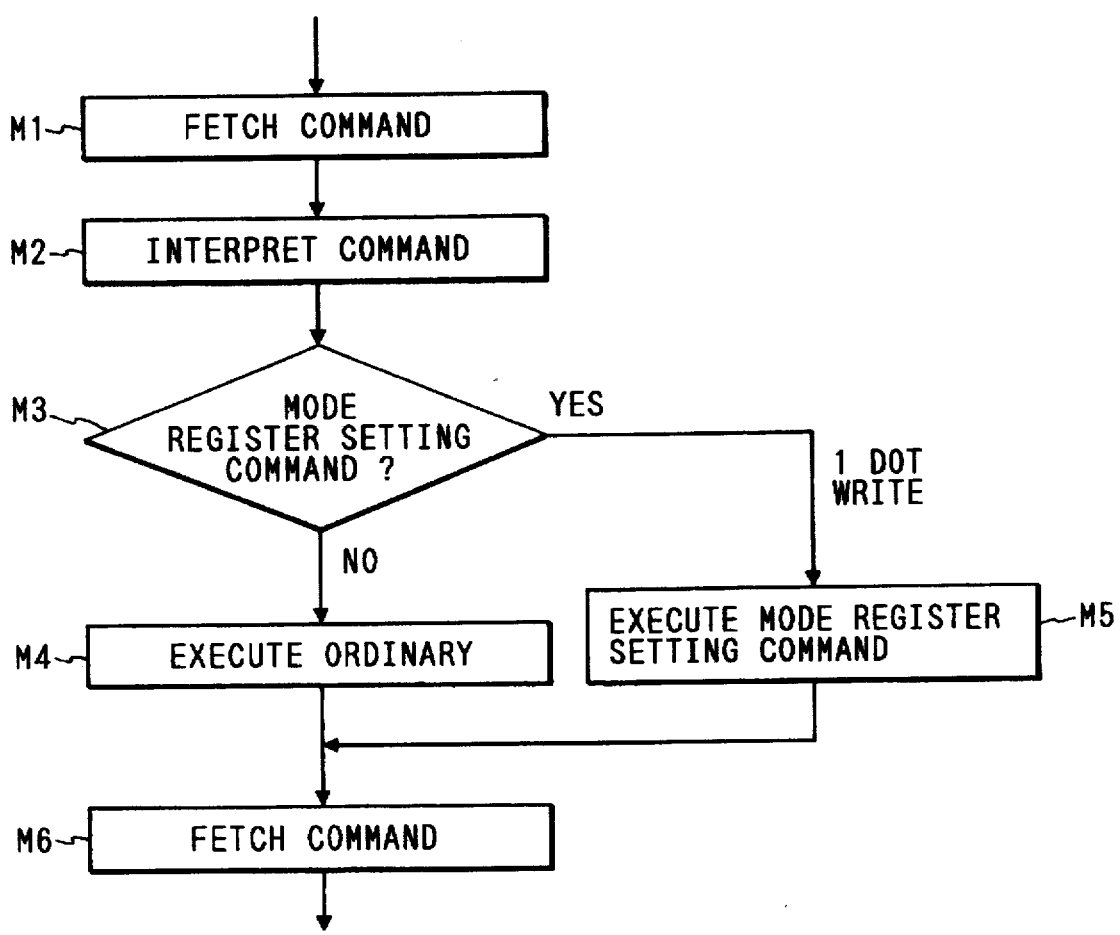
FIG. 27 is a flow chart illustrating an execute sequence in response to a special purpose instruction for issuing the mode register setting command.

The set value for the mode register 30 can be contained in the command itself or the parameter of the command. This command is one to be executed by the aforementioned various drawing processing module 12 and display processing module 13. A command execution flow by such processing modules is schematically shown in FIG. 27. Specifically: the command is fetched (at M1); the command is interpreted (at M2); it is decided (at M3) whether or not the result of interpretation is the set command of the mode register 30; the command is executed (at M5) if the command is the mode register set command; otherwise, a processing instructed by the command is executed (at M4); a next command is fetched (at M6); and the foregoing routine is repeated. The step M5 in FIG. 27 is equivalent to the step M1 in the next command fetch cycle. FIG. 28 illustrates the formats of such various commands. FIG. 28(A) illustrates the case of a command format in which one command is composed of a command specifying field COMC and an attribute code field COMD. In this case, the set value of the mode register 80 in the mode register set command is arranged in the attribute code field COMD. FIG. 28(B) illustrates a format in which one command is composed of the command specifying field COMC and in which various attributes are contained in the succeeding parameter PAR. In this case, the set valve of the mode register 80 in the mode register set command can be arranged in the parameter PAR.

Figure 29:
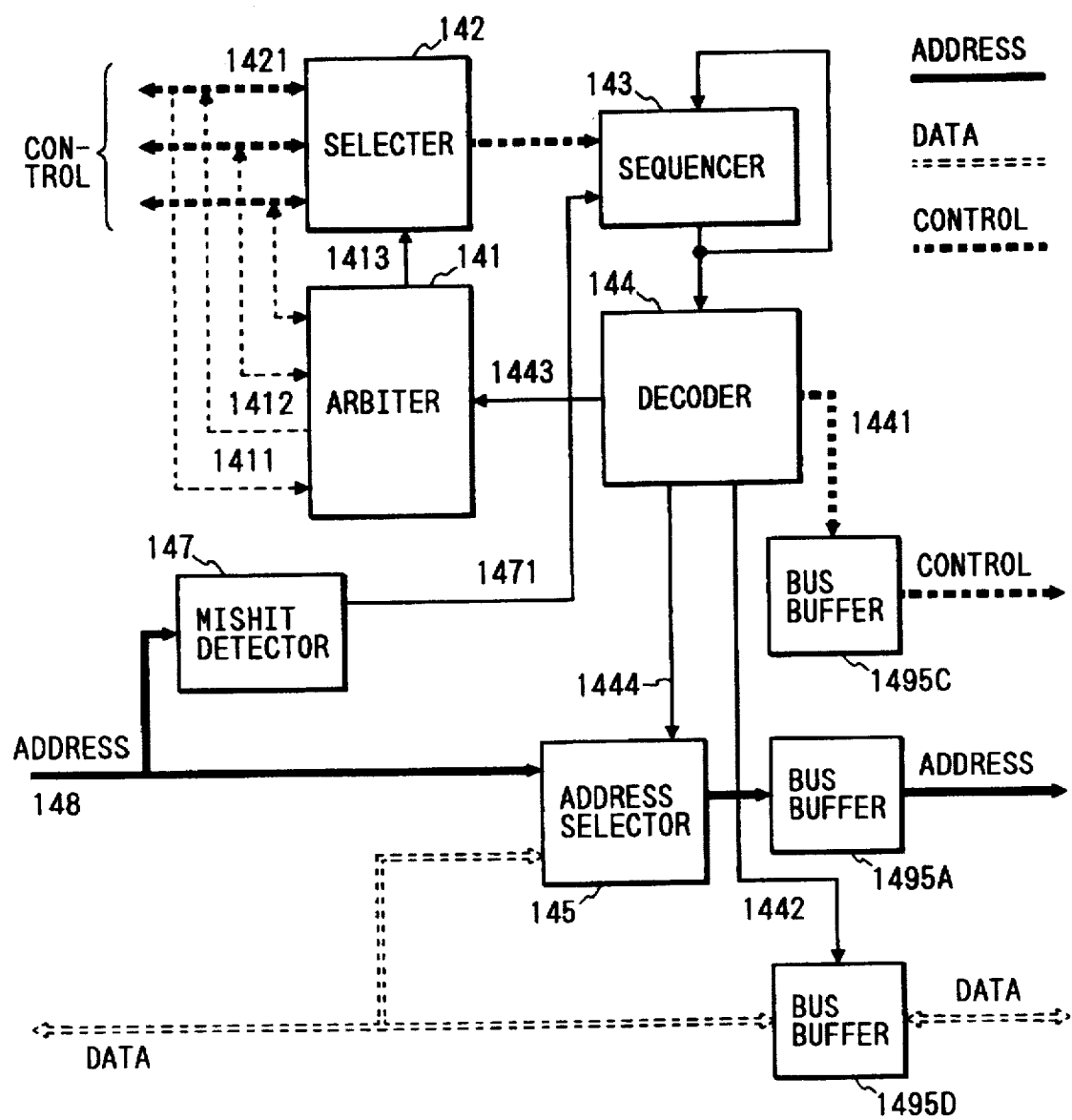
FIG. 29 is a block diagram showing an embodiment in which the set value of a mode register of the synchronous DRAM can be directly designated from an internal data bus.

A construction shown in FIG. 29 exemplifies the construction of a bus control unit of the case in which a set value for the mode register 30 is made to accompany the commands to be executed by the modules 12 and 13. This construction is different in that the literal generator 146 of FIG. 3 is replaced to couple the value of the data bus to one input of the address selector 145. The selective control of the address selector 145 should be understood to be similar to that of FIG. 3. Since the data bus can be selected as the input of the address selector 145, the set value of the mode register 30 to be fed to the address input terminal of the synchronous DRAM 22 can be directly designated from the internal data bus to which is coupled either the drawing processing module 12 or the display processing module 13. For example, the drawing processing module 12 or the display processing module 13 feeds, when it recognizes the setting processing of the mode register 30 in terms of the command having the format shown in FIG. 28, the control information 1421 for the processing to the bus control unit 14 and outputs the set value of the mode register 30 to the aforementioned internal bus. As a result, the mode register for the synchronous DRAM 22 is set.

Figure 30:
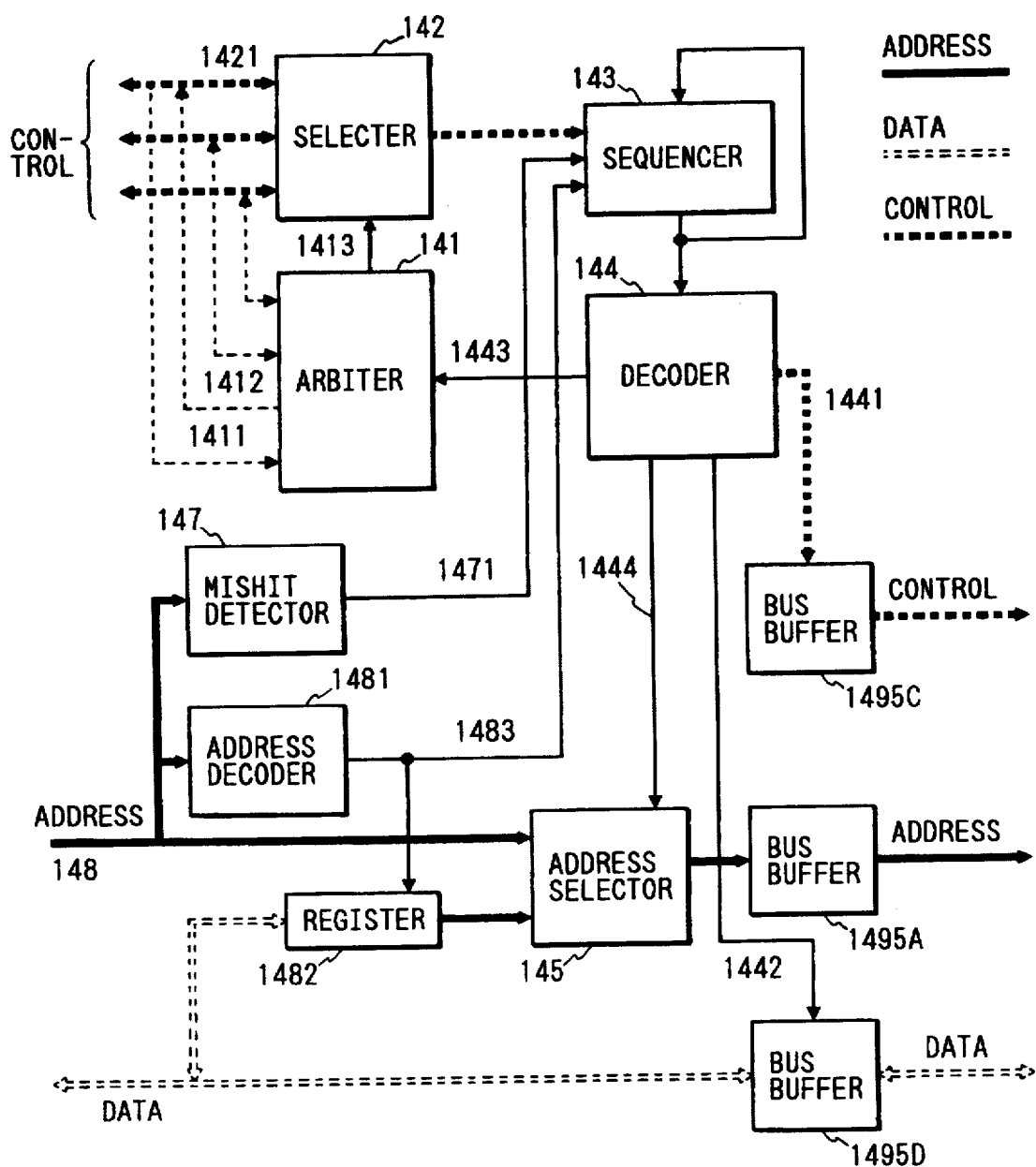
FIG. 30 is a block diagram showing an embodiment for issuing a set command of the mode register of the synchronous DRAM in synchronism with the rewrite of an internal register specially mapped by an address decoder.

Moreover, the setting processing of the mode register 30 can also be realized by the I/O mapping method. In FIG. 30 showing one example, a specific register 1482 is mapped in the I/O space which can be accessed by the drawing processing module 12 and the display processing module 13. Specifically, an address decoder 1481 detects the access of the register 1482 from the internal address bus information and informs the register 1482 and the sequencer 143 of it in terms of a control signal 1488. As a result, the register 1482 latches the mode register set value being then fed to the data bus, and the sequencer 143 recognizes that notice as an instruction for setting the command register. The sequencer 143 issues the mode register set command to the synchronous DRAM 22 through the bus buffer 1495C and feeds the set value latched in the register 1482 from the bus buffer 1495A to the synchronous DRAM 22 by selecting it by the address selector 145. Although not especially shown, moreover, the physical register can be omitted from the I/O mapping system, and this system can be constructed to detect the access to the aforementioned specific address by the decoder 1481 while retaining that address.

Figure 31:
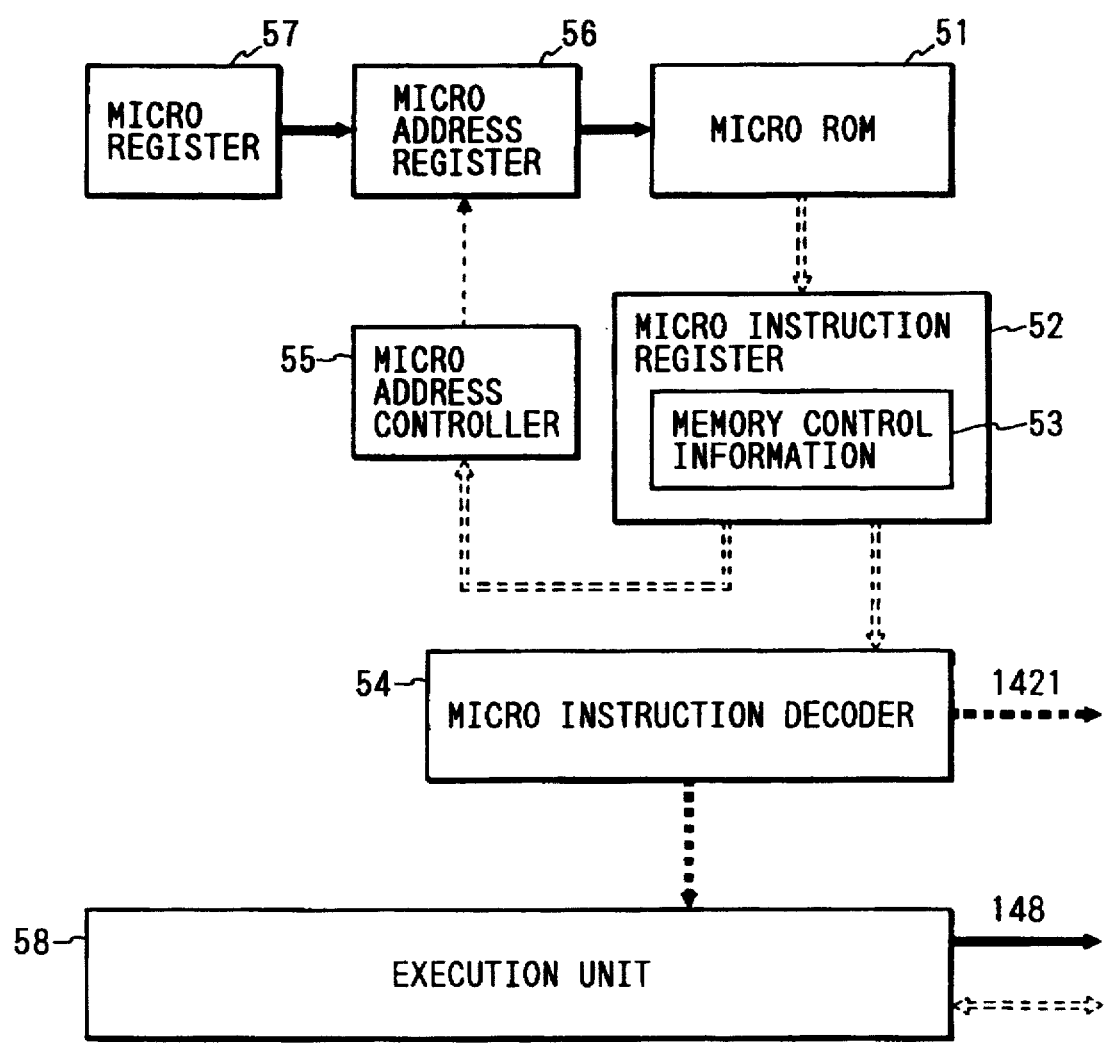
FIG. 31 is a block diagram showing an embodiment for issuing a set command of the mode register of the SDRAM by a microprogram control.

FIG. 31 is a block diagram showing a control system of the case in which the internal module 13 such as the display processing module makes use Of the microprogram control. A macro ROM 51 is described in a predetermined microprogram. The access address therefor is latched by a micro address register 56, and the micro instruction read out from the micro ROM 51 is latched in a macro instruction register 52, the output of which is decoded b a micro instruction decoder 54 so that the control signal for executing the micro instruction is fed to an execution unit 58. The micro instruction contains the next address information and is fed to a micro address controller 55 so that the value of the micro address register 56 is sequentially updated. The leading micro address of the micro instruction series is given as the command fetched by a micro register 57. The command thus fetched basically determines the operations of the drawing processing module 12 and the display processing module 13. The micro address controller 55 also controls the micro address for the micro branching. When the command for setting the mode register 30 is fetched by the micro register 57, for example, the micro instruction register 52 latches the micro instruction which is exemplified to represent the memory control information 53. When this micro instruction is decoded, the control operations for setting the mode register 30 are started in the modes of FIGS. 3, 26, 29 and 30.

<Dynamic Setting of Mode Register>

The drawing display processor 11 of the present embodiment can set the mode register 30, which can be set by the aforementioned various methods, dynamically according to the content to be processed. In the straight drawing in an arbitrary direction, for example, the memory addresses are not continuous in the same row address, so that the burst length to be set in the mode register 30 is desired to be 1. In the rectangular smearing drawing for memory clearing, on the contrary, the memory addresses are continuous in the same row address so that the burst length is desired to be N (N>1) and has to be changed according to the drawing processing content. In the present invention, therefore, the mode register 30 can be dynamically changed according to the various processing contents to improve the bus throughput of the synchronous DRAM 22 at a low cost in accordance with the burst length.

Figure 4:
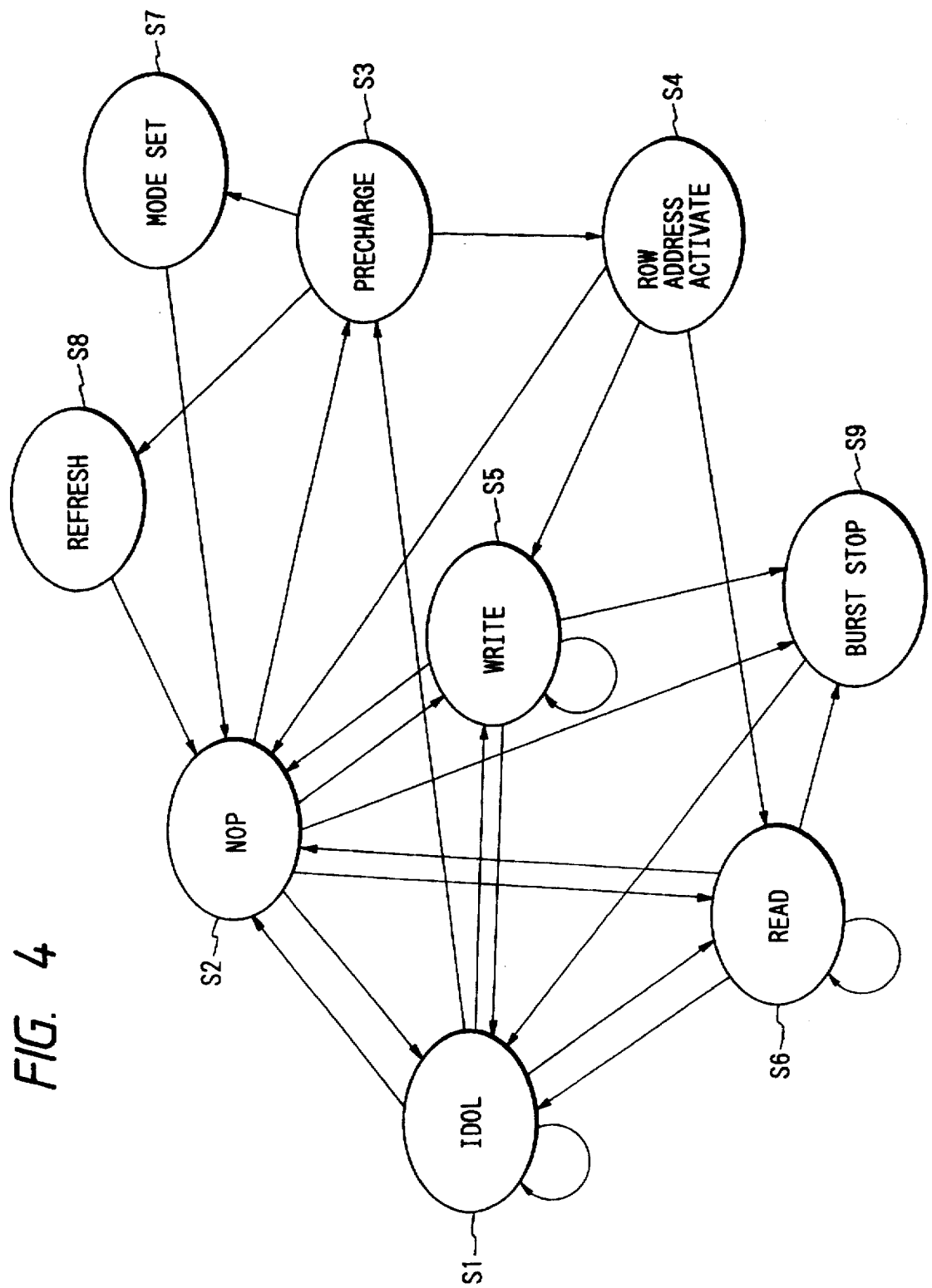
FIG. 4 is an explanatory diagram illustrating a state transition of a sequencer of the bus control unit.

FIG. 4 shows the state transition of the sequencer 143 of the bus control unit 14 of FIG. 3. When the power is supplied, a precharge S3, a mode register setting S7 and an NOP (i.e., Non OPeration) S2 are executed from an idle S1 so as to initialize the synchronous DRAM 22, and a refresh sequence S8 is additionally repeated two times as a dummy cycle. The refreshing step is composed of the steps from the idle S1 to the precharge S3, the refresh S8 and the NOP S2. The reading of data in case the burst length is at 1 as in the straight drawing is executed by the steps from the idle S1 to the precharge S3, a row address activation (as instructed by the row address strobe-bank active command) and a read (as instructed by the column address-read command) S6. Subsequently, the data are sequentially read out (in the burst read operation), if the row address is identical, by issuing the read step S6 continuously. The writing of data is executed by the steps from the idle S1 to the precharge S3, the row address activation S4 and a write (as instructed by the column address-write command) S5. Subsequently, the data are sequentially written (in the burst write operation), if the row address is identical, by issuing the write step S5 continuously. If the row address changes during the continuous reading or writing operation, the states of the NOP S2 the precharge S3 and the row address activation S4 are passed before the new reading or writing operation. The read modify write can be executed, if the CAS latency is at 1, by deeming the steps of the aforementioned read S6, NOP S2 and write S5 as one cycle. In case a bus demand is made for the arbiter 141 from the display processing module 13, this module 13 gives the sequencer 143 the control information for setting the mode register 30, if the bus acknowledge 1421 is returned, so that the precharge S3, the mode register setting (as instructed by the mode register set command) S7, the NOP S2 are executed to set the burst length to 8. After this, the read S6 is issued for every eight words. During this time period, the precharge S3 can be executed for the bank which is not being accessed at present, and the row address activation S4 of the adjoining next row determined in advance can be executed. The display processing module 13 gives the sequencer 143 the set instruction of the mode register 30, when the necessary display data are read out, so that the precharge S3, the mode register setting S7 and the NOP S2 are executed to set the burst length to 1. After this, the bus demanding signal is negated to open the bus.

FIGS. 5 to 13 show examples of the access timings of the display and drawing cycles for the synchronous DRAM 22. Here, the read data are outputted to the data bus after lapse of a predetermined clock (or latency). This latency is variable, and the data for determining the value are set in the mode register 30 of the synchronous DRAM 22. In the examples of FIGS. 5 to 13, all the latency are set to 1, although not especially limitative thereto.

Figure 5:
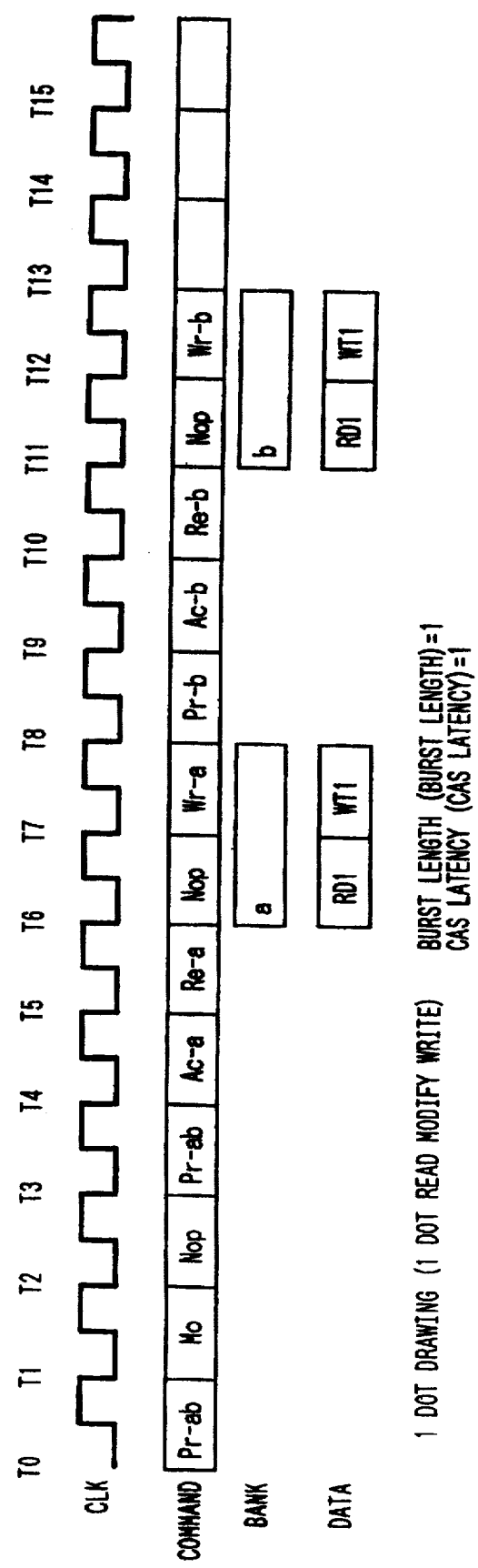
FIG. 5 is a timing chart illustrating an example of a one-dot read modify write in a drawing process.

FIG. 5 shows an example of the one-dot modify write in the drawing processing. This example presents the case in which random pixels are drawn dot by dot. At T1, the burst length is set to 1 (Mo) in the mode register 30. At T3, the drawing processing module 12 issues the control information 1421 for the one-dot read modify write. The mishit detector 147 detects that the access address at that time is not in the same position as the preceding row address. As a result, the sequencer 143 feeds the synchronous DRAM 22 the commands for the precharge S3 (i.e., Pr-ab at T3), the row address activation S4 (i.e., Ac-a at T4), the read S6 (i.e., Re-a at T5), the NOP S2 (i.e., Nop at T6) and the write S5 (i.e., Wr-a at T7) in synchronism with the clock signal CLK. Since the CAS latency at the reading time is set to 1, the data are read out at T6 are written at T7. At T8, the control information 1421 therefor is issued, and the individual commands for the precharge S3 (i.e., Pr-b at T8), the row address activation S4 (i.e., Ac-b at T9), the read S6 (i.e., Re-b at T10), the NOP S2 (i.e., Nop at T11) and the write S5 (i.e., Wr-b at T12) are fed to the synchronous DRAM 22 in synchronism with the clock signal CLK.

Figure 6:
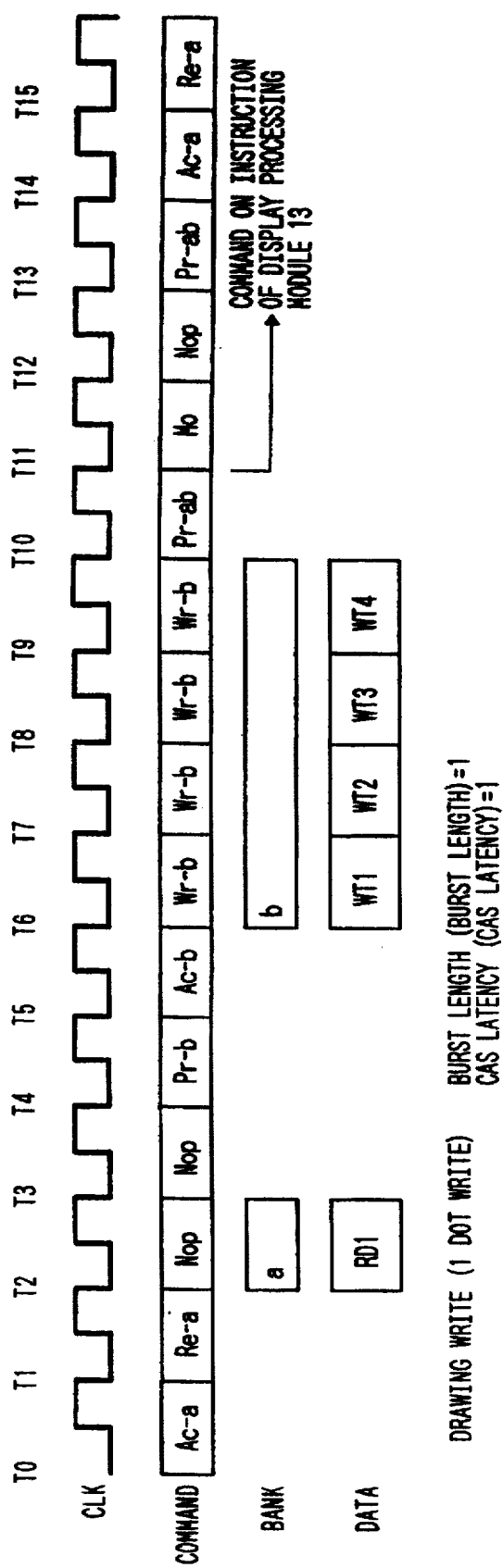
FIG. 6 is a timing chart illustrating the former half of an interrupting process of a display processing module.
Figure 7:
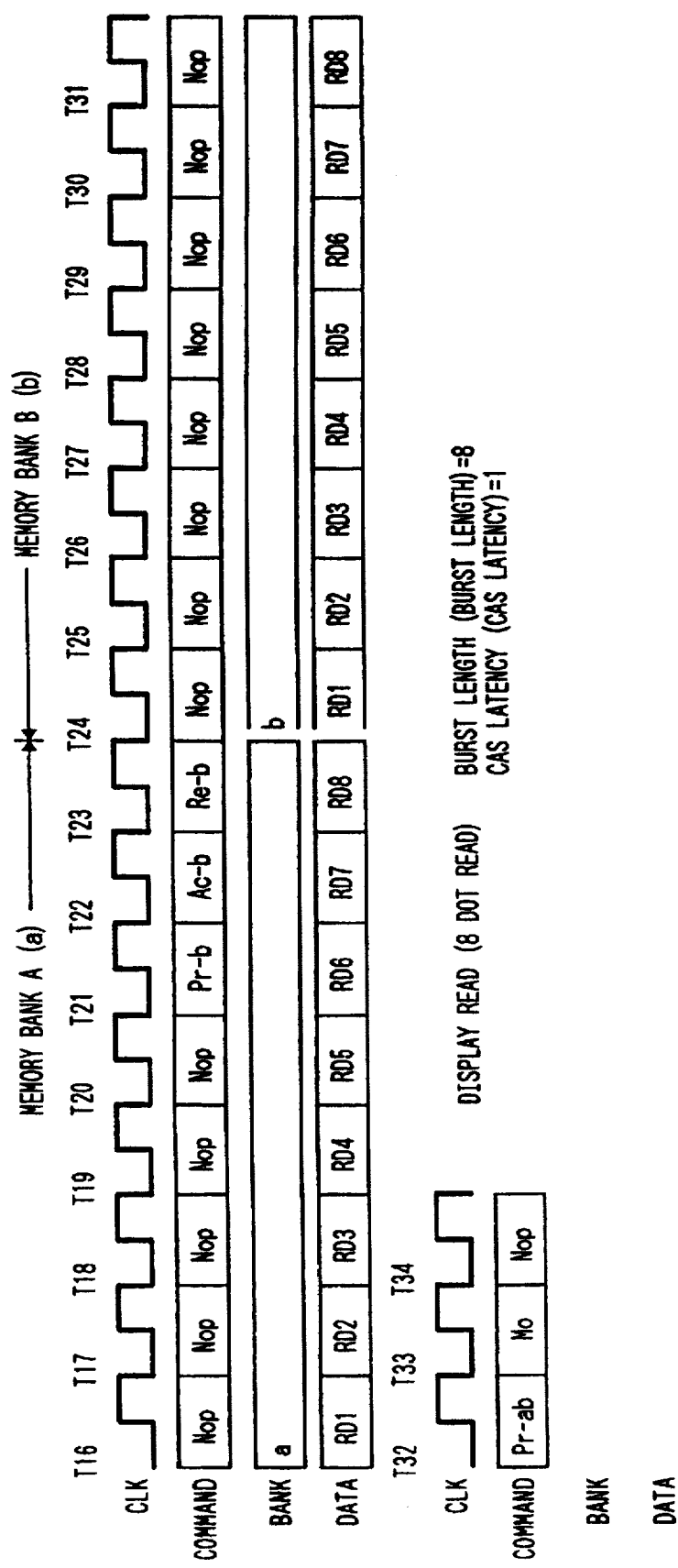
FIG. 7 is a timing chart illustrating the latter half succeeding that of FIG. 6.

FIGS. 6 and 7 are timing charts illustrating an interruption from the display processing module 13. In FIGS. 6 and 7, the synchronous DRAM 22 is a subject to be drawn for the time period till T10, because the one-dot read and one-dot write are executed for the random column addresses. At this time, it is assumed that the bus demand is interrupted from the display processing module 13. FIG. 7 shows the example in which 16 words are batch-read as the display data in response to such bus demand. If the bus demand is made from the display processing module 13, the arbiter 141 conducts the bus arbitration to open the buses to the display processing module 13. This display processing module 13 feeds the sequencer 143 the control information 1421 for such 16-word read. As a result, the mode register 30 has its burst length set to 8 (i.e., Mo at T11). The read command is issued at every 8 words (i.e., Re-a at T15 and Re-b at T23). Before the read command of T15 is issued, the individual commands of the precharge S8 (i.e., Pr-ab at T13) and the row address activation S4 (i.e., Ac-a at T14) are issued to the synchronous DRAM 22. The read of the first 1 word is started in synchronism with T16. For this time period, the commands of the precharge S3 (i.e., Pr-b at T21) and the predetermined adjoining next row address activation S4 (i.e., Ac-b at T22) are issued to the synchronous DRAM 22 so that their processings are executed at the side of the memory bank B(b). As a result, the data can be processed in the pipeline manner to improve the bus throughput. In other words, the data can be read out without any interruption even at the change of the memory banks to be accessed. The display processing module 13 instructs the setting of the mode register 30, when it reads out the necessary display data, and executes the precharge S3 (i.e., Pr-ab at T32), the mode register setting S7 (i.e., Mo at T33) and the NOP S2 (i.e., Nop at T34) to set the burst length to 1. The display processing module 13 then negates the bus demand signal to open the buses.

Figure 8:
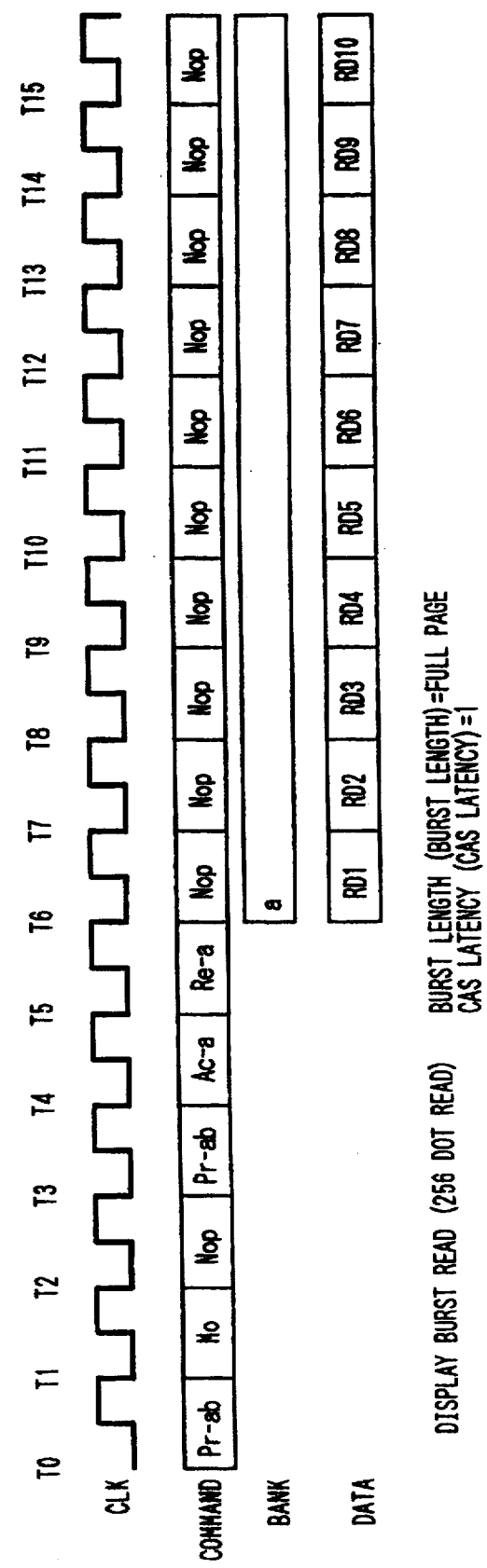
FIG. 8 is a timing chart illustrating the former half of a burst read of display data.
Figure 9:
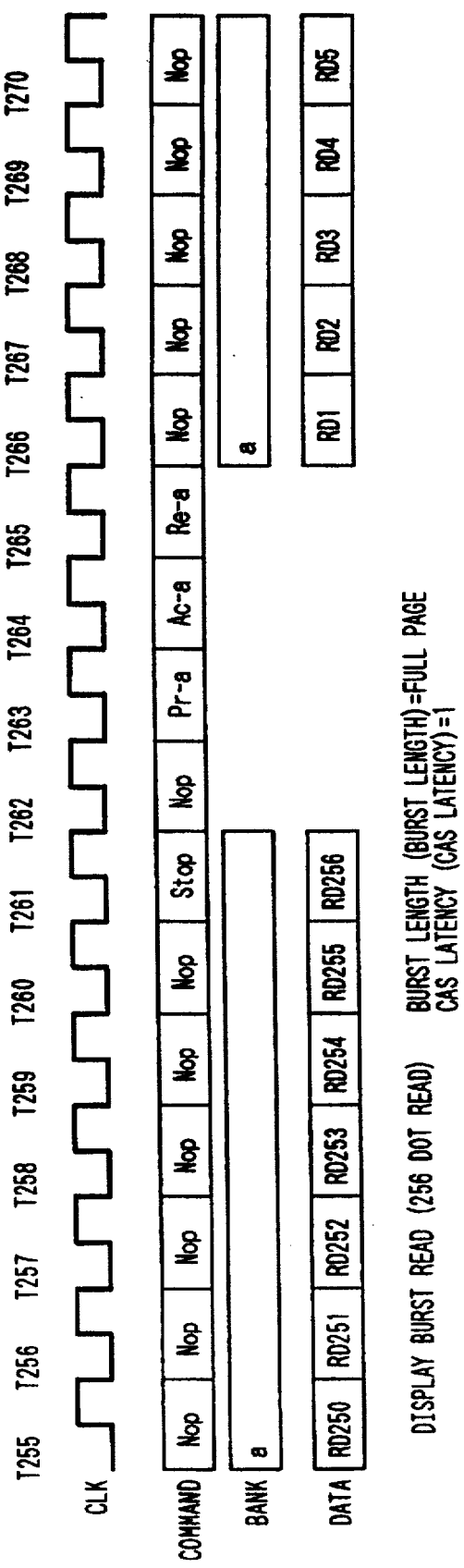
FIG. 9 is a timing chart illustrating the latter half succeeding that of FIG. 8.

FIGS. 8 and 9 show an example of the burst reading operation of the display data. In order to shorten the ratio of the display access cycle of the synchronous DRAM 22, it is advisable to read out as many as display data continuously as possible. It is, therefore, desirable to read the data continuously by setting the burst length to the full page. However, the display processing module 13 has to be equipped in advance with a FIFO or RAM for once latching the display data read out in advance. The number of words to be continuously read out is determined in relation to the storage capacity such as the FIFO. The burst stop command (Stop) is can have its generation timing controlled by the coincidence between the results of comparison of the counter output value of the read word number in the display processing module 13 and the number of data words to be read out. In FIG. 8, the command register 30 is set (Mo) at T1 to set the burst length to the full page, and the individual commands for the precharge (Pr-ab), the row address activation (Ac-a) and the read (Re-a) are issued at T3, T4 and T5, respectively, so that the data are sequentially read out in synchronism with T6.

Figure 10:
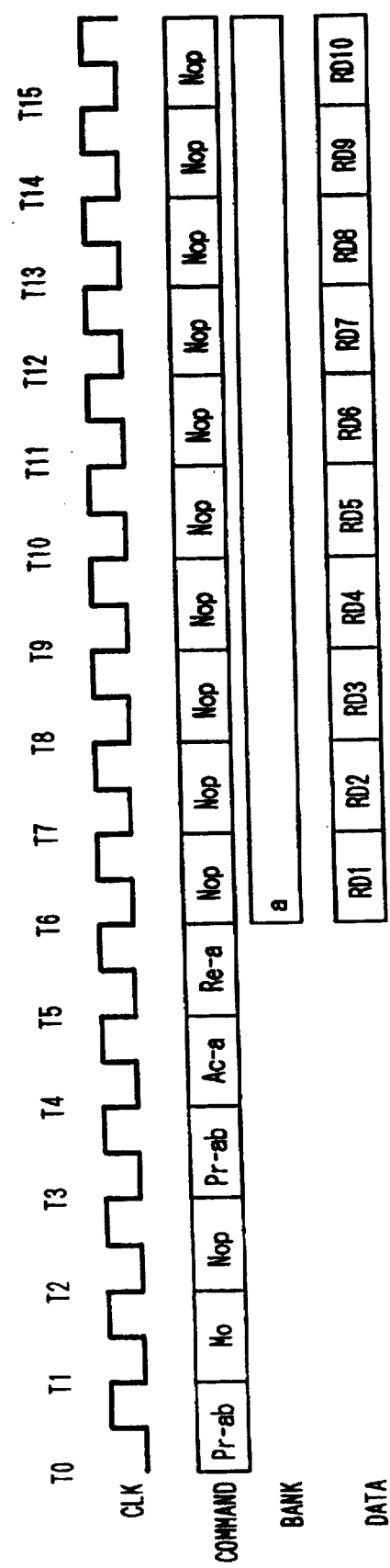
FIG. 10 is a timing chart illustrating the former half of a bit block transfer in a drawing process.
Figure 11:
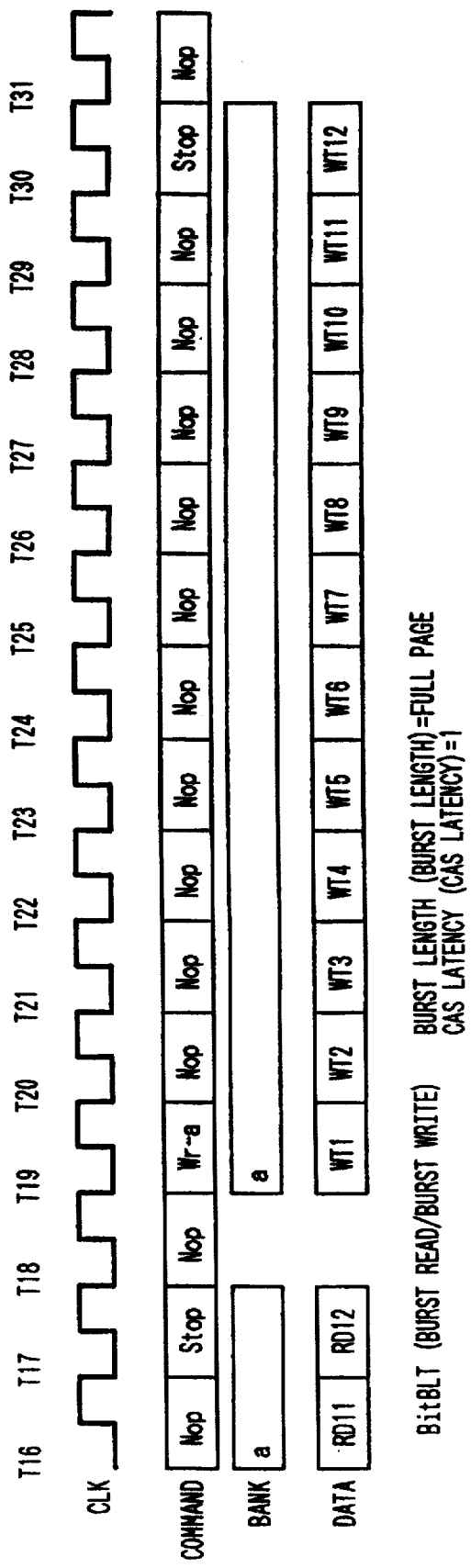
FIG. 11 is a timing chart illustrating the latter half succeeding that of FIG. 10.

FIGS. 10 and 11 show one example of the BitBLT (i.e., Bit BLock Transfer) in the drawing processing. In this case, too, the data are continuously read and written by setting the burst length to the full page. The access addresses at this time belong to the same row address. According to this example, the numbers of read and write data are individually set to 12, and the burst read and the burst write are ended in response to the burst stop command (i.e., Stop at T17 and T30). The display processing module 13 is equipped with means for storing therein the read data or the transfer source data in the BitBLT.

Figure 12:
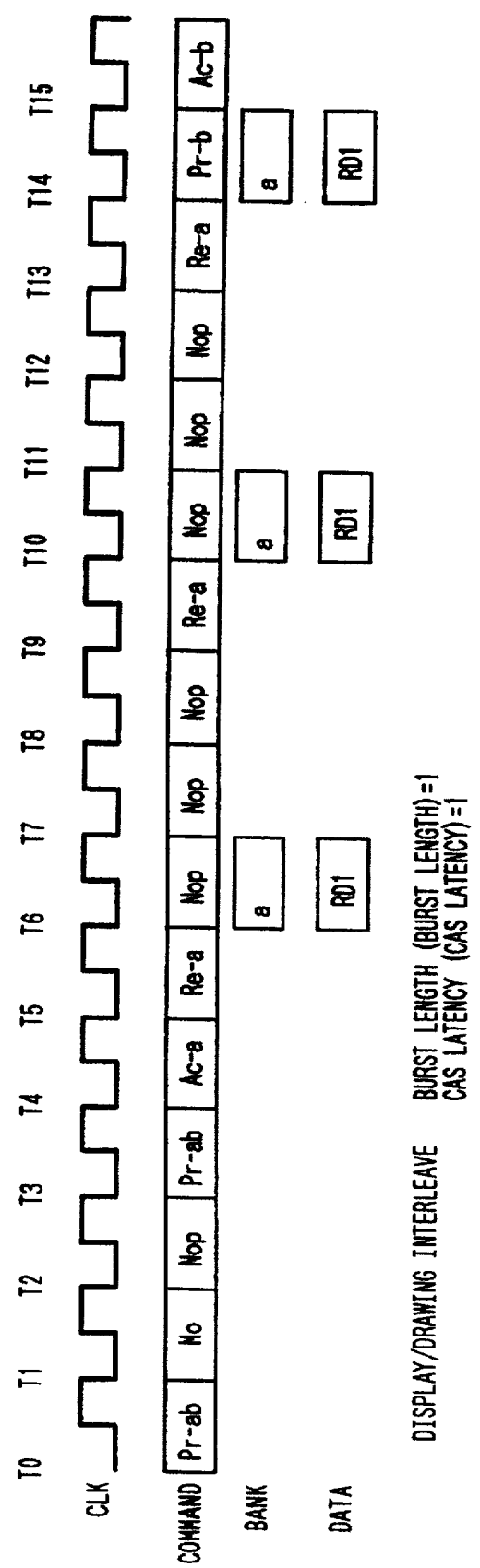
FIG. 12 is a timing chart illustrating the former half of an accessing operating of the type interleaving the displaying and drawing processes.
Figure 13:
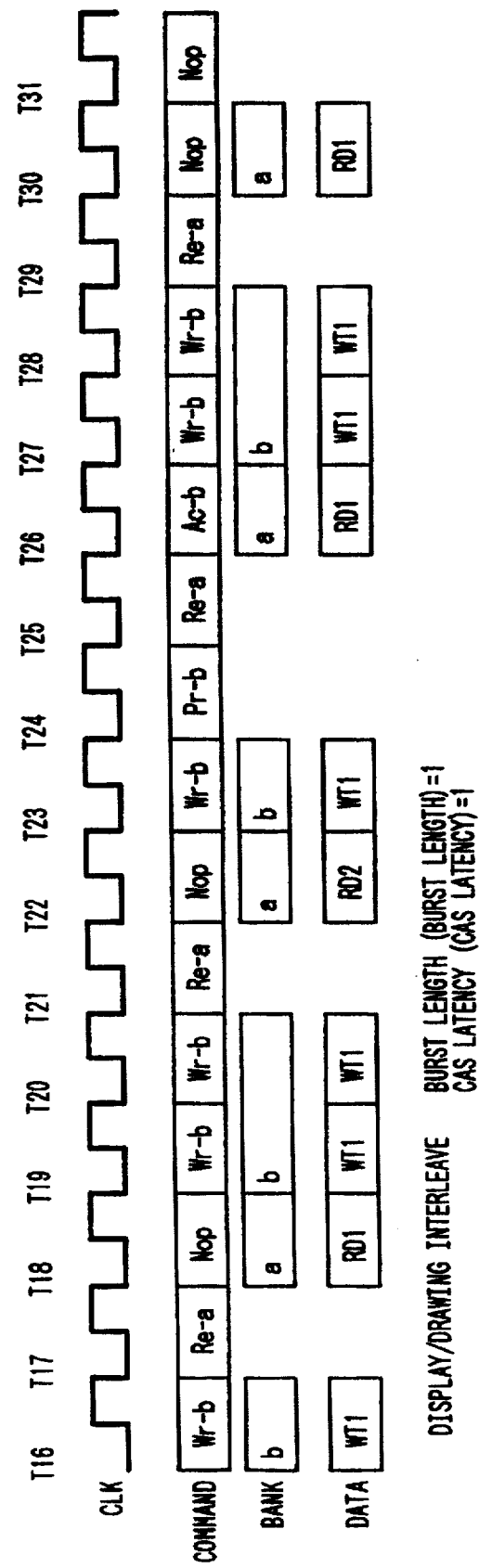
FIG. 13 is a timing chart illustrating the latter half succeeding that of FIG. 12.

FIGS. 12 and 13 show an example of the operations of the case in which the display processing module 13 has no means for temporarily storing the display data coming from the synchronous DRAM 22. At this time, there is adopted the method by which the display processing and the drawing processing are interleaved. In this case, the display data have to be read out in the cycle determined in conformity to the dot rate and are read one for the four cycles of the clock signal CLK. In order that the data may be read out once for the four cycles of the clock signal CLK, the memory banks of the display region and the drawing region are divided such that the memory banks of the display region and the drawing region are switched at the switching timing of the frames of the monitor 20, and the precharge S3 and the next row address activation S4 are executed preferentially of the drawing processing at the timing of switching the display row address. In the example of FIGS. 12 and 13, the bank A(a) is used as the display region whereas the memory bank B(b) is used as the drawing region. The precharge for the memory bank A(a) is executed at T3 (Pr-ab), and the row address is designated at T4 (Ac-a). The reading operation for the display, as shown, is executed for the same row address designated at T4. At this time, the drawing of the memory bank B(b) is executed at random by changing the row addresses selected at T14 (Pr-b) and T15 (Ac-b), at T24 (Pr-b) and T26 (Ac-b).

Figure 14:
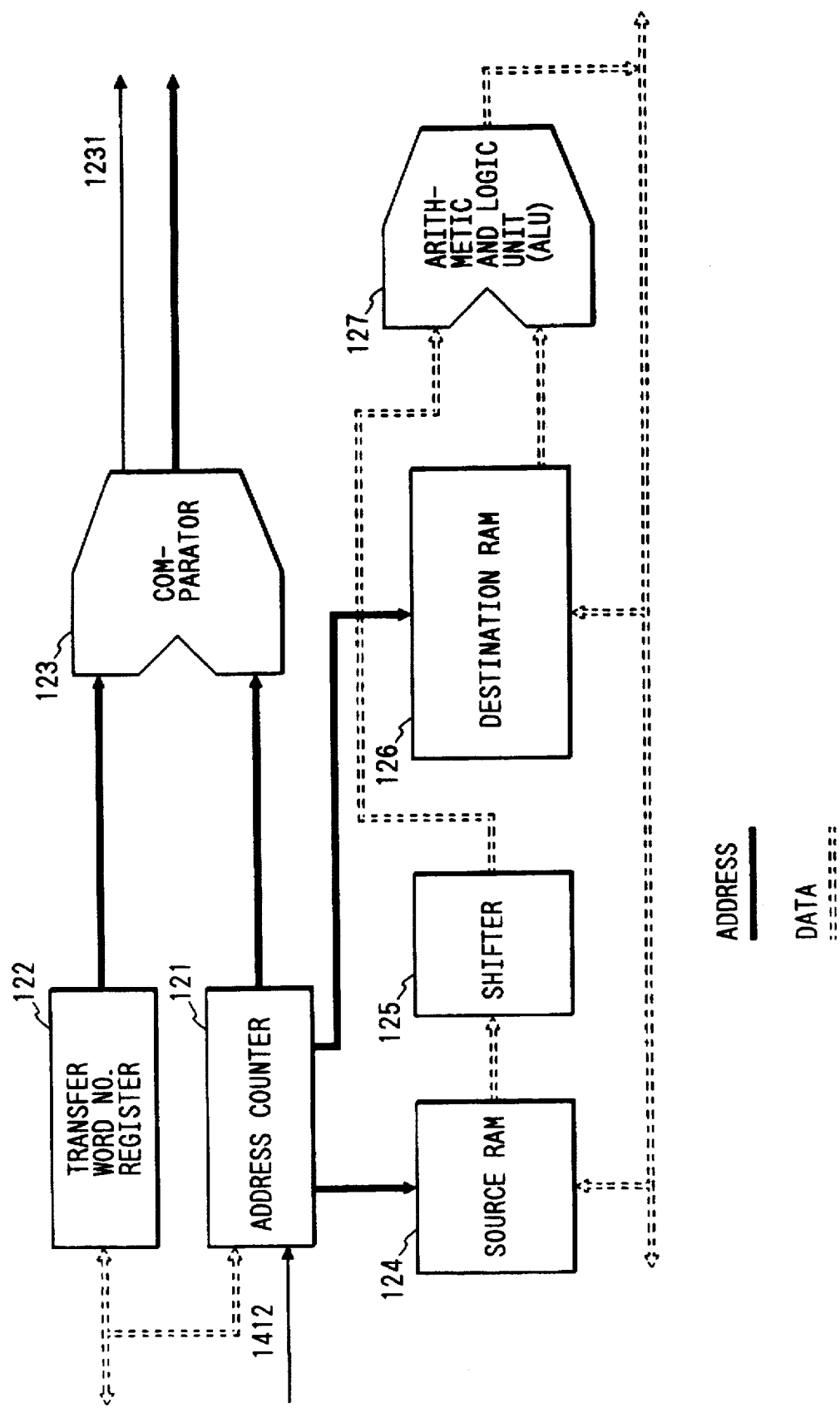
FIG. 14 is a block diagram showing one embodiment of the present invention for drawing controls by a bit block transfer.

FIG. 14 shows one embodiment of the BitBLT (i.e., Bit BLock Transfer) drawing processing system. The drawing processing module 12 is composed of a block for arithmetically operating the number of words of the addresses or data to be transferred according to the drawing algorithm, and a block for arithmetically operating the color of 1 dot, although not especially limitative thereto. The drawing processing of the BitBLT (i.e., Bit BLock Transfer) can be realized by repeating the arithmetic operations of one line of the X direction in the Y direction. In the arithmetic operations of one line in the X direction, the address counter 121 is reset at first to set the number of transfer words of the transfer source to a transfer word number register 122. The burst length is set to the full page, and the drawing processing module 12 outputs a transfer source initiating address to the bus control unit 14 to initiate the continuous reading operation. In response to the acknowledge signal 1412 from the bus control unit 14, an address counter 121 is incremented to store the transfer source data once in a source RAM 124. The value of the address counter 121 and the value of the transfer word number register 122 are compared by a comparator 128, which issues, if those values are coincident, the control information of the burst stop from the drawing processing module 12 to the bus control unit 14 in response to the interrupt signal 1231. In case the arithmetic operation with the underlying data is required for the drawing processing of the BiTBLT (i.e., Bit BLock Transfer), the underlying data are once stored like the transfer source data in advance in a destination RAM 126. At last, the transfer source data are registered in position by a shifter 125 and are arithmetically operated with the underlying data by an arithmetic and logic unit 127 so that the resultant data are continuously written again in the synchronous DRAM 22.

<Switch to ROM Access>

Figure 20:
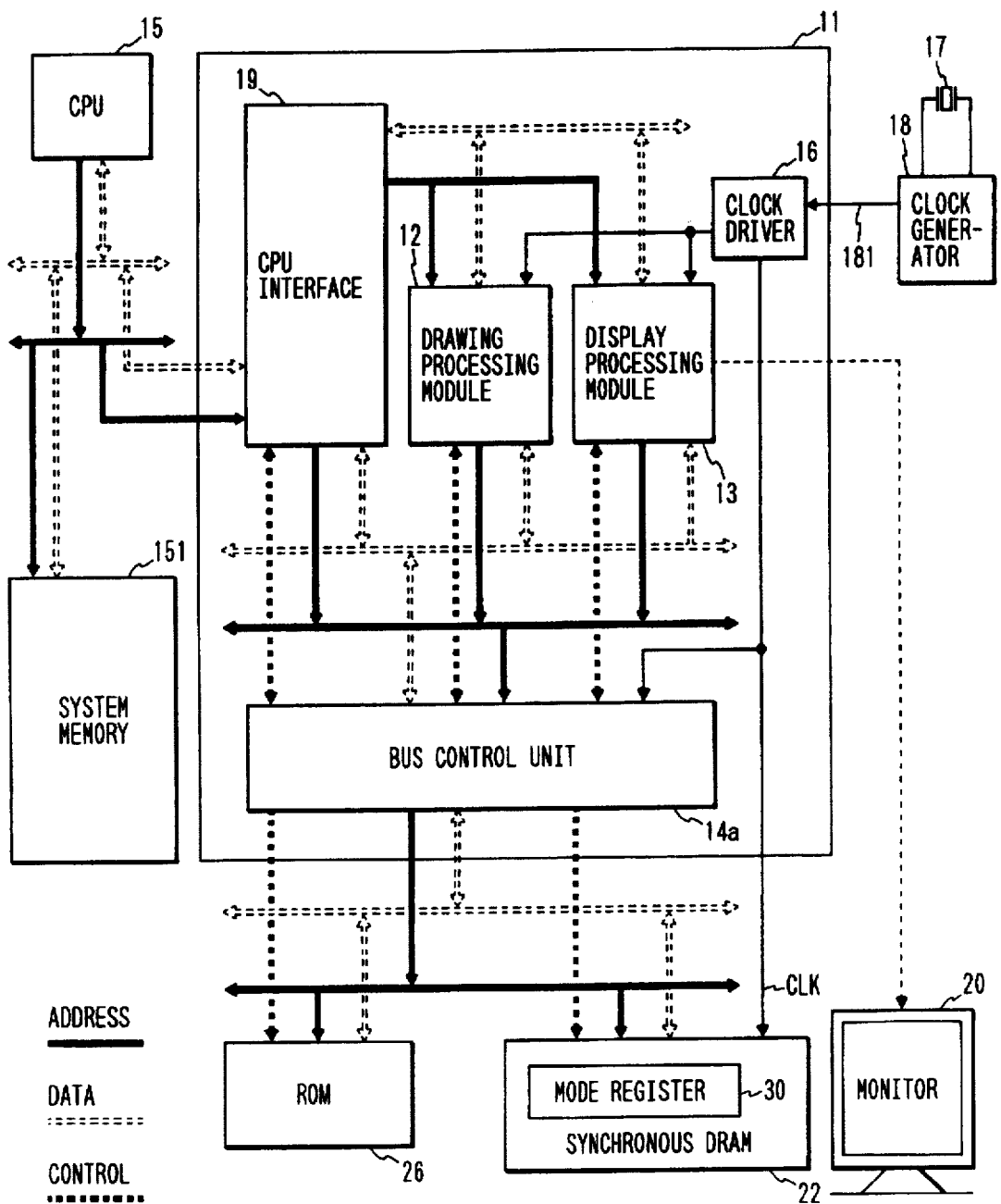
FIG. 20 is a block diagram showing an image processing system in which a ROM is connected with a data bus shared with the synchronous DRAM.
Figure 25:
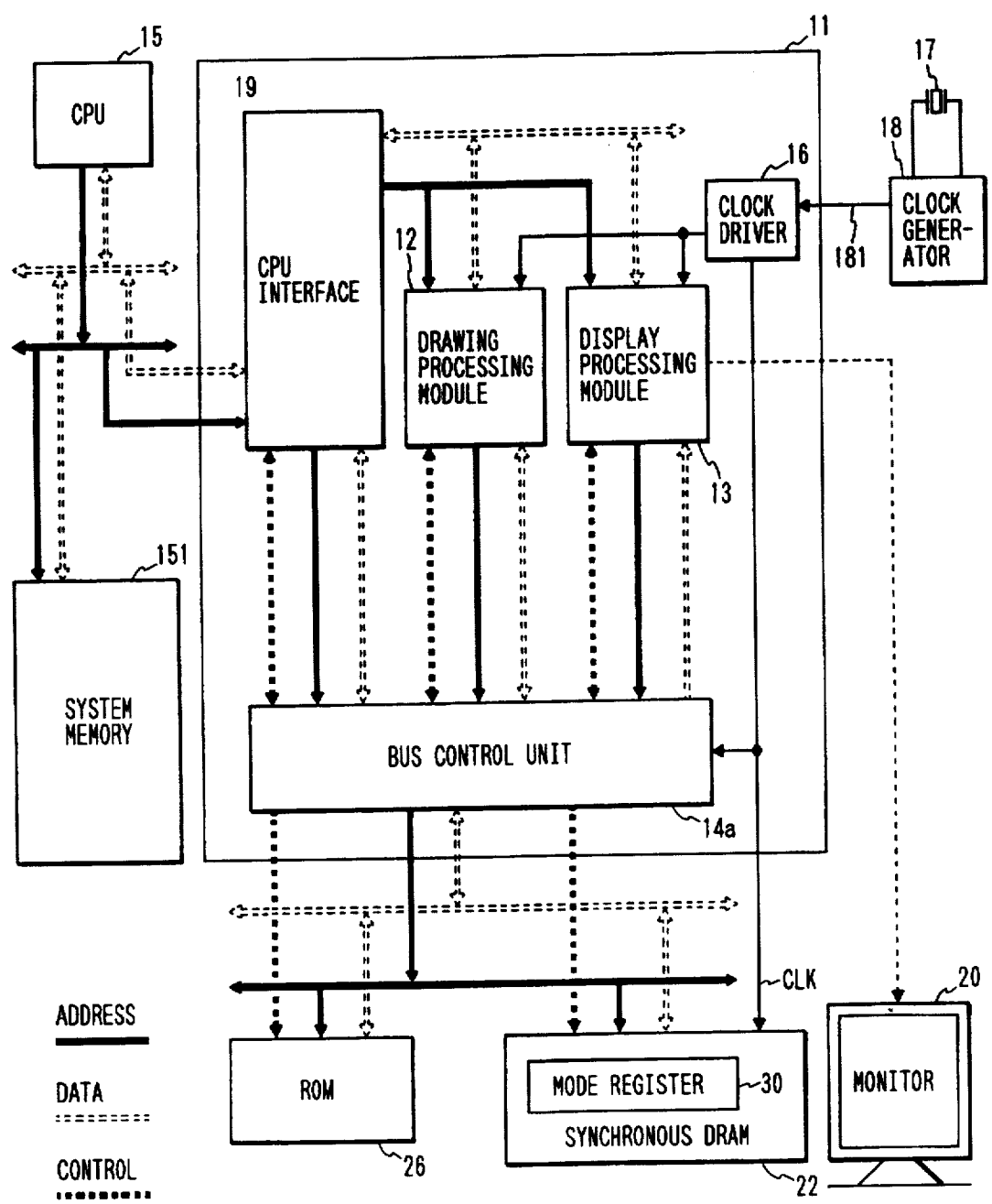
FIG. 25 is a block diagram showing an embodiment of the case in which an address bus or a data bus between modules and a bus control unit is used as a special purpose bus.

As shown in FIGS. 20 and 25, a bus control unit 14a can constitute a ROM (i.e., Read Only Memory) 26 as a lower-speed memory, together with the synchronous DRAM 22. According to FIG. 20, the ROM 26 is connected with the bus shared with the synchronous DRAM 22. The address space of the ROM 26 is mapped in the frame buffer address space, that is to say, the address decoder for generating a signal for selecting the address space is owned by the drawing display processor 11. In case the drawing processing module 12 has the address decoder, the access to the address space of the ROM 26 is informed to the bus control unit 14 in terms of the control information 1421. The sequencer 143 executes not only the read S6 from the idle S1 but also the NOP S2 till the data from the ROM 26 is fixed. The number of executions of the NOP S2 could be fixed to a value predetermined according to the operation speed of the ROM 26 but may desirably be designated by the special purpose register with a view to widening the space for selecting the adoptable ROM 26. In case, on the other hand, the address decoder is arranged in the bus control unit 14 as in the address decoder 1481 of FIG. 30, the output of the decoder is inputted directly to the sequencer 143 so that the ROM 26 has its access controlled. The number of insertions of the NOP S2 at this time could be designated by the aforementioned special purpose register.

The example of FIG. 25 is difference from that of FIG. 20 in that the modules 12 and 13 and the bus control unit 14 are connected by making use of special purpose buses. The connections by such special purpose buses can also be adopted in the embodiment having no ROM 26.

<Pipeline of Data Access>

The high-speed transfer equivalent to that of the SRAM of the prior art cannot always be realized by using the synchronous DRAM 22. Specifically, the condition for the high-speed transfer is limited within the same row address, and in the (mishit) case of shifting to another row address, a mishit processing is necessary for issuing the precharge command or the row address activation command (or the row address strobe-bank active command). As the mapping of the physical memory addresses for the logical pixel coordinates of the frame buffer, therefore, there is adopted an arrangement in which another row address mapped in another region adjacent to the region of the same row address never fails to have a row address of different memory bank. In case, therefore, the burst length is set to N (N>1), the precharge command and the row address strobe-bank active command can be issued to the memory bank different from that being accessed, while the present data are being accessed to the synchronous DRAM 22, as is apparent from the foregoing description of the timing charts of FIGS. 7 to 13, so that the bus throughput can be improved. The drawing processing module 12, the display processing module 13 or the bus control unit 14 is equipped therein with means for arithmetically operating the addresses in advance and means (i.e., the mist hit detector 147) for deciding the switching of the row addresses, so that the precharge command and the row address activation command and then the row addresses are issued by the sequencer 143 in the bus control unit 14 when the change in the row addresses is detected. As a result, it is possible to read and write the data at every 10 nano sec. at the maximum.

Figure 15:
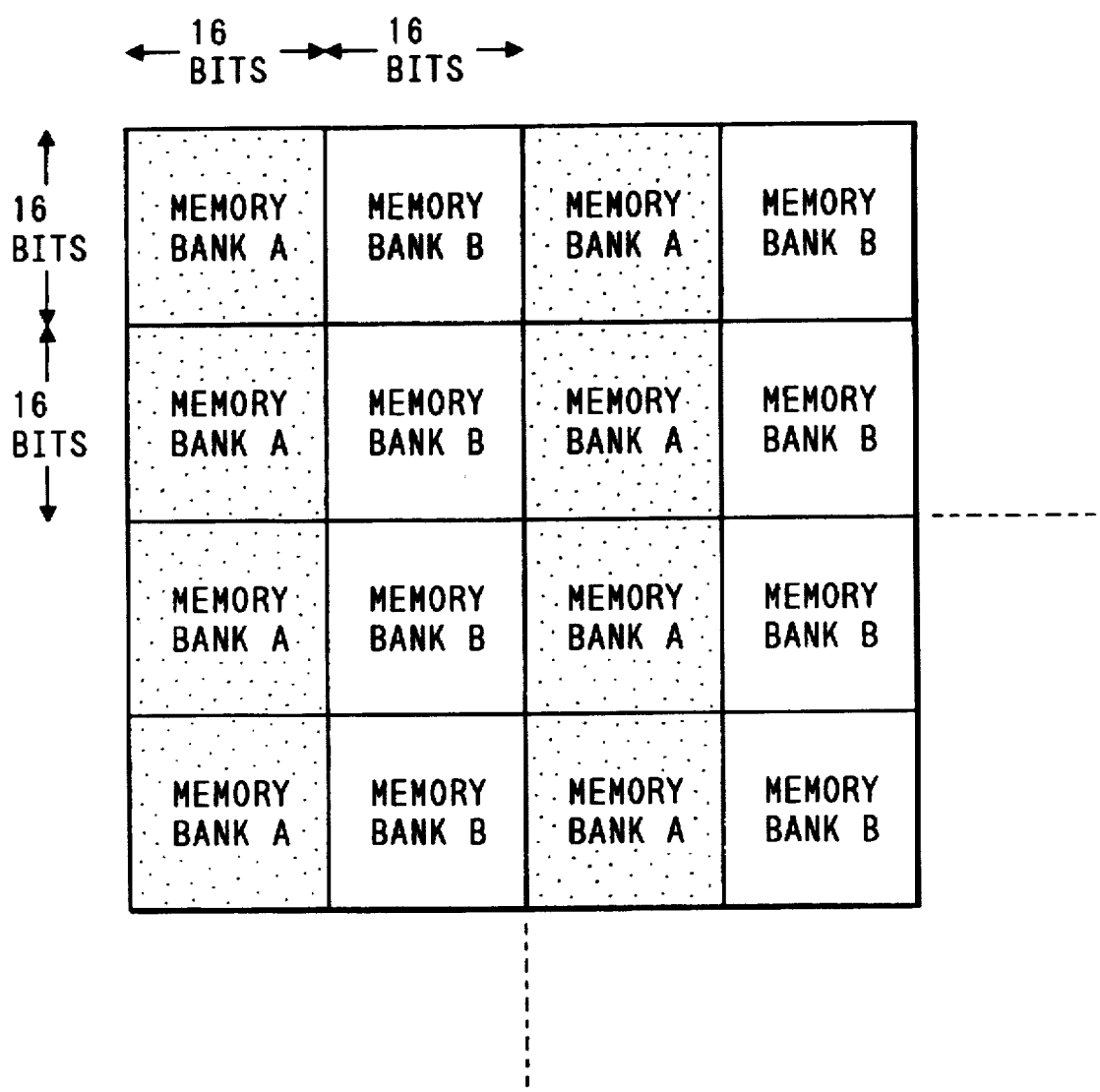
FIG. 15 is a mapping diagram showing one example of physical memory addresses and logical coordinates in the system of the present embodiment.
Figure 16:
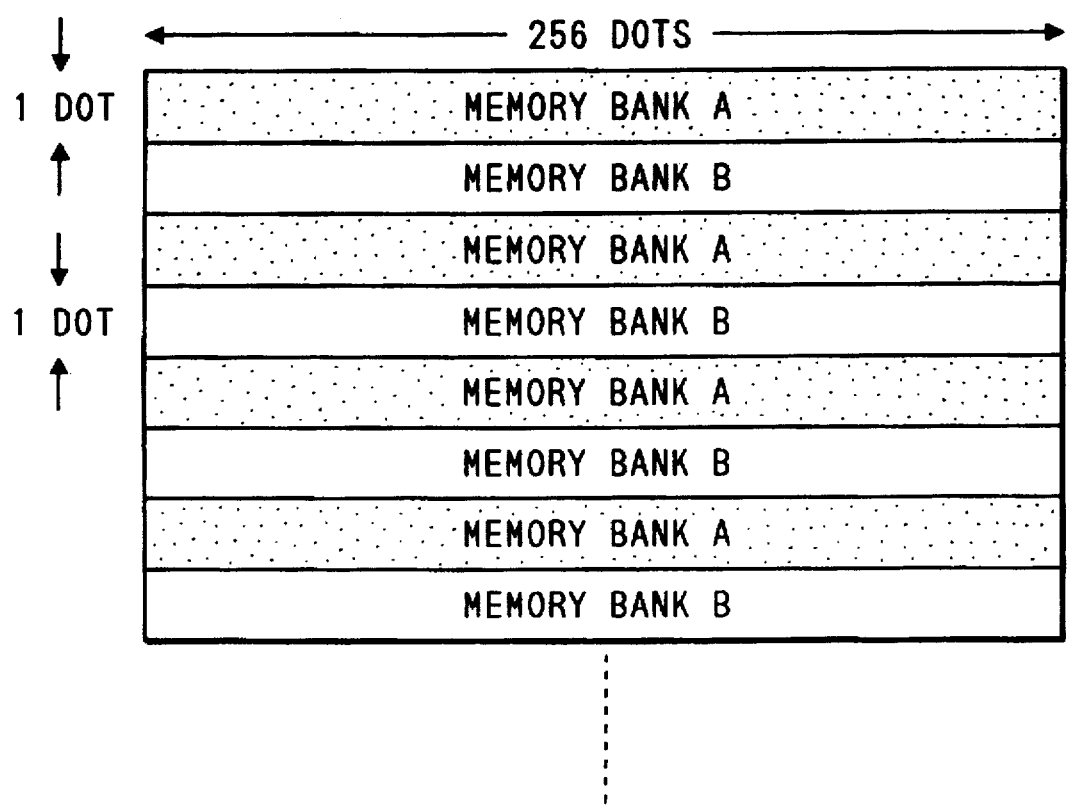
FIG. 16 is a mapping diagram showing another example of the physical memory addresses and logical coordinates in the system of the present embodiment.
Figure 17:
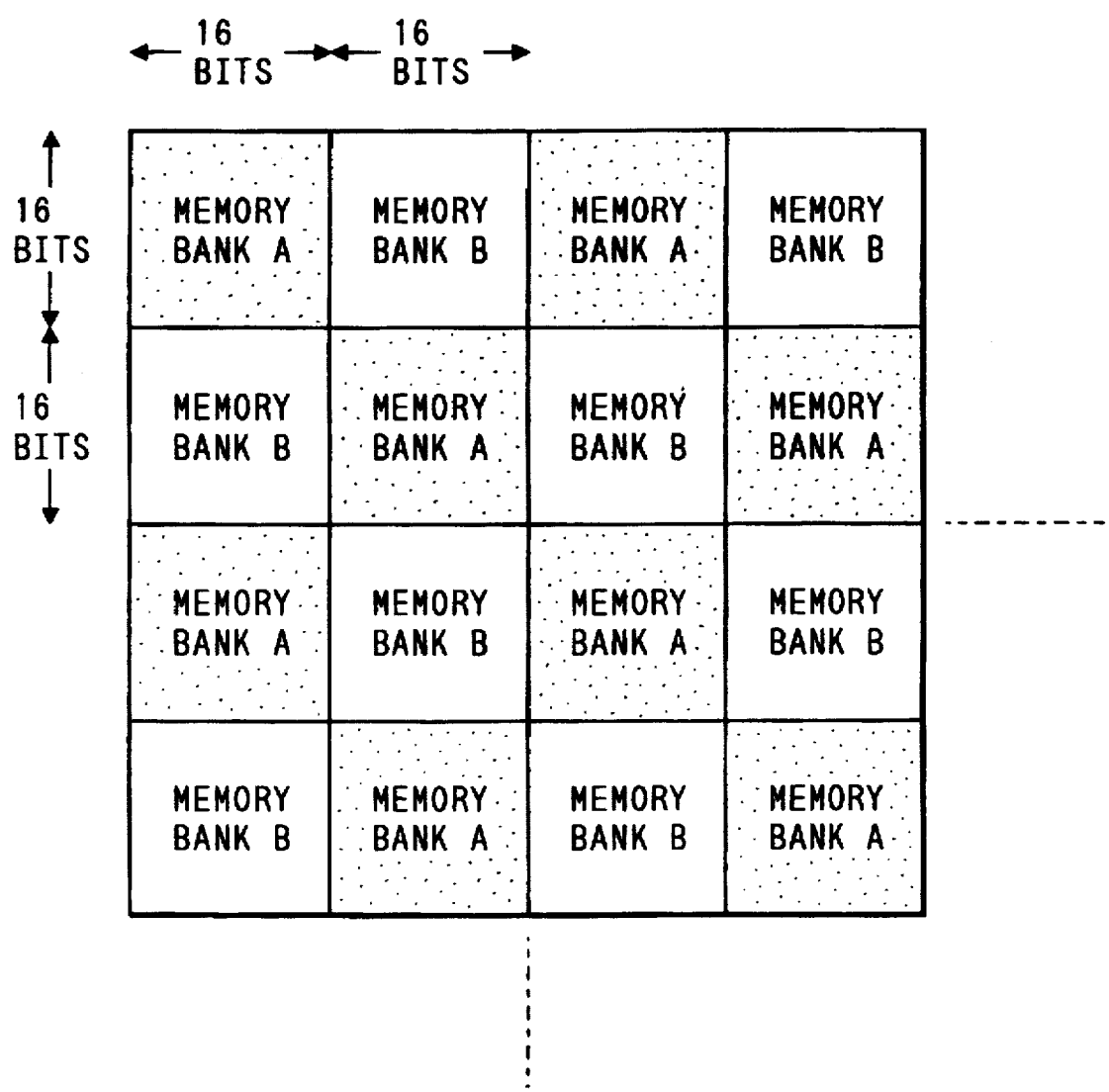
FIG. 17 is a mapping diagram showing still another example of the physical memory addresses and logical coordinates in the system of the present embodiment.

FIGS. 15 to 17 illustrate examples of the mapping (on the display frame) of the physical memory addresses and the logical coordinates of the synchronous DRAM 22 in the system of the present embodiment. In other words, there are illustrated the data arrangements of the individual row addresses in the bit map coordinate regions of the frame buffer. In the present embodiment, the same row address in the synchronous DRAM 22 corresponds to the pixel data of 256 bits. In the individual Figures, the region having a length of 16 dots and a width of 16 dots and the region having a length of 1 dot and a width of 256 dots are regions of pixel data corresponding to one row address. FIG. 15 illustrates a mapping in which the widthwise adjoining rectangular regions of 16 dots×16 dots of the same row address have different memory banks. FIG. 16 illustrates a mapping in which the lengthwise adjoining rectangular regions of 1 dot×256 dots of the same row address have different memory banks. FIG. 17 illustrates a mapping in which the lengthwise and widthwise adjoining rectangular regions of 16 bits×16 bits of the same row address have different memory banks. In the mapping of FIG. 15, the memory banks to be accessed can be alternately switched even in the drawing processing to be proceeded widthwise and obliquely on the bit map coordinates so that the processing throughput can be improved by executing the processing such as the precharge of one memory bank while the other memory bank is being read or written. The mapping of FIG. 17 imagines the optimum mapping in case the accesses to the frame buffer are concentrated longitudinally and transversely. In the mapping of FIG. 16, the memory banks to be accessed are alternately switched in the processing in which the drawing or display is transversely proceeded on the bit map coordinates. As a result, the throughput of the processing can be improved by executing the processing such as the precharge of one memory bank while the other memory bank is being read or written. The mapping of FIG. 16 corresponds to the case in which the disadvantage is eliminated by changing the scan addresses in one direction as by clearing the rectangular regions.

In the mappings of FIGS. 15 and 17, for example, in case the memory accessing is executed in the transfer direction of the frame buffer arrangement, the accessing mode at the boundary between the memory banks A and B is that at T24 of FIG. 7. In FIG. 16, on the other hand, the mode of the memory accesses of transverse 256 dots correspond to the access timings of FIGS. 8 and 9.

<Prevention of Disturbances of Pipeline Accompanying Mishit Processing>

The mishit processing for better improving the throughput of the data processing to be executed by accessing the synchronous DRAM will be described with reference to another embodiment. In the following description, the embodiments will be described in connection with a data processor according to another embodiment of the present invention and a facsimile image processing system to which is applied the data processor.

Figure 33:
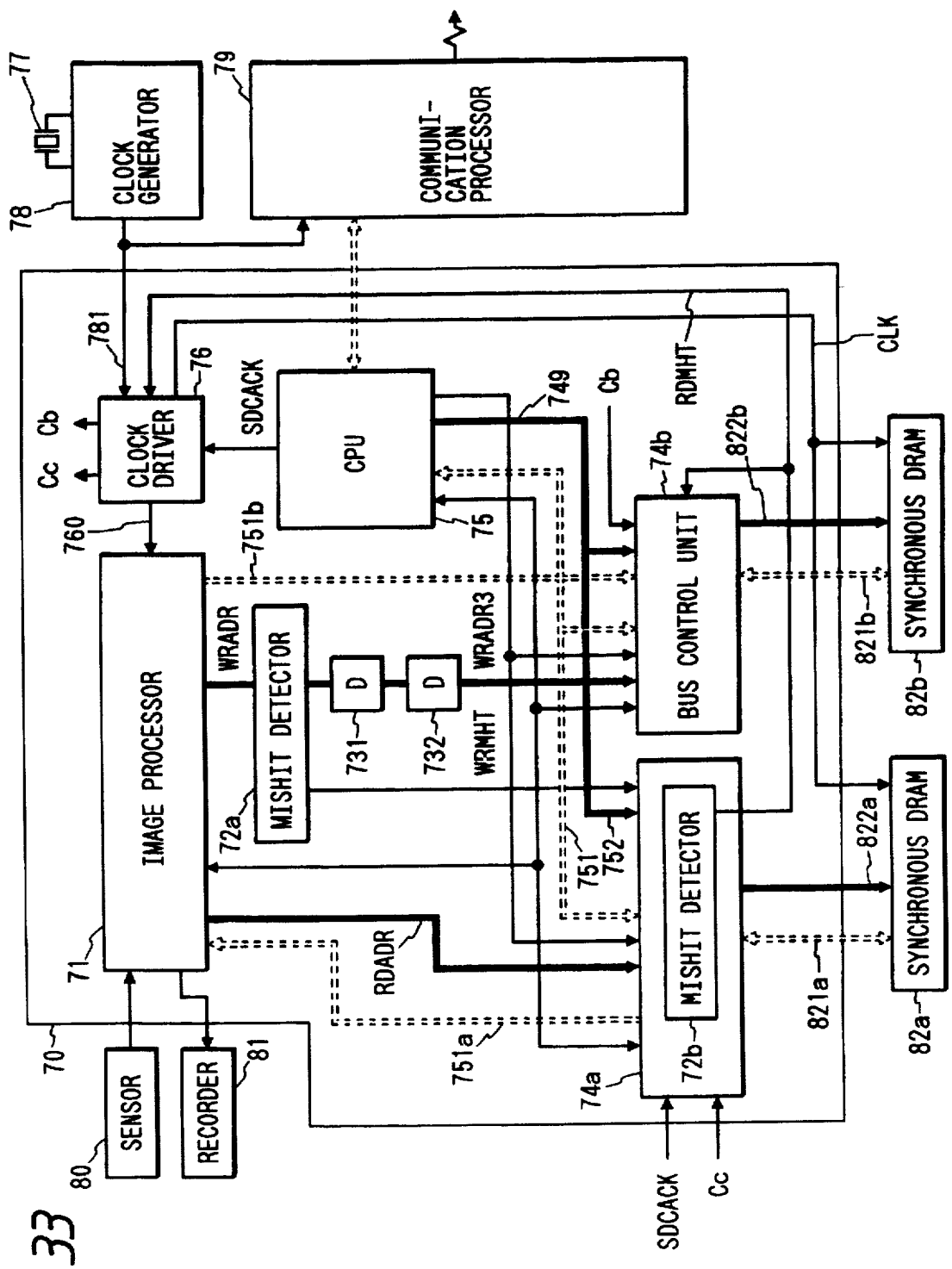
FIG. 33 is a block diagram showing one example of an image processing system equipped with a data processor in accordance with another embodiment of the present invention.

FIG. 33 is a block diagram showing one example of the image processing system which is equipped with a data processor 70 according to another embodiment of the present invention. In FIG. 33, a sensor 80 reads out the optical density information of a document and outputs the photoelectrically converted information as image data. The sensor 80 is frequently exemplified in the present facsimile by a CCD line sensor, but a contact sensor begins to be used, and an area sensor will be used. An image processor 71 not only eliminates a distortion contained in the image data but also improves the image quality and performs the encoding. In the present embodiment, there are provided two synchronous DRAMs 82a and 82b. These synchronous DRAMs 82a and 82b are used as the line memories for reading and writing the data at a high speed and as the code page buffers for storing the image-processed and encoded data so that they may be sent through a communication processor 79. The two synchronous DRAMs 82a and 82b are individually interfaced with intrinsic but control units 74a and 74b so that they can be accessed in parallel. A CPU 75 administers the controls of the entire system and stores the image-processed and encoded data in the aforementioned page buffer regions of the synchronous DRAMs 82a and 82b to send and control them through the communication processor 79. The communication processor 79 executes the connection with the reception side facsimile and the procedure of the communication protocol and converts the data from the CPU 75 to transmit them through the channel. A clock generator 78 generates a fundamental clock 781 on the basis of the standard frequency of a quartz oscillator 77 and feeds it to the image processor 71, the CPU 75 and the communication processor 79. The receptions follow the course reversed from that of the transmissions, i.e., through the communication processor 79, the CPU 75 and the image processor 71 so that the data are stored in a recorder 81. This recorder 81 is exemplified by a thermal head or an ink jet, or a laser printer using the electrophotographic technology.

The synchronous DRAMs 82a and 82b are such memories as can input/output the data, addresses and control signals, unlike the DRAM of the prior art, in synchronism with the clock so that they can realize a high-speed transfer equivalent to that of the SRAM of the prior art and a higher capacity than that of the DRAM of the prior art at a low cost. In short, by using the synchronous DRAMs, the bus speed of the memory can be improved to integrate the image processing SRAM and the page buffer DRAM. It should be understood here that the synchronous DRAMs 82a and 82b have a circuit construction similar to that which has been described with reference to FIG. 2. Moreover, the clock signal CLK for the synchronous DRAMs 82a and 82b is outputted from the data processor 70 as in the foregoing embodiment.

In FIG. 33, the image processor 71 executes the distortion correction, the image quality improvement and the encoding processing of the image data read from the sensor 80. These processings are realized such that the bus control unit 74a is caused to read the synchronous DRAM 82a by using a read address RDADR to output data 821a, such that the resultant data 751a are fetched by the image processor 71, and such that the image processor 71 the fetched data 751a graphically to write the processed data 751b in the synchronous DRAM 82b by using the write address WRADR.

Here, the processings of reading the data from the aforementioned synchronous DRAM 82a, correcting the read data in the image processor 71 and writing the result in the synchronous DRAM 82b are repeated for the entire display data and in synchronism with the operation clock of the image processor 71 sequentially at the unit of a plurality of processing steps. The image processing pipeline is a processing method, in which a plurality of unit image processings of such processing steps are executed in parallel and with a displacement of processing steps so that a unit of image processing may be apparently executed in a cycle time of one processing step. According to the present embodiment, the image processor 71 outputs in parallel the read address RDADR for some data and the write address WRADR of the data processed from the read data. At this time, the data processing time period till the processed read data can be written is retained by the address transmission delay time which is prepared by two-stage latches 731 and 732 in FIG. 33. Thus, when the read address RDADR and the write address WRADR are outputted in parallel from the image processor 71, the data read out by the read address RDADR are not processed and written till the address signal WRADR3 is effected after the delay time for the write address WRADR to pass through the latch circuits 731 and 732.

When the image processor 71 is constructed to make the pipeline processing possible, a queuing is required to interrupt the clock partially, unless the time period after the read data are fetched and after the processed data are written is constant, and the queuing requires a complicated processing in the timing. When the image processing pipeline is realized by reading the data sequentially from the synchronous DRAM 82a and by writing the data processed results sequentially in the synchronous DRAM 82b, the pipeline collapses to break the data partially if a mishit occurs in either the reading or writing operation of the synchronous DRAM. Thus, if a mishit occurs, the data have to be latched by interrupting the image processing operation temporarily to hold the data in the pipeline. Since, moreover, this interruption is required no matter which side of the reading or writing side the mishit might occur, the mishit decisions are executed simultaneously at both the writing and reading sides. According to the present embodiment, if the mishit of the row address is not found out before the data writing of the final stage in a series of processing flows of issuing a reading address to the synchronous DRAM 82a, reading the data, processing the data, issuing the write address to the synchronous DRAM 82b and writing the data in the synchronous DRAM 82b, the data to be subsequently processed have already been sequentially read out. If the write mishit processing is inserted at that stage, the pipeline is disturbed so that its repair requires a complicated processing.

In the present embodiment of FIG. 33, therefore, the read address RDADR and the write address WRADR are subjected to the mishit detection. The mishit detector 72b of the read address RDADR is arranged in the bus control unit 74a, but the mishit detector 72a of the write address WRADR is arranged at the front stage of the latch circuit 731 so that whether or not the write address WRADR3 has made a mishit is detected at the time of issuing the read address RDADR. Specifically, the write address WRADR is turned through the mishit detector 72a and the latches 731 and 732 into the internal address WRADR3, which is connected with the bus control unit 74b. The latches 731 and 732 warrants the processing delay time period till the write data are prepared by processing and treating the data read out by the read address RDADR. The bus control units 74a and 74b are individually connected through the independent address buses, data buses and control buses with the synchronous DRAMs 82a and 82b. In the present embodiment, the mishit information generated by the write address is reflected by referring it in advance at the mishit treating time of the read address. In other words, the mishit state with the write address WRADR3 is detected with the write address WRADR at the time of issuing the read address RDADR so that the mishit with the write address WRADR3 is treated as when the read address RDADR makes a mishit. According to the present embodiment, a mishit signal WRMHT detected by the mishit detector 72a is fed to the bus control unit 74a, which feeds a mishit signal RDMHT to a clock driver 76 to interrupt the feed of a clock signal 760 to the image processor 71 for a predetermined time period. This interrupt time period is provided for precharging and row address activation for the synchronous DRAM responding to the mishit. In case the mishit is detected by the read address RDADR, the mishit signal RDMHT is directly fed to the clock driver 76 for similar operations. By this synchronization of mishits, the processings of in the valid data accompanying the mishits can be unified to simplify the image processing pipeline. In short, the disturbance of the image processing pipeline can be minimized. Incidentally, for simplicity, all the clock signal 760 from the clock driver 76 to the image processor 71 is entirely interrupted, as shown. However, the interruption may be limited to the pipeline retention of the image processor 71 or to some phase if the clock system uses the non-overlap multi-phase clocks.

Figure 35:
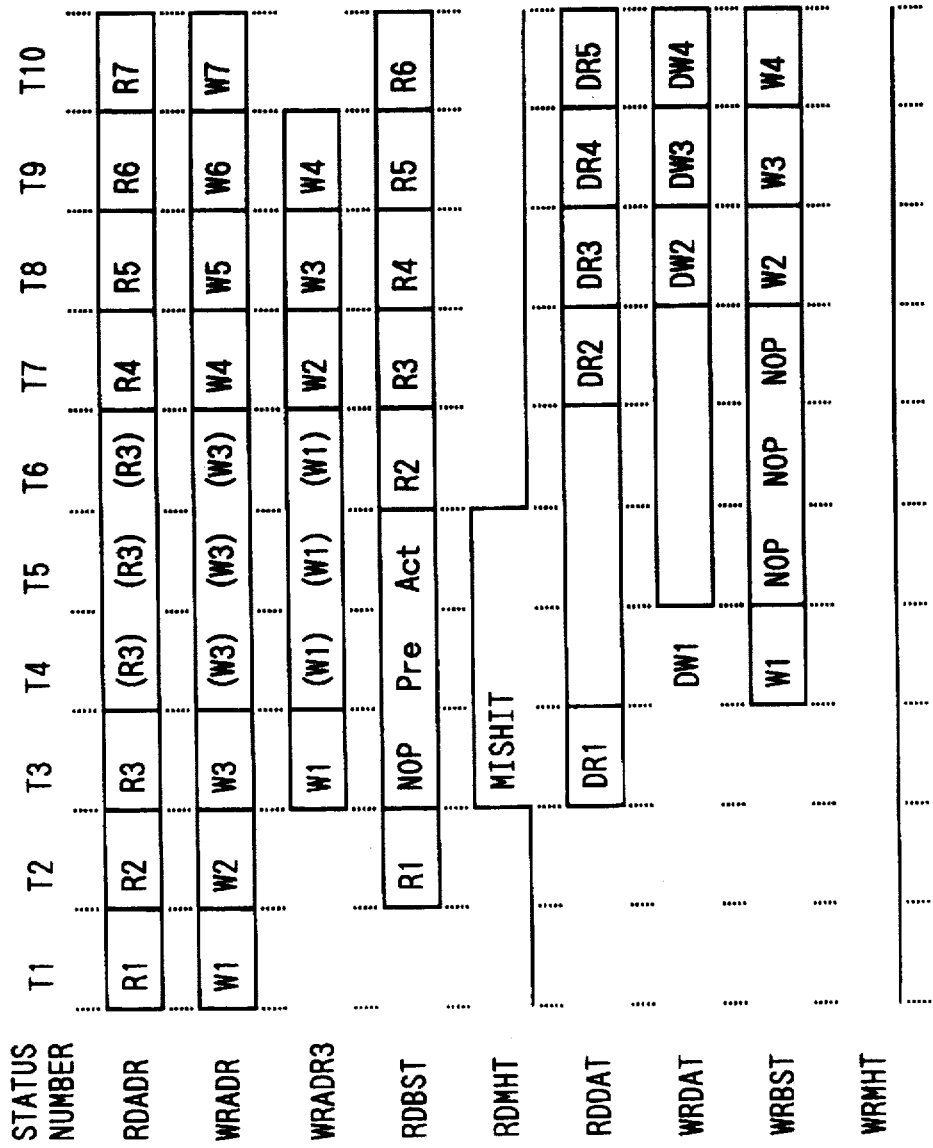
FIG. 35 is an operation timing chart illustrating one example of the case in which a mishit occurs at a reading time in the course of a pipeline processing in the system of FIG. 33.

FIG. 35 is a timing chart illustrating one example of the case in which a mishit occurs at the reading time during the pipeline processing of the system of FIG. 33. The read address RDADR issued at T1 from the image processor 71 is sent to the bus control unit 74a, which changes the status RDBST of the sequencer included therein into a first data read R1 at T2. As a result, data DR1 are outputted at T3 from the synchronous DRAM 82a. The data DR are processed into write data DW1 by the image processor 71. The write address WRADR is delayed into the internal write address WRADR3 by the latch circuits 731 and 732 acting as the delay means, and status WRBST of the sequencer of the bus control unit 74b is changed at T4 into a first data write W1, so that the data DW1 are written in the synchronous DRAM 82b. In case, at this time, the row address of the read address RDADR to be subsequently read is different from the row address at R1, there is required the mishit processing in which the row address is precharged and activated again. When the row address R2 is issued as the read address RDADR at T2 from the image processor 71, it is compared with the row address R1 in the mishit detector 72b of the bus control unit 74a. If it is decided that the two row addresses are different, a mishit signal RDMHT is issued. As a result, the clock driver 76 interrupts the feed of the clock signal 760, the operation of the image processor 71 and updatings of the addresses RDADR, WRADR3 and WRADR for the time period T4 to T6, so that the addresses before interrupted are retained for the time period T4 to T6. In this meanwhile, the bus control unit 74a treats the mishits by issuing the individual commands for the precharge (Pre) and the row address activation (Act) corresponding to the R2 to the synchronous DRAM 82a. While the mishit processings are being executed, no data is read out, and the effective write data correspondingly become short so that the write bus control unit 74b is held idle for the time period of T5 to T7 in response to the mishit signal RDMHT.

Figure 36:
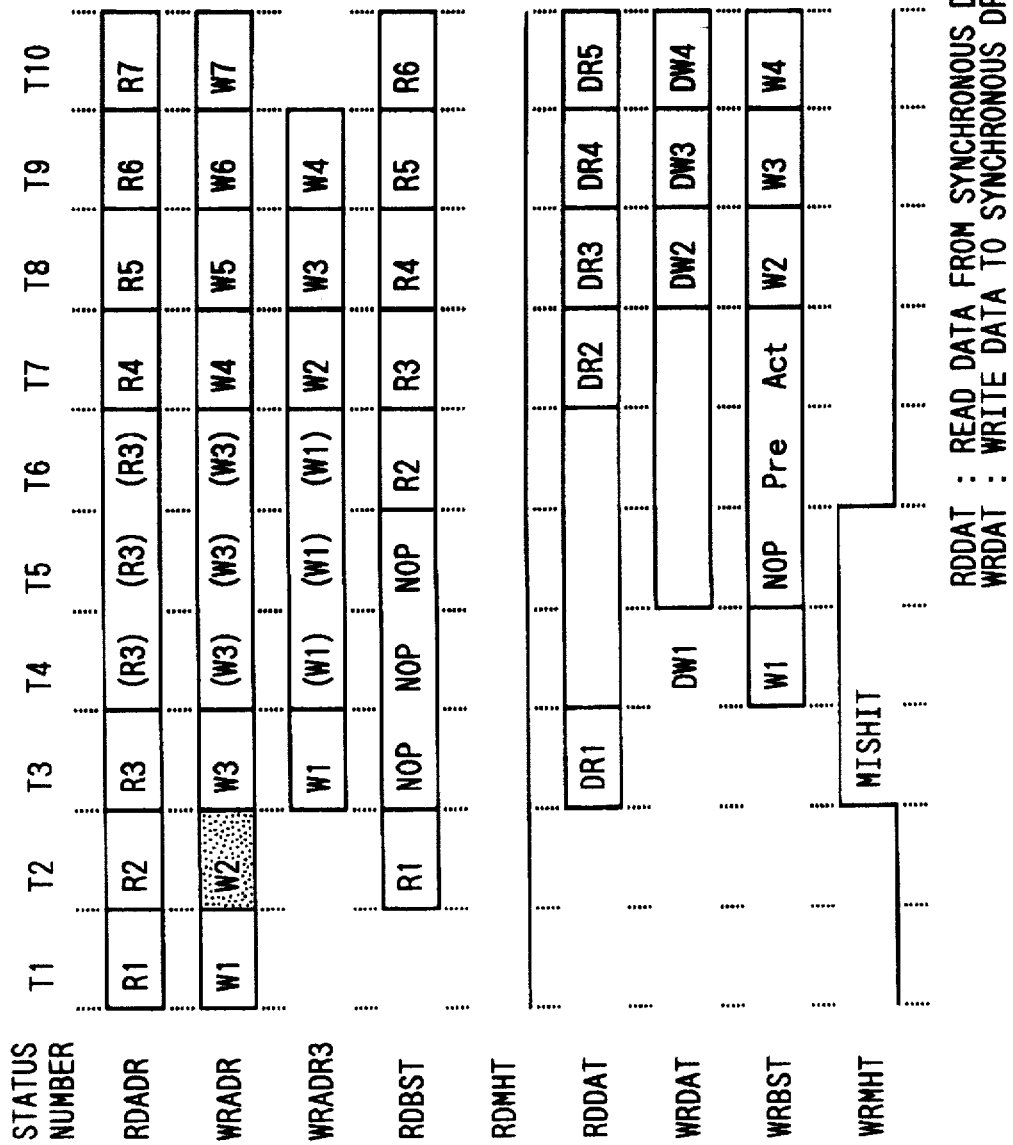
FIG. 36 is an operation timing chart illustrating one example of the case in which a mishit occurs at a writing time in the system of FIG. 33.

FIG. 36 is a timing chart illustrating one example of the case in which a mishit occurs at the writing time. Here is assumed the case in which the write address WRADR issued at T2 from the image processor 71 makes a mishit. If the mishit of the write address WRADR3 is detected in the bus control unit 74b, it is found out at the T4 state. Even if the updating of the address is interrupted at the T5 state, the data or write address corresponding to another read address has already been issued before that interruption, so that the information disappears during the mishit processing. In the present embodiment, the mishit detection of the write address WRADR is made at the same timing as that of the read address RDADR. If the write mishit is detected, the data or addresses can be prevented from disappearing during the time period of treating the write mishit by making the image processing and the address updating idle from the reading time.

The flow of the pipeline of the case, in which a mishit occurs at the write address W2 in FIG. 36, and the flow of the pipeline of the case, in which a mishit occurs at the read address R2 in FIG. 35, are made identical to each other. In the state T1 to the state T10 representatively shown in FIGS. 35 and 36, more specifically, the outputting states of the read address RDADR and the write address WRADR outputted from the image processor 71 cannot be disturbed to hold a predetermined sequence, even if a write mishit or a read mishit occurs in the meanwhile. In other words, even if the mishit processing is interposed between the reading and writing times of the synchronous DRAMs 82a and 82b, the disturbance of the pipeline of the image processing in 1 state and 1 cycle can be completely prevented.

<Competition between Mishit Processing and Interruption>

The synchronous DRAMs 82a and 82b can be accessed not only from the image processor 71 but also the CPU 75. This is because the synchronous DRAMs 82a and 82b are adapted to store not only the commands and parameters of the image processor 71. When the CPU 75 accesses the synchronous DRAMs 82a and 82b, it interrupts the processing the image processor 71 as in the case of a mishit and executes the mishit processing so that it issues an interrupt demand signal SDCACK to the clock drive bus 76 and the bus control unit 74a. It is assumed that the interrupt demand signal SDCACK is held at an active level such as the low level for the interrupt period, although not especially limitative thereto. In response to the interrupt demand signal SDCACK, the clock driver 76 interrupts the feed of the clock signal 760 to the image processor 71. The feed interrupt period of the clock signal 760 at this time can be set to an arbitrary period till the interrupt demand signal SDCACK is negated to an inactive level such as the high level. Moreover, the mishit processing at the interrupt time is uniquely effected by changing the access subject for the synchronous DRAMs 82a and 82b into the CPU 75, and a mishit is forcibly issued in response to the output of a circuit for detecting the level change to the active level of the interrupt demand signal SDCACK to produce a one-shot pulse. When the interruption of the CPU 75 is ended, the image processor 71 reopens its operation, but the mishit signal detected in the mishit detector 72a cannot warrant the correct operation while the image processor 71 is being interrupted. As a result, when the image processor 71 is operated again after the end of the interruption of the CPU 75, the mishit is forcibly produced in response to the output of the circuit for detecting the level change to the inactive level of the interrupt demand signal SDCACK to produce the one-shot pulse, as described above.

<Detailed Example of Internal Circuit>

Figure 39:
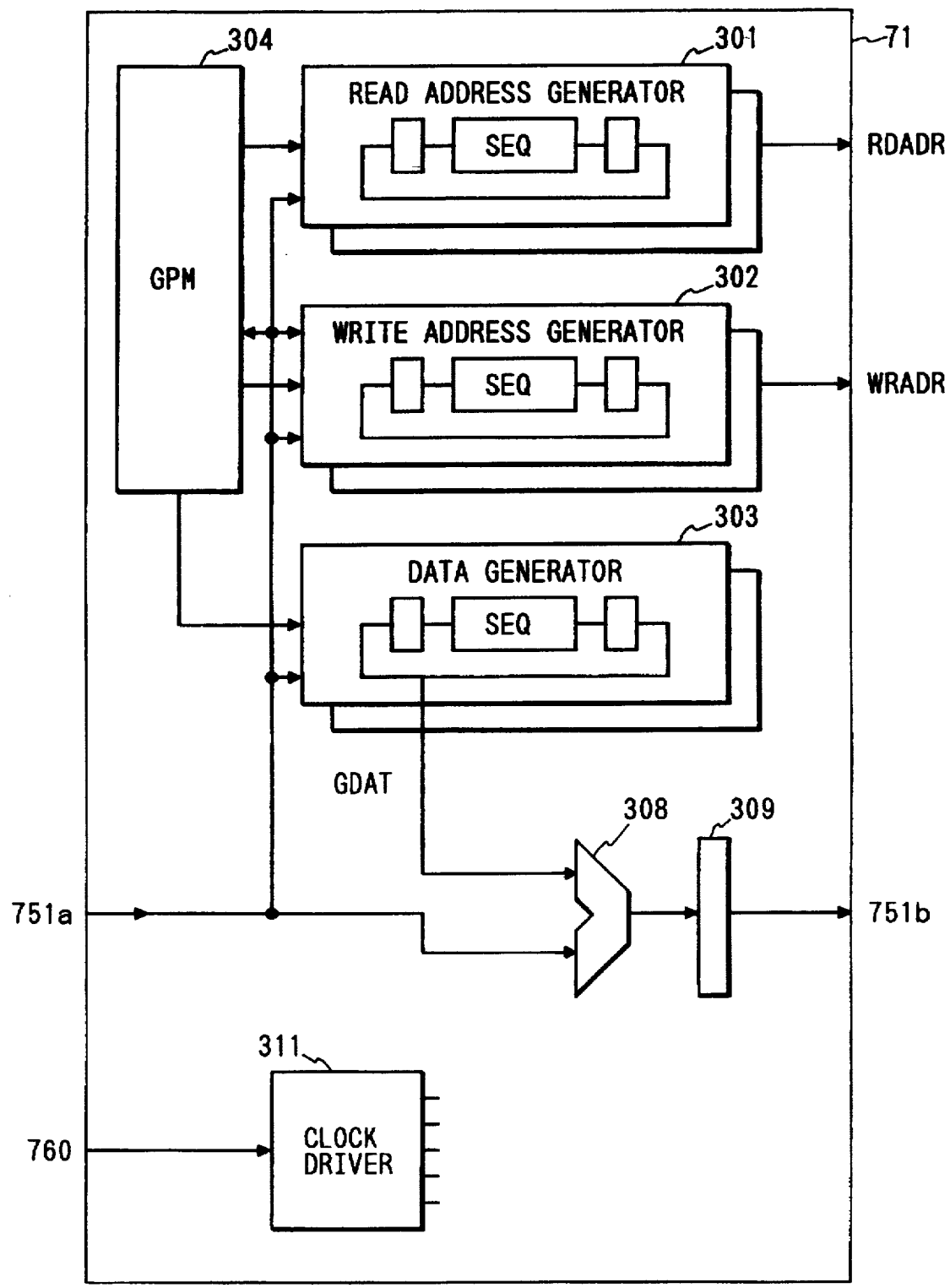
FIG. 39 is a block diagram showing one example showing an image processor in the data processor of FIG. 33.

FIG. 39 is a block diagram showing one example of the image processor 71. A graphic pipeline manager GPM reads commands from the synchronous DRAM 82a and sets parameters in a read address generator 301, a write address generator 302 and a data generator 303 to start them. These read address generator 301, write address generator 302 and data generator 303 are equipped therein with sequencers SEQ to generate the read address RDADR, the write address WRADR and data GDAT, respectively. The input data 751a is synthesized with the data GDAT generated in the data generator 303, by an arithmetic and logic unit 308 and is processed to the output data 751b through a timing adjusting latch 309. The clock signal 760 fed from the clock driver 76 is distributed into the individual portions of the internal circuit by a clock driver 311 so that the individual internal circuits are synchronized with the distributed clock signals. As a result, the operations of the image processor 71 are interrupted when the feed of the clock signal 760 is interrupted.

Figure 40:
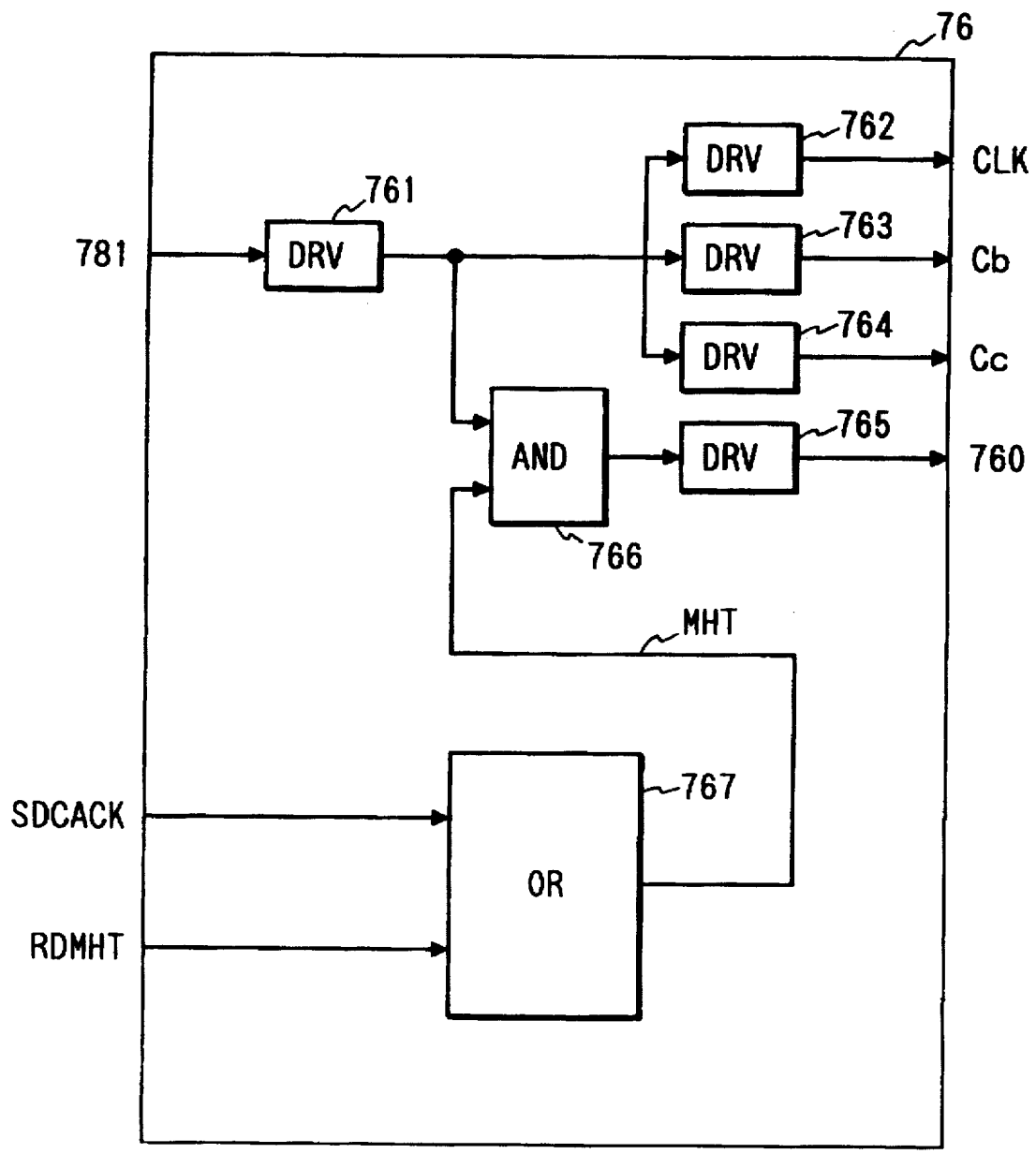
FIG. 40 shows one example of a clock driver in the data processor of FIG. 33.

FIG. 40 shows one example of the clock driver 76. A clock signal 781 inputted from the clock generator 78 drives a driver (DRV) 761 and is distributed into drivers (DRV) 762, 763 and 764. The output of the driver 762 is the clock signal CLK to the synchronous DRAMs 82a and 82b. A logic sum gate (OR) 767 outputs an OR signal MHT of the aforementioned interrupt signal SDCACK and mishit signal RDMHT, i.e., the individual enable signals. A logic product gate (AND) 766 receives the output clock signal of the aforementioned driver 761 and the output of the OR gate 767 and feeds their AND signal to a driver (DRV) 765 to produce the aforementioned clock signal 760. As a result, the output of the AND gate 766 is fixed to the low level by the mishit or the CPU interruption to interrupt the feed of the clock signal 760 to the image processor 71. Clock signals Cb and Cc are the operation standard clock signals to be fed to the bus control units 74a and 74b.

Figure 41:
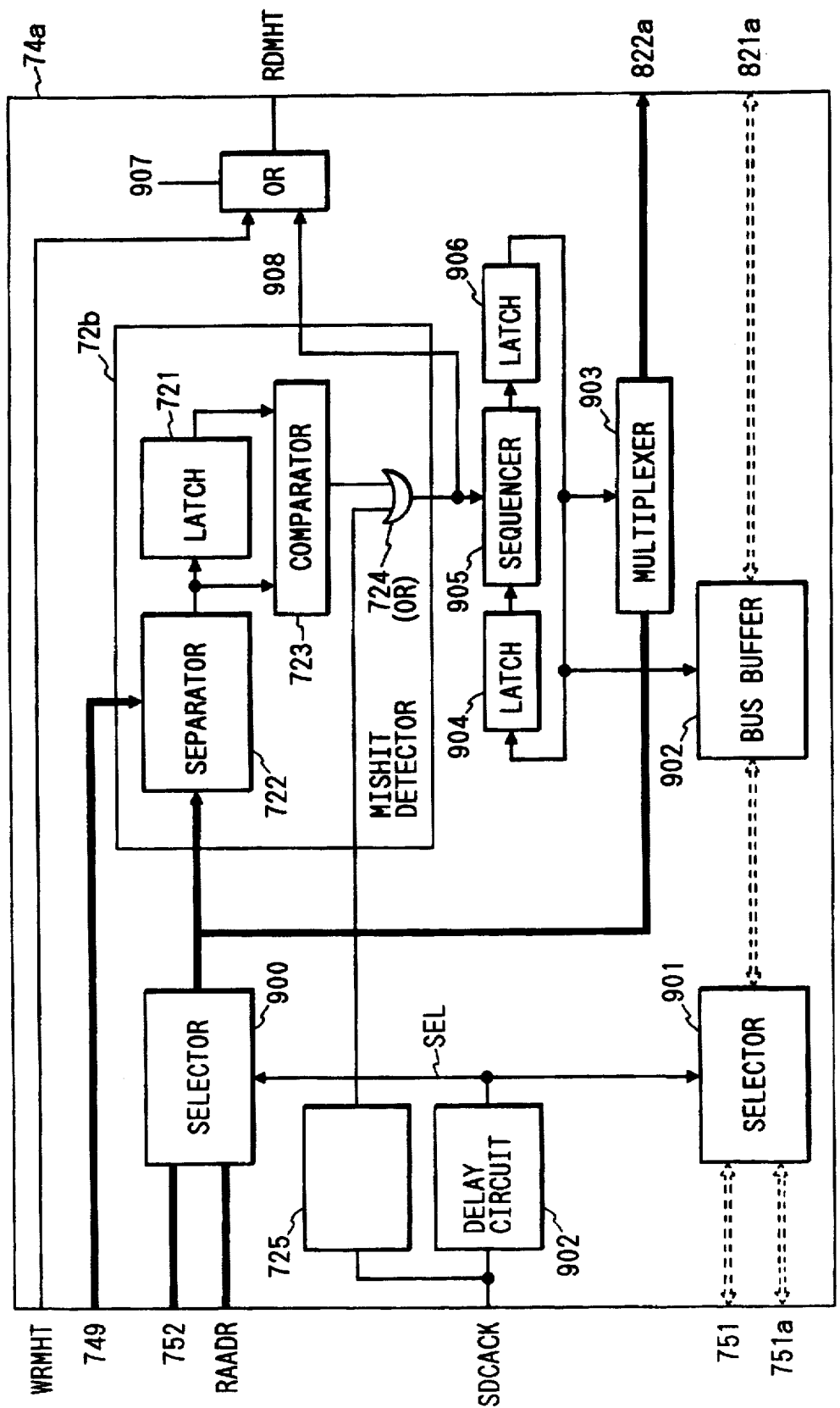
FIG. 41 shows one example of a bus control unit in the data processor of FIG. 33.

FIG. 41 is a block diagram showing one example of the bus control unit 74a. The read address RDADR from the image processor 71 and an address 752 from the CPU 75 are selected by a selector 900 and fed to the mishit detector 72b and the multiplexer 903. In the mishit detector 72b, the row address is extracted by a separator 722. Which bit of the address bus corresponds to the row address is decided by the mode designating information 749 fed from the CPU75, because it depends upon the mode at that time. The extracted row address is latched in a latch 721, and the row address (i.e., the output of the separator 722) to be accessed at this time and the row address (i.e., the output of the latch 721) accessed at the preceding time are compared by a comparator 723. The coincidence output of the result of comparison is set to the high level, although not especially limitative thereto. The output of the comparator 723 has its output coupled to one of the inputs of a two-input type OR gate 724. The other input is fed with the output of a one-shot pulse generator 725. The one-shot pulse generator 725 detects both the level change from the active to inactive levels of the interrupt signal SDCACK and the reverse change, to output a one-shot pulse having the high level for a predetermined time period. As a result, a state similar to that of the mishit detection is forcibly established in cases the interrupt demand is made and released. The OR gate 724 has its output signal 908 fed to a logic sum gate (OR) 907 and a sequencer 905. The other input of the OR gate 907 is fed with the mishit signal WRMHT from the mishit detector 72a. As a result, if the mishit is detected in either the mishit detector 72a or 72b, the mishit signal RDMHT outputted from the OR gate 907 is activated. The sequencer 905 executes the mishit processing if it is informed of the incoincidence of the result of comparison by the internal signal 908. The output of the sequencer 144 is connected through a latch 906 not only with the select terminal of the multiplexer 903 for selecting the addresses to the synchronous DRAM 82a but also with the input of a latch 904 so that it can give the present status to the sequencer 905 through that latch 904. The multiplexer 903 selects which of the address bits fed thereto is to be fed to the synchronous DRAM, in accordance with the output of the latch 906. The output of the multiplexer 903 is connected with the address bus to the synchronous DRAM 82a. The data bus 751 of the CPU 75 and the data bus 751a to the image processor 71 can be selected by the selector 905 and are connected with the data bus of the synchronous DRAM 82a through a bus buffer 902. The selectors 900 and 901 are controlled by an instruction signal SEL. This instruction signal SEL is outputted from the delay circuit 902. This delay circuit 902 outputs the instruction signal SEL (i.e., the delay signal of the interrupt signal SDCACK) which is changed at the timing reflected upon the clock signal 760 of the clock driver 76 when the interrupt signal SDCACK is changed. When the instruct signal SEL is at the low level, that is, when the CPU interruption is active, the selectors 900 and 901 select the connection with the CPU 75. The bus buffer 902 is controlled by the output of the sequencer 905. Incidentally, it should be understood that the bus control unit 74b is simplified from the bus control unit 74a of FIG. 41 by omitting the circuit construction for the mishit detection. It should also be understood that the mishit detector 72a is given a construction similar to that of the mishit detector 72b of FIG. 41 excepting that its input/output signals are different.

<Image Processing System by Read/Write Time Sharing>

Figure 34:
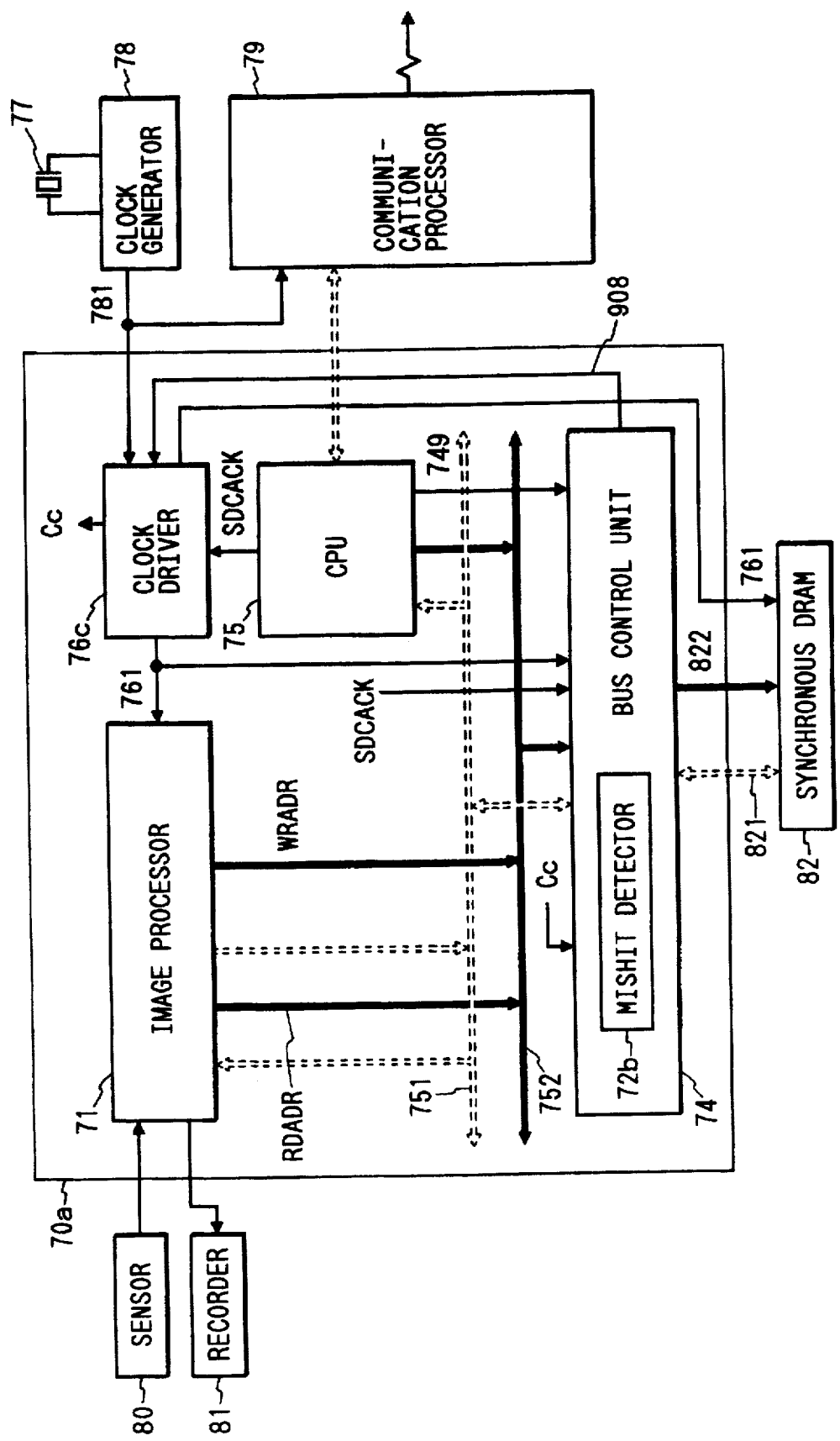
FIG. 34 is a system block diagram showing an embodiment of the case in which an image processing is executed by reading/writing one synchronous DRAM in a time sharing manner.

FIG. 34 shows an embodiment of the case in which the aforementioned image processing is carried out by reading/writing one synchronous DRAM 82 in a time sharing manner. The distortion correcting, image quality improving and coding processings are executed in the image processor 71 for reading the image data from the sensor 80. These processings are realized by inputting the read address RDADR to the bus control unit 74, by reading out the data from the synchronous DRAM 82 through the bus 751 and by writing the image-processed data in the write address WRADR through the same bus 751. Reference numerals 821 and 822 designate a data bus and an address bus for coupling the synchronous DRAM 82 and the bus control unit 74.

Figure 42:
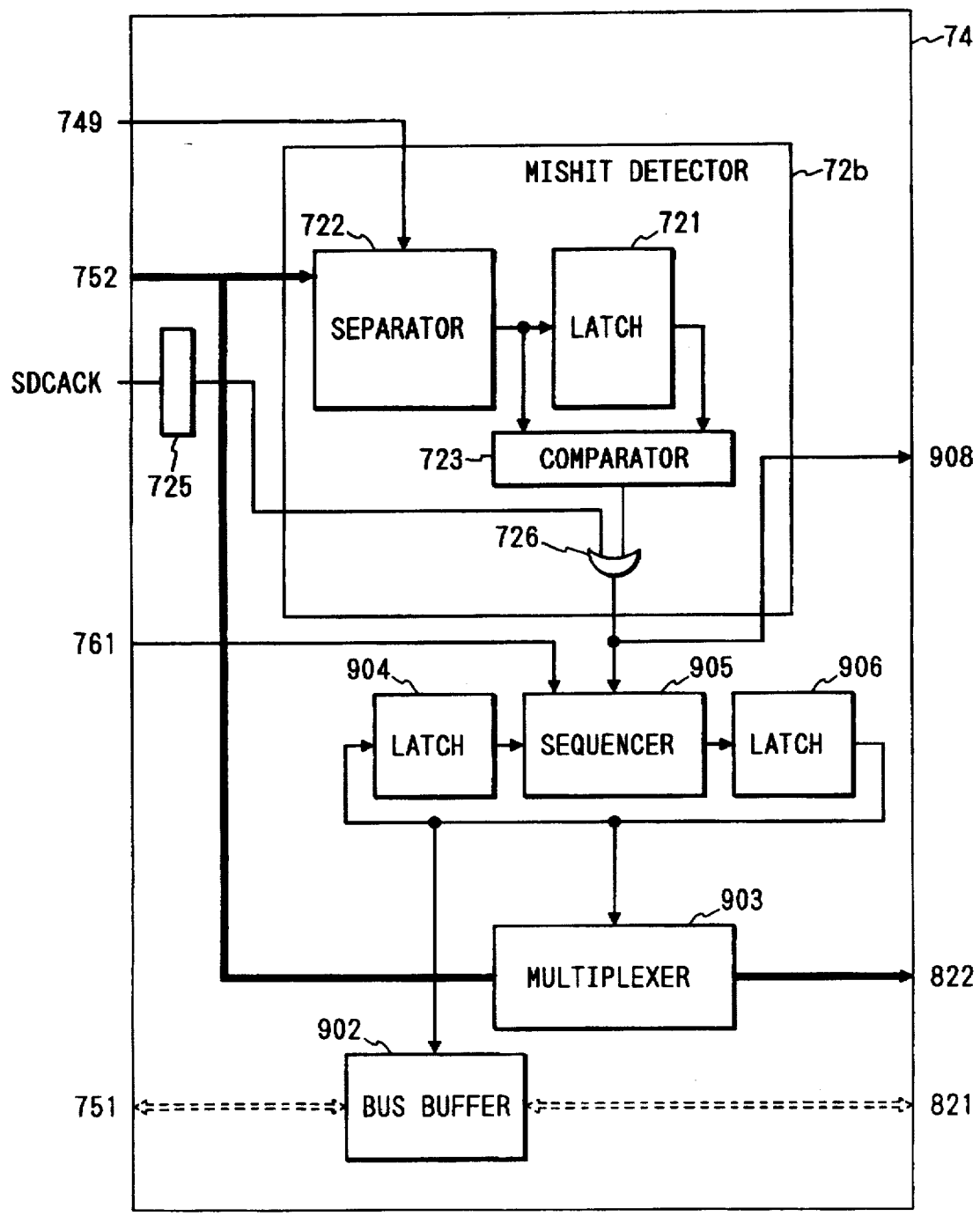
FIG. 42 shows one example of a bus control unit in the data processor of FIG. 34.

FIG. 42 is a block diagram showing one example of the bus control unit 74. This bus control unit 74 is constructionally different from that of FIG. 41 in that the CPU 75 and the image processor 71 are coupled through the buses 752 and 751 shared inbetween and in that the mishit signal 908 is produced by the mishit detector 72b contained in the bus control unit 74. The detailed description of the circuits elements having the same functions as those of FIG. 41 will be omitted by designating them at the common reference numerals. Incidentally, a clock driver 76c of this embodiment is given a construction similar to that of the clock driver 76 of FIG. 40, although not shown. As a result, when a mishit occurs as in the foregoing embodiments, the feed of the clock signal 760 to the image processor 71 is interrupted. This feed of the clock signal 760 to the image processor 71 is also forcibly interrupted in response to an interruption of the CPU 75, and a mishit is forcibly made at first and also at the interruption releasing time.

Figure 37:
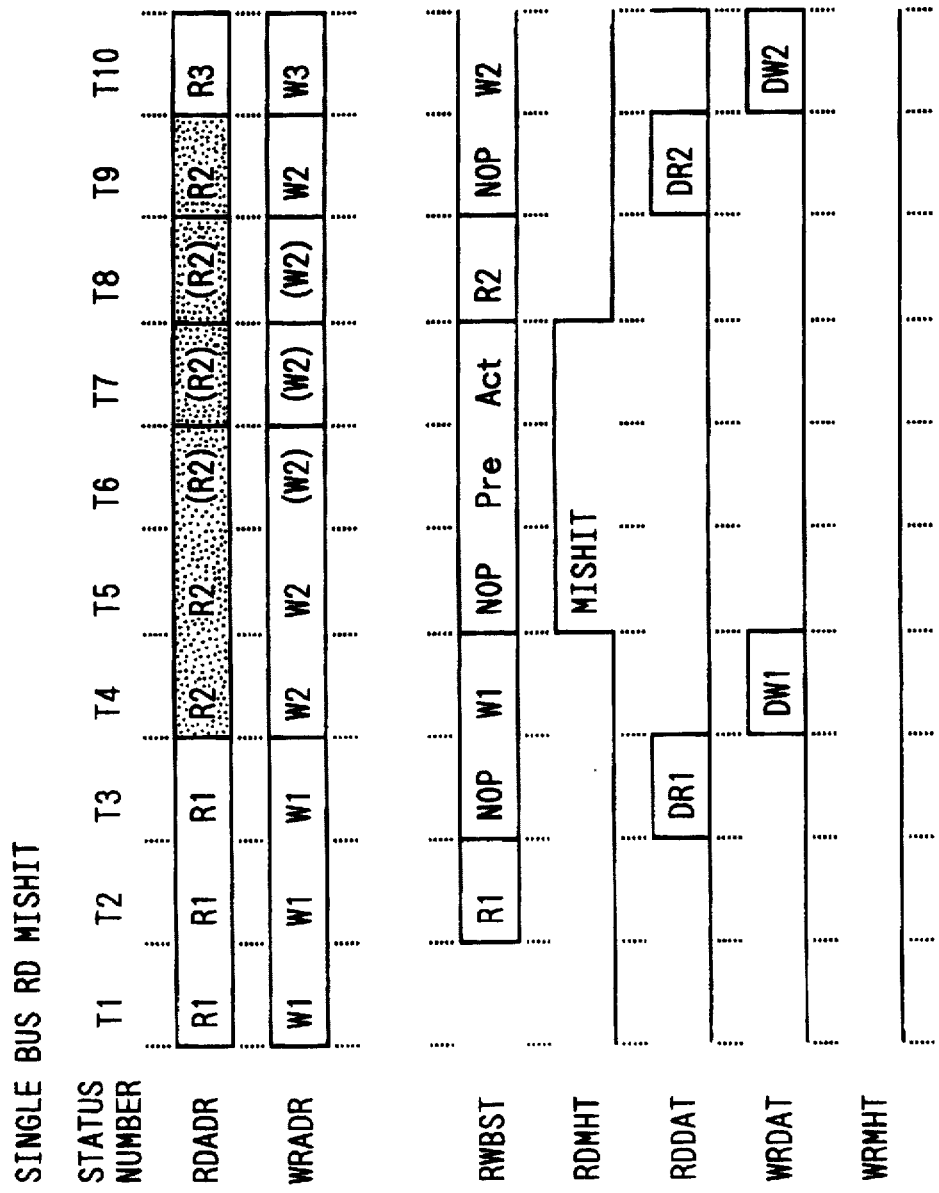
FIG. 37 is an operation timing chart illustrating one example of the case in which a mishit occurs at a reading time in the system of FIG.34.
Figure 38:
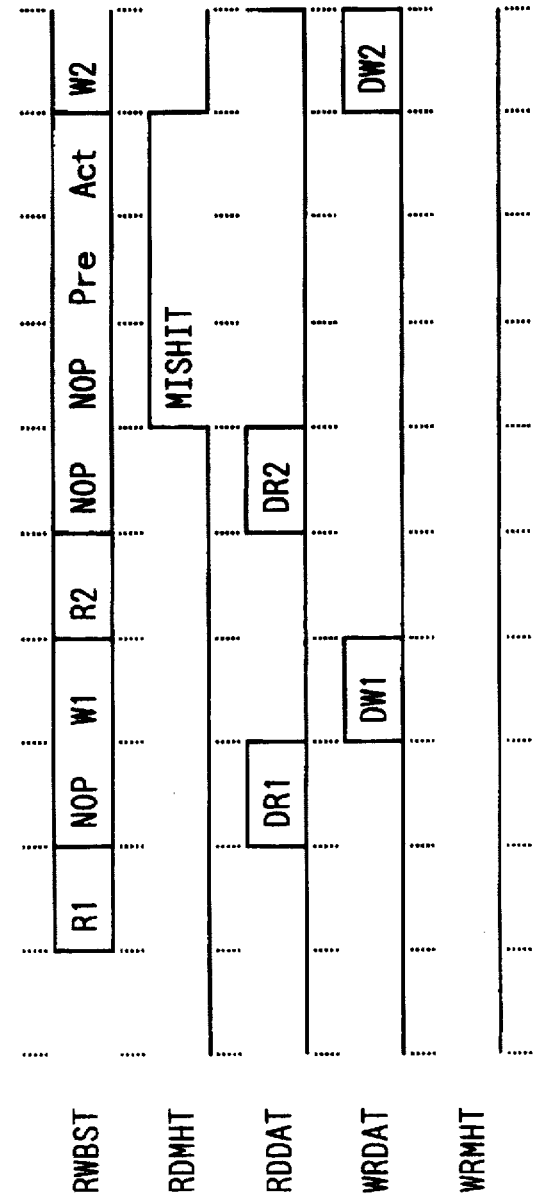
FIG. 38 is an operation timing chart illustrating one example of the case in which a mishit occurs at a writing time in the system of FIG. 34.

FIGS. 37 and 38 are timing charts in the system of FIG. 34 in which the single memory is read/written in the time sharing manner. The read address R1 issued at T1 is caused to read the data DR1 from the synchronous DRAM 82 by the bus control unit 74. The data DW1 processed by the image processor 71 is written in the write address W1. The read data require a space of one cycle for the transition from the read to the write if the CAS latency is assumed to 1 (whereas the latency of the write data is 0). This is used as the NOP of the T3 status of the bus status RWBST. FIG. 37 illustrates the timings for the mishit processing the reading time, and FIG. 38 illustrates the timings for the mishit processing at the writing time. Since the reading and writing operations are executed in the time sharing manner, the address updating and the image processing are interrupted at the time when a mishit occurs in one of the reading/writing operations. In case the reading/writing operations are executed in the time sharing manner, the image processing flow can be prevented from being disturbed.

<Applied Example of Image Processor>

Figure 43:
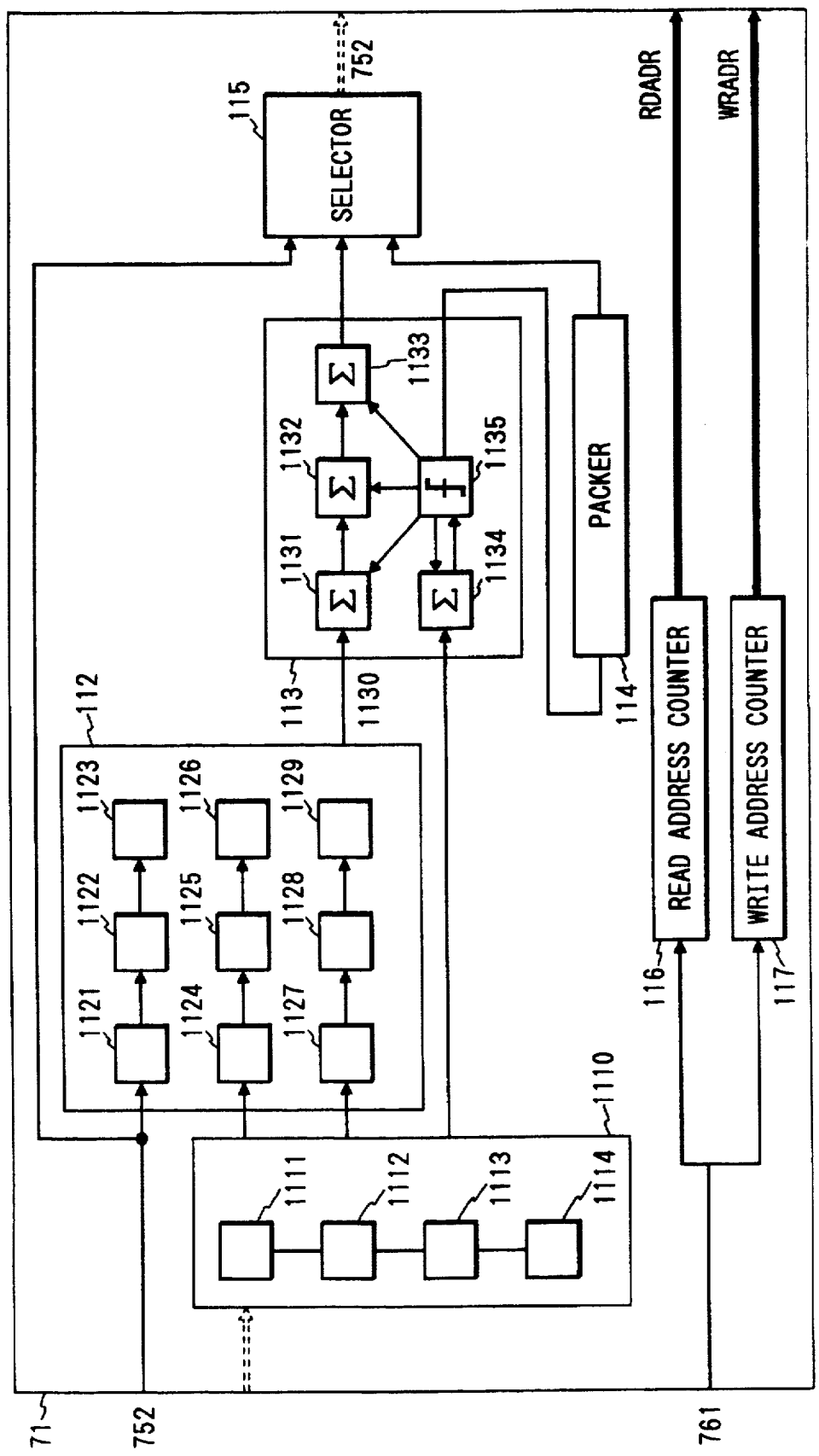
FIG. 43 is a block diagram of the case in which the image processor is adapted for a facsimile.

FIG. 43 is a block diagram of the case in which the image processor 71 is applied to a facsimile. A data control unit 1110 separates the signals, which are serially fetched from the synchronous DRAM 82, into the data for the individual lines. An edge emphasizer 112 emphasizes the density gradient between a noted point and the peripheral pixels by referring to the peripheral pixels with the data from the sensor 80 and the output from the control unit 1110. Latches 1121 to 1129 are registers for storing the values of the noted point and the peripheral pixels. The outputs of these registers are arithmetically operated to produce an edge emphasizing output 1130. An error diffusion unit 113 distributes the error data for a noted pixel 1135 into the peripheral pixels 1131 to 1134 so that the multi-value data may be made binary in a high quality. The error data for the next line are fed through a selector 115 to a memory bus 752, and the error data of the present line are fed from the data control unit 1110. The output of the error diffusion unit 113 is packed, because it is binary, by a packing unit 114 and fed through the selector 115 to the memory bus 751 until it is written in the synchronous DRAM 82. The selector 115 can select the data being inputted so that the data may be written as those for the processing of the next line.

On the other hand, the read/write addresses are produced by a read counter 116 and a write counter 117. Incidentally, these counters are so controlled by the output 761 of the clock driver 76 that they may be interrupted by a mishit or the CPU 75. When the clock signal 761 from the clock driver 76 is stopped, the operations of the internal latches or registers are interrupted so that the processings may not proceed any more.

FIG. 44(a) illustrates an example when the synchronous DRAM 82 is utilized by the time slot method. Specifically, one example of the data bus using sequence is presented because the single data bus for the synchronous DRAM 82 and the data processor 70a has to be processed in the time sharing manner. In this example, the synchronous DRAM 82 is accessed in the sequence of a preceding line read L1R, a two-line preceding line read L2R, a present line error data read LER, a mishit precharge PRE, a row address activation ACT, a present line data write LOW, a present line error data write LEW and a packed binary result data write LKW.

FIG. 44(b) illustrates one example of the address map. Letters L0 designate a present line; letters L1 a preceding line; letters L2 a two-line preceding line; letters LE an error data area; and letters LK a result data area. These are areas for the line memories in the synchronous DRAM 82 and are mapped on the same memory addresses as those of the page buffer areas of the synchronous DRAM 82.

FIG. 45 is a block diagram showing when the image processor is applied to a graphic processing. As compared with the application to the facsimile, the aforementioned edge emphasizer and error diffusion unit are replaced by a synthesized data generator 118, by which the source data and another value 1186 are synthesized to produce the output data, and the result is delayed and phase-warranted by delay elements 1183, 1184 and 1185 and is outputted to the bus 752.

Figure 46:
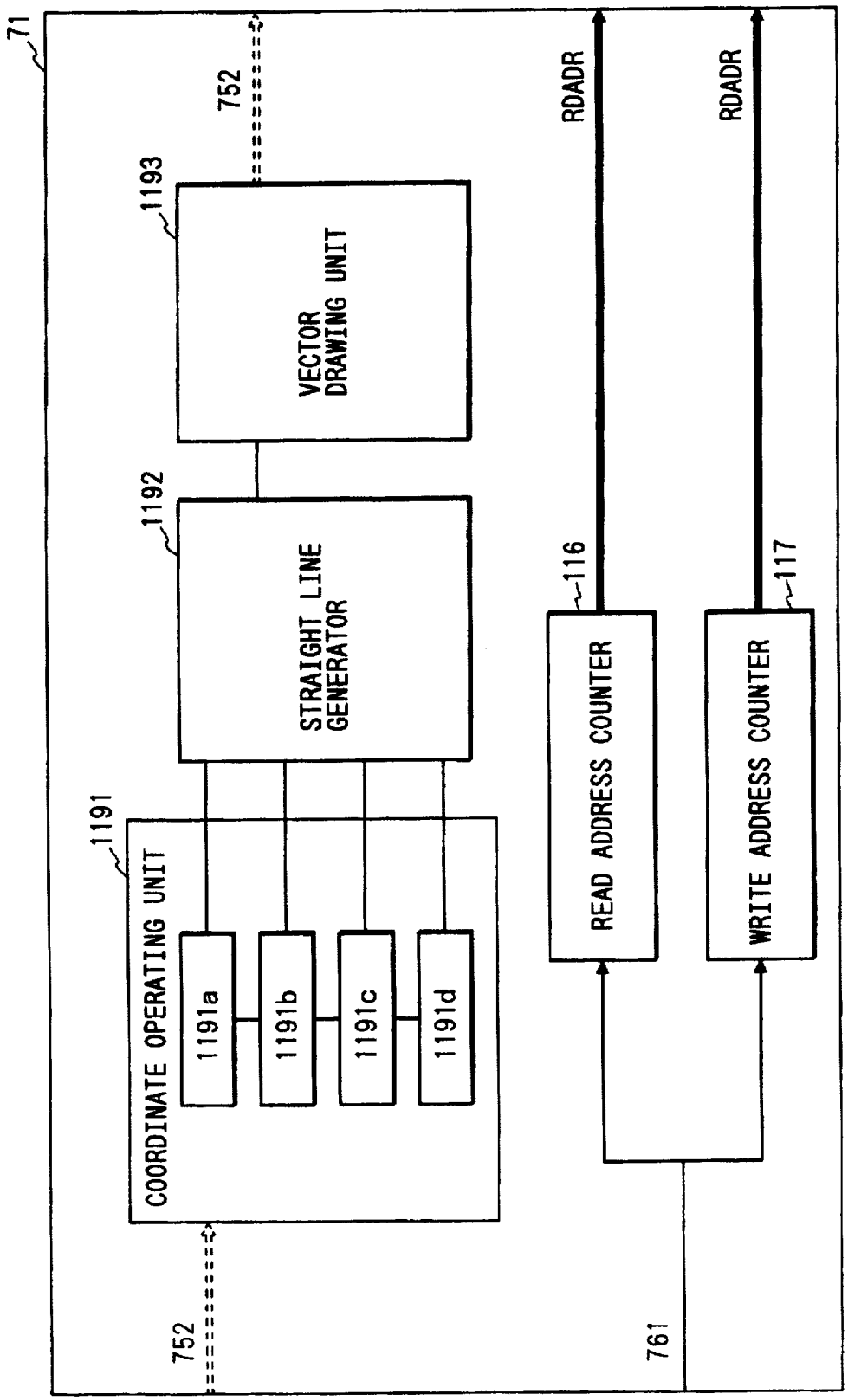
FIG. 46 is a block diagram showing one example of the case in which the image processor is applied to a printer.

FIG. 46 is a block diagram showing one example of the case in which the image processor is applied to a printer. The data read from the synchronous DRAM 82 are fed to a coordinate operating unit 1191, in which they are arithmetically operated, and the resultant data are further arithmetically operated by a straight line generator 1192 until they are subjected to a vector operation by a vector drawing unit 1193. The results of these operations are written in the synchronous DRAM 82 through the bus 752. The basic operations are similar to those of the case of the application to the facsimile.

Although our invention has been specifically described in connection with its embodiments, it should not be limited thereto but can naturally be modified in various manners without departing the gist thereof.

For example, the image data should not be limited to those to be displayed on a monitor but may be those to be printed by a page printer. Moreover, the present invention can naturally be applied not only to an image display but to various data processing systems for processing mass data by using a memory.

The effects to be obtained from a representative of the invention disclosed herein will be briefly described in the following.

Specifically, by feeding the clocks to the memory from the processing means, the skews between the clocks and the addresses, data and control signals can be minimized to cause the commands (or control signals) from the data processor to be executed without fail by the memory such as the synchronous DRAM, that is, to ensure the access of the synchronous DRAM 82 synchronous with the clock signals.

When a common access is to be accessed from a plurality of data processing modules of different operation frequencies, the skews between the clocks and the data or addresses can be minimized to cause the commands from the data processing module to be executed without fail, by providing means for selecting the clock signal having the frequency corresponding to the data processing module which is authorized to have a bus access right.

By providing means for setting not only the addresses, data and control signals to the memory but also the clock terminal to a high impedance, the clock signal optimum for a memory such as the synchronous DRAM by another data processor may be applied from that another data processor in case the memory is opened to the external bus. As a result, even in case the memory such as the synchronous DRAM is shared among a plurality of data processors, the skews of the addresses, the data and the control signals can be minimized according to the operating speeds of the individual data processors to allow the access to that memory.

A highly efficient memory access can be realized by providing processing means for issuing mode register setting commands to a memory in accordance with the data processing condition, to set a burst length optimum for the image data processing content.

The bus of the memory can be used in the pipeline to improve the throughput of the memory access by providing a bus control unit for producing a precharge command and an active command to a memory bank which is different from that being accessed while the memory is being addressed for the present data.

Whether or not a mishit has occurred can be decided by comparing the preceding row address and the present row address, and a desired address can be accessed by executing the precharge and the row address activation.

The data in the image processing pipeline can be retained without being broken, by providing means for interrupting the image processing operation for a predetermined time period by detecting the mishit in the write/read addresses.

By detecting a mishit of the write address at a timing substantially equal to that for detecting a mishit in the read address, the mishit at the writing time can be fed back to the mishit at the reading time so that the pipeline can be prevented from being disturbed by the mishit, without any complicated processing that might otherwise be required for preventing the data from overflowing at the time of a write mishit.

In case a plurality of access subjects are for a memory such as the synchronous DRAM, a mishit is uniquely caused as the access subjects are to be changed. Then, even if the data processing module including the means for detecting a write mishit is started after another data processing module has accessed the synchronous DRAM (in this meanwhile the operation of the means for detecting a write mishit is indefinite) in place of the operations of the data processing module including the write mishit detecting means, it is possible to reliably prevent the failure of the processing of the mishit which might otherwise occur if the operations of the write mishit detecting means should be relied upon. In other words, by causing a mishit forcibly when the access subjects for the memory are changed, the indefiniteness of the mishit decision at the time of reopening the operations of the data processing module, which have been interrupted according to the change in the memory access subjects, to improve the reliability of the processing at the time of a mishit.

Thanks to the above-specified effects, the mishit processing to be invited at the time of applying the synchronous DRAM to the image processing system can be realized at a low cost so that the memories can be integrated to provide a high-performance system at a reasonable cost.

What is claimed is:

1. A data processor formed on a semiconductor chip used with a first memory, the first memory receiving a first clock signal, inputting address data and a control signal and outputting data in synchronism with the first clock signal, the data processor comprising:

a first data processing module receiving a second clock signal, operating in synchronism with the second clock signal, outputting first address data and a first control signal, and inputting data;

a second data processing module receiving a third clock signal, operating in synchronism with the third clock signal, outputting second address data and a second control signal, and inputting data;

bus control means coupled to the first data processing module and to the second data processing module and having:

means for outputting the control signal in accordance with one of the first control signal and the second control signal and address data in accordance with one of the first address data and the second address data to the first memory in synchronism with a fourth clock signal;

means for inputting the data from the first memory in synchronism with the fourth clock signal; and, means for providing data in accordance with the inputted data to one of the first data processing module and the second data processing module; and, clock feed means including:

first clock providing means for providing the second clock signal to the first data processing module;

second clock providing means for providing the third clock signal to the second data processing module; and, third clock providing means for providing the fourth clock signal and the first clock signal to the bus control means and the first memory, the fourth clock signal and the first clock signal being related to one of the second clock signal and the third clock signal.

2. A data processor according to claim 1, wherein the first clock providing means includes a clock driver providing the second clock signal and the second clock providing means includes a clock driver providing the third clock signal; and wherein said clock feed means includes a clock selector for selecting said first clock driver and the second clock driver and for providing an output of the selected clock driver as the first clock signal and the fourth clock signal.

3. A data processor according to claim 1, wherein the clock feed means further comprises a clock buffer which provides the first clock signal and which selectively indicates a high output impedance stage in response to the control signal.

4. A data processor according to claim 1, wherein the first memory has a plurality of operation modes; and, wherein said bus control means includes means for outputting a command to determine an operation mode of said first memory to the first memory in response to an access to said first memory from said first data processing module and said second data processing module.

5. A data processor according to claim 1, further comprising:

a second memory provided outside the data processor coupled to said bus control means, for receiving an address data from the data processor, inputting/outputting data, and receiving the control signal in synchronism with said first clock signal; and, clock generating means located outside said data processor for providing a clock signal to the clock feed means.

6. A data processor according to claim 1, wherein said bus control means includes means for deciding an access speed in accordance with an address indicated by the address data provided to the bus control means and means for changing an access speed for a peripheral circuit to be accessed.

7. A data processor according to claim 6, wherein the peripheral circuit includes a second memory having an access cycle longer than that to said first memory.

8. A data processor formed on a chip, for use with a peripheral circuit, the peripheral circuit receiving a first clock signal and operating in synchronism with the first clock signal, the data processor comprising:

a data processing module which operates in synchronism with a second clock signal and which outputs address data and data;

a bus control unit, which receives the address data and the data, for providing address data and data in accordance with the received address data and the received data to the peripheral circuit in synchronism with a third clock signal; and, a clock providing circuit which provides the second clock signal to the data processing module and which provides the first clock signal and the third clock signal to the peripheral circuit and the bus control circuit, the first clock signal and the third clock signal being related to the second clock signal.

9. A data processor according to claim 8, wherein the peripheral circuit includes a memory which receives the address data and the data from the data processor in synchronism with the first clock signal and which operates in synchronism with the first clock signal.

10. A data processor comprising:

bus control means interfaced with a memory for inputting addresses, inputting/outputting data and inputting control signals, in synchronism with a clock signal supplied externally from the data processor, to/from the memory;

a plurality of data processing modules coupled to said bus control means for individually producing data and addresses to access said memory, the data and addresses to access the memory being input to the bus control means; and clock feed means for feeding said data processing modules with individual clock signals and for feeding the bus control means and the memory with clock signals which are distinct from the individual clock signals for accessing said memory in synchronism with the operations of said data processing modules;

wherein said clock feed means includes:

a plurality of clock drivers for producing individual operation speeds of the plurality of data processing modules, the bus control means and the memory; and, a clock selector for selecting an output of each of the clock drivers, the output corresponding to a time data may be accessed from the data processing modules.

* * * * *